US009398696B2

(12) United States Patent
Miyake et al.

(10) Patent No.: US 9,398,696 B2
(45) Date of Patent: Jul. 19, 2016

(54) SCREEN PRINTING MACHINE

(75) Inventors: Yasushi Miyake, Shizuoka (JP); Takeshi Fujimoto, Shizuoka (JP)

(73) Assignee: YAMAHA HATSUDOKI KABUSHIKI KAISHA, Shizuoka-ken (JP)

(*) Notice: Subject to any disclaimer, the term of this patent is extended or adjusted under 35 U.S.C. 154(b) by 346 days.

(21) Appl. No.: 14/123,176

(22) PCT Filed: Mar. 14, 2012

(86) PCT No.: PCT/JP2012/001772
§ 371 (c)(1),
(2), (4) Date: Nov. 29, 2013

(87) PCT Pub. No.: WO2012/164796
PCT Pub. Date: Dec. 6, 2012

(65) Prior Publication Data
US 2014/0083359 A1    Mar. 27, 2014

(30) Foreign Application Priority Data

May 31, 2011  (JP) .................................. 2011-122927

(51) Int. Cl.
*B41F 15/08*    (2006.01)
*B41F 15/26*    (2006.01)
(Continued)

(52) U.S. Cl.
CPC .............. *H05K 3/0085* (2013.01); *B41F 15/08* (2013.01); *B41F 15/0881* (2013.01);
(Continued)

(58) Field of Classification Search
CPC .. B41F 15/08; B41F 15/0813; B41F 15/0818; B41F 15/14; B41F 15/16; B41F 15/18; B41F 15/26; B41F 15/36; B41P 2215/112; B41P 2215/114; B41M 1/12; H05K 3/1216
USPC ........................................................ 101/126
See application file for complete search history.

(56) References Cited

U.S. PATENT DOCUMENTS

2002/0020346 A1   2/2002  Doyle et al.
2010/0126363 A1   5/2010  Mizuno et al.
(Continued)

FOREIGN PATENT DOCUMENTS

CN      1843758 A    10/2006
CN    101318399 A    12/2008
(Continued)

OTHER PUBLICATIONS

The extended European search report issued by the European Patent Office on Jul. 21, 2015, which corresponds to European Patent Application No. 12792246.6-1704 and is related to U.S. Appl. No. 14/123,176.

(Continued)

*Primary Examiner* — Leslie J Evanisko
(74) *Attorney, Agent, or Firm* — Studebaker & Brackett PC

(57) ABSTRACT

Disclosed is an inexpensive small-sized screen printing machine having low redundancy and high production efficiency and applicable to a dual conveying-type component mounting machine. The screen printing machine comprises a pair of substrate supporting tables provided to hold a respective substrate that is a print object and which is juxtaposed in a direction that is perpendicular to a conveying direction of the substrate, and a print executing section that performs a printing process alternately on the substrate held by the pair of substrate supporting tables. Due to the print executing section being driven in the direction under control of a control unit, a print position where the substrate supporting tables execute alternate printing is changed within a range in which one of the pair of substrate supporting tables and the other of the pair of substrate supporting tables oppose each other in the direction.

20 Claims, 31 Drawing Sheets

(51) Int. Cl.
  *H05K 3/00* (2006.01)
  *B41F 33/00* (2006.01)
  *H05K 3/12* (2006.01)
  *H05K 3/34* (2006.01)

(52) U.S. Cl.
  CPC ............ *B41F 15/26* (2013.01); *B41F 33/0036* (2013.01); *B41F 33/0081* (2013.01); *B41P 2215/112* (2013.01); *B41P 2215/114* (2013.01); *H05K 3/1216* (2013.01); *H05K 3/3484* (2013.01)

(56) References Cited

U.S. PATENT DOCUMENTS

2010/0242755 A1    9/2010  Nagao
2011/0297019 A1   12/2011  Tanaka
2012/0085253 A1    4/2012  Nagao
2012/0085254 A1    4/2012  Nagao

FOREIGN PATENT DOCUMENTS

| | | |
|---|---|---|
| CN | 101734004 A | 6/2010 |
| JP | 2002-225221 A | 8/2002 |
| JP | 2008-272964 A | 11/2008 |
| JP | 2009-070867 A | 4/2009 |
| JP | 2011-131488 A | 7/2011 |
| JP | 2011-143640 A | 7/2011 |
| WO | 98/37741 A1 | 8/1998 |
| WO | 2009/035136 A1 | 3/2009 |
| WO | 2011/007502 A1 | 1/2011 |

OTHER PUBLICATIONS

International Search Report; PCT/JP2012/001772; Apr. 24, 2012.

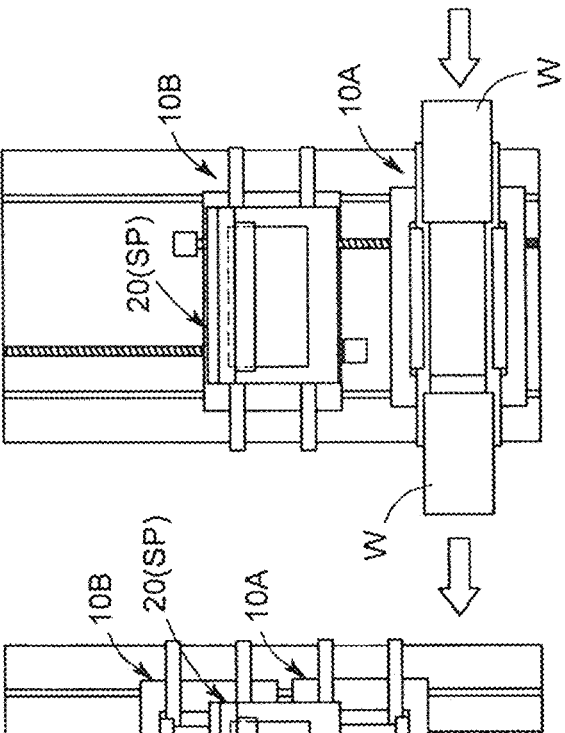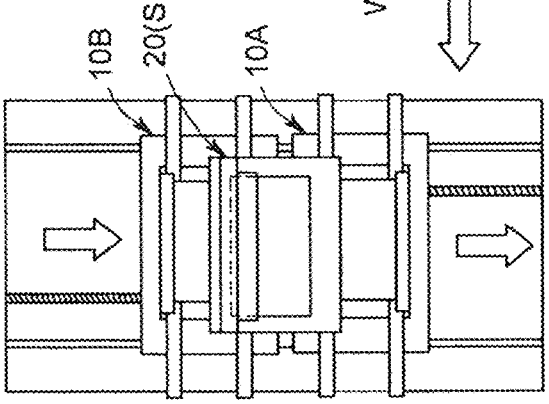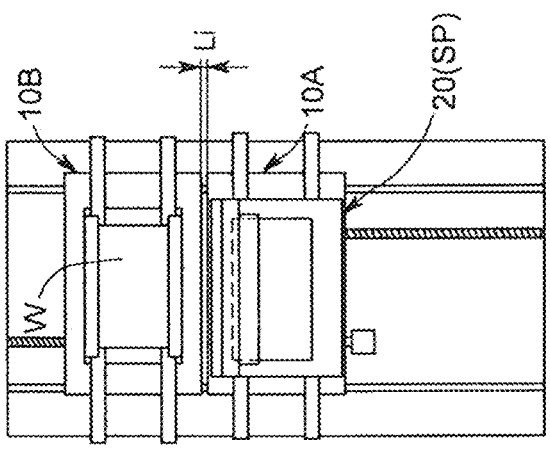

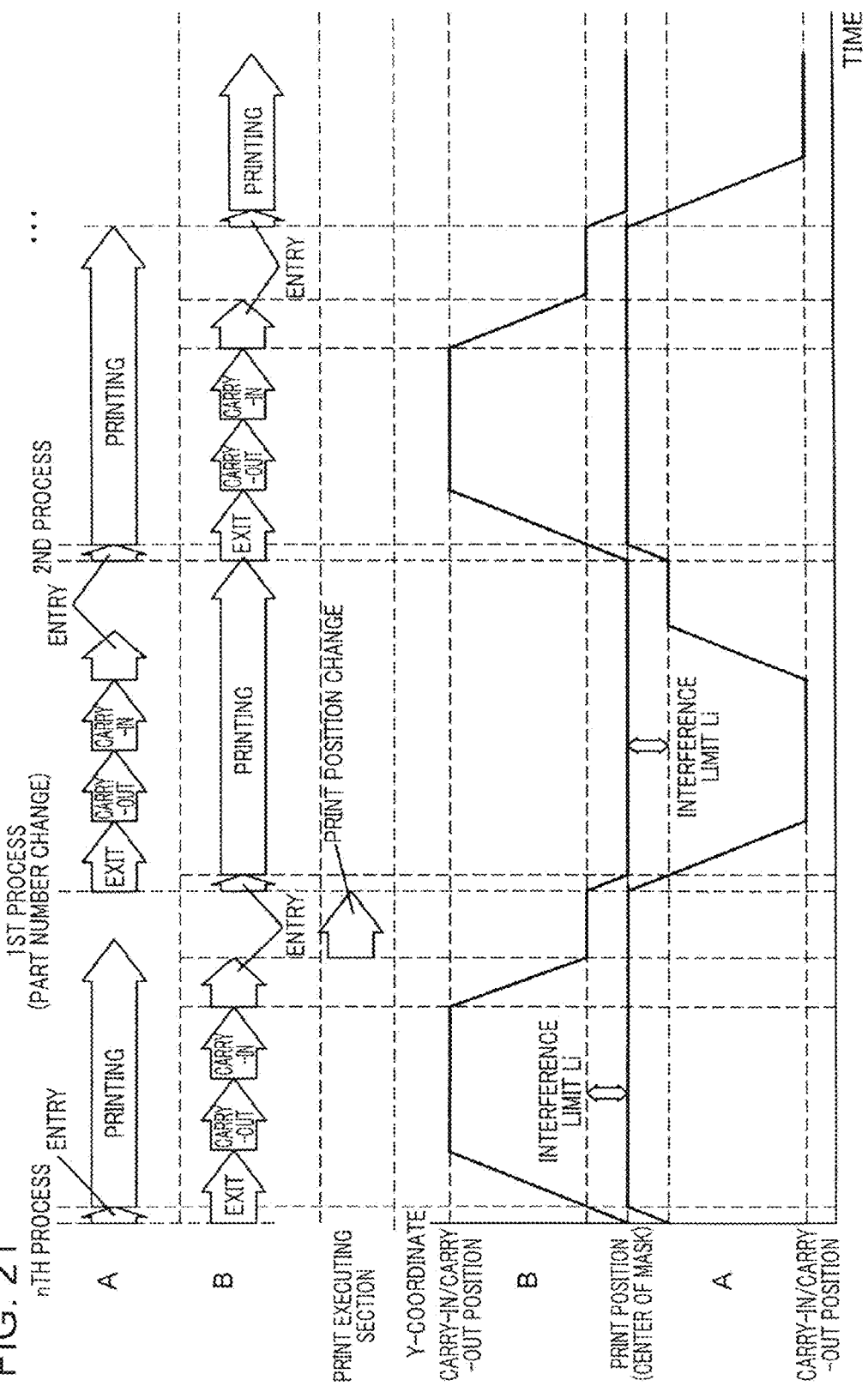

SCREEN PRINTING MACHINE

TECHNICAL FIELD

The technical field relates to a screen printing machine and, in particular, to a screen printing machine that performs screen printing of a cream solder, a conductive paste, or the like on a substrate such as a printed wiring board (PWB) as pretreatment for mounting electronic components on the substrate.

BACKGROUND

A screen printing machine is incorporated in a production line of a printed circuit board (PCB) and is designed to perform screen printing of a conductive paste or the like on a substrate conveyed from upstream and to send the substrate to a downstream component mounting machine. In order to improve production efficiency, a screen printing machine has been developed as disclosed in Japanese Patent Application Laid-open No. 2009-70867 (Patent Document 1), for example, in which a pair of substrate supporting tables juxtaposed in a horizontal direction that intersects with a substrate conveying direction is provided in the machine and each substrate supporting table is provided with an print executing section. Such a screen printing machine has been developed so as to accommodate a so-called dual conveying-type component mounting machine which has two substrate conveying lines and which concurrently carries out (in parallel) component mounting on both conveying lines, and is intended to improve efficiency of a printing process in accordance with an increased speed of a component mounting process by coupling the screen printing machine and the component mounting machine with each other.

However, with the configuration according to Patent Document 1, a construction of each print executing section is unnecessarily redundant and wasteful. In other words, in cases where substrates of the same type are consecutively produced, the need to create two screen masks arranged with a same opening pattern results in an increased cost of screen masks. In addition, the need to prepare solder on each screen mask results in an excessive amount of solder necessary for preparation as well as a corresponding high cost of post-production solder treatment (disposal, storage, and the like). Furthermore, due to the redundant construction that combines the same print executing sections arranged to the left and right, enough space for arranging the respective print executing sections must be preserved. As a result, sizes of the machine itself as well as conveyors of an accompanying substrate sorting machine and the like tend to increase.

SUMMARY

The present disclosure provides an inexpensive small-sized screen printing machine which has low redundancy and high production efficiency and which is applicable to a dual conveying-type component mounting machine.

The present disclosure provides a screen printing machine comprising a pair of substrate supporting tables, each of which is provided for holding a respective substrate that is a print object, the substrate supporting tables being juxtaposed along a specific direction that is perpendicular to a conveying direction of the substrate, a print executing section which performs a printing process alternately on the substrate held by the pair of substrate supporting tables, a print executing section driving mechanism that drives the print executing section along the specific direction, and print position setting means for setting a print position that is a position of the print executing section within a range where one of the pair of substrate supporting tables and the other of the pair of substrate supporting tables oppose each other in the specific direction, by controlling a drive of the print executing section driving mechanism.

According to this mode, since one print executing section is shared by a pair of substrate supporting tables so that the screen printing can be alternately performed, redundancy of the print executing section can be avoided. Therefore, in cases where substrates of the same type are consecutively manufactured by both the substrate supporting tables, a single screen mask can be shared and a cost for screen masks can be cut in half. In addition, since a single screen mask can be shared, solder necessary for preparation is kept to a necessary and sufficient amount. Therefore, cost reduction can also be achieved in post-production treatment (disposal, storage, and the like) of solder. Furthermore, since a print position of a print executing section can be changed in a specific direction and the substrate supporting tables share the same print executing section, redundancy of the print executing section can be eliminated, a space for arranging the print executing section can be kept compact, and the machine itself as well as accompanying conveyors can be downsized. Moreover, when setting a print position, the print executing section can be moved in a specific direction and the print position can be changed to an arbitrary location between the one substrate supporting table and the other substrate supporting table. Therefore, a suitable print position can be dynamically set according to an operational status of each substrate supporting table and modes of a substrate carry-in section and a substrate carry-out section configured on each substrate supporting table.

Other features of the present disclosure will be readily appreciated from the following detailed description when considered in connection with the accompanying drawings.

BRIEF DESCRIPTION OF THE DRAWINGS

FIGS. 20A to 20C are schematic plan views showing an operation in a case where the first embodiment is executed with the screen printing machine in a mode shown in FIG. 12.

FIG. 21 is a timing chart showing an operation in a case where the first embodiment is executed with the screen printing machine in a mode shown in FIG. 12.

DETAILED DESCRIPTION

Hereinafter, exemplary embodiments of the present disclosure will be described with reference to the accompanying drawings.

Figure 1:
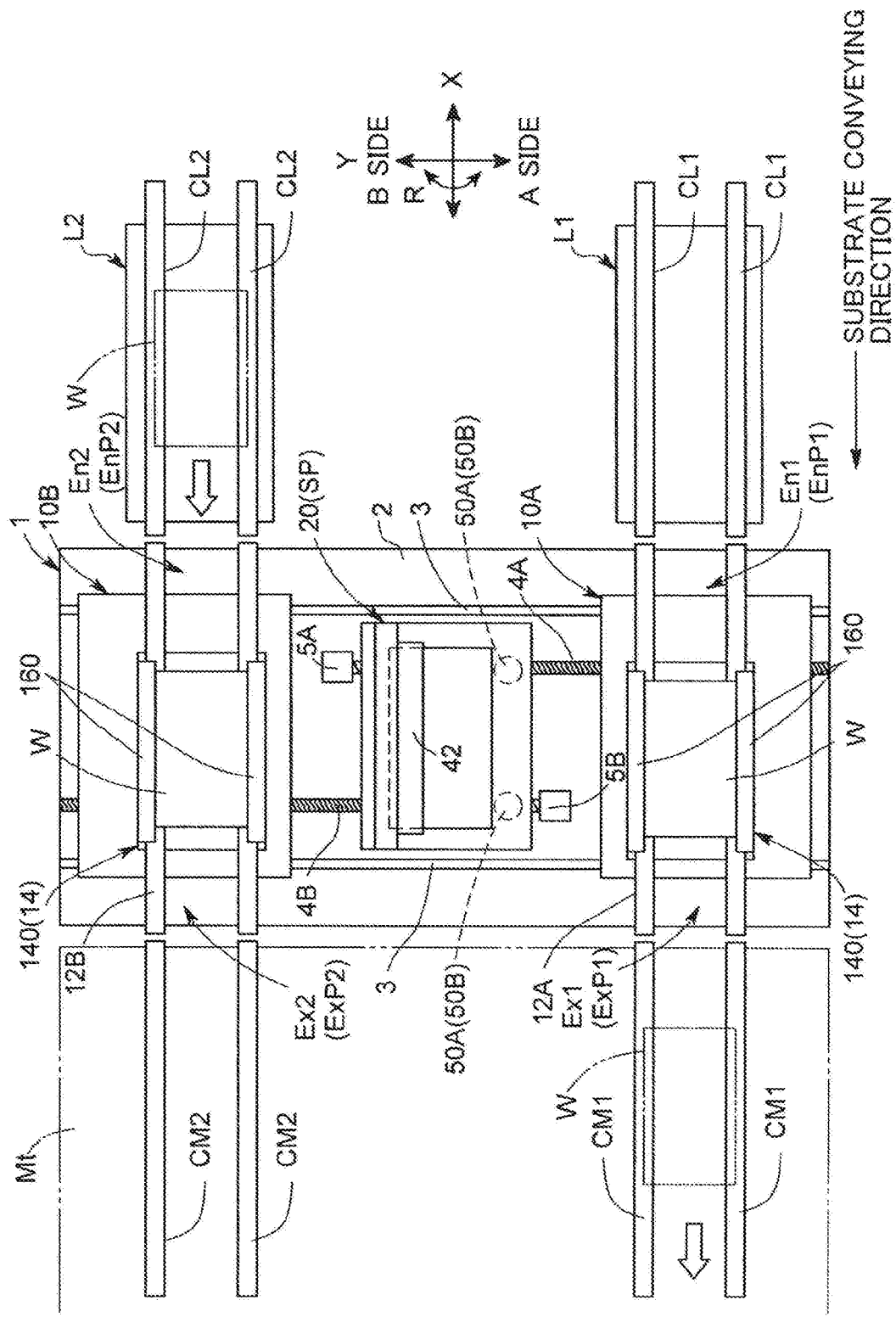
FIG. 1 is a schematic plan view of a screen printing machine according to an exemplary embodiment.
Figure 2:
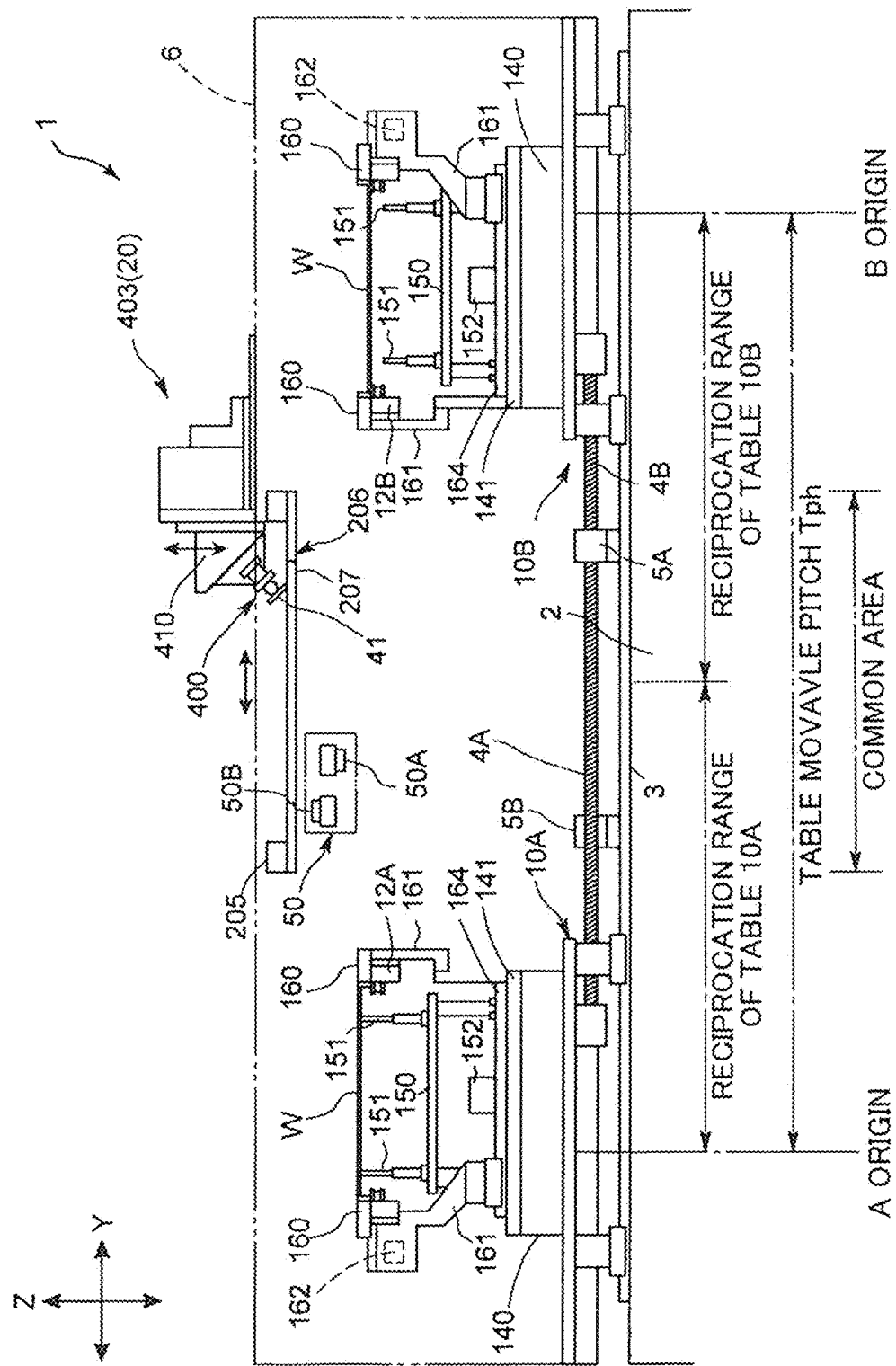
FIG. 2 is a schematic side view of the screen printing machine shown in FIG. 1.

Referring now to FIGS. 1 and 2, a screen printing machine 1 according to the present embodiment is incorporated into a printed circuit board (PCB) production line in a state where a dual conveying-type component mounting machine Mt is coupled to a downstream side of the screen printing machine 1. In the example shown, the screen printing machine 1 is provided between two loaders L1 and L2 (also referred to as a first loader L1 and a second loader L2) arranged in parallel and one component mounting machine Mt and is configured so as to perform screen printing on a substrate W fed from the respective upstream loaders L1 and L2 and send the substrate W to the downstream component mounting machine Mt.

Moreover, the screen printing machine 1 will be described below by assuming that a conveying direction of the substrate W in a production line represents an X-axis direction, a direction perpendicular to the X-axis direction on a horizontal plane represents a Y-axis direction, and a direction (vertical direction) perpendicular to both X-axis and Y-axis directions represents a Z-axis direction. In the present embodiment, the Y-axis direction is an example of a "specific direction" according to the present disclosure.

The screen printing machine 1 has two substrate carry-in sections En1 and En2 (also referred to as a first substrate carry-in section En1 and a second substrate carry-in section En2) at an upstream end in the X-axis direction and two substrate carry-out sections Ex1 and Ex2 (also referred to as a first substrate carry-out section Ex1 and a second substrate carry-out section Ex2) at a downstream end in the X-axis direction (a downstream end in a substrate conveying direction), the substrate carry-out sections Ex1 and Ex2 corresponding to the substrate carry-in sections En1 and En2, and is configured so as to carry a substrate W fed from the first loader L1 into the machine from the first substrate carry-in section En1, perform screen printing, and carry out the substrate W after the printing process to a first belt conveyor pair CM1 of the component mounting machine Mt from the first substrate carry-out section Ex1; and to carry a substrate W fed from the second loader L2 into the machine from the second substrate carry-in section En2, perform screen printing, and carry out the substrate W after the printing process to a second belt conveyor pair CM2 of the component mounting machine Mt from the second substrate carry-out section Ex2.

The first and second loaders L1 and L2 are respectively provided with first and second belt conveyor pairs CL1 and CL2. Meanwhile, the component mounting machine Mt is provided with two belt conveyor pairs CM1 and CM2 (also referred to as the first belt conveyor pair CM1 and the second belt conveyor pair CM2) which configure a substrate conveying line in correspondence with the first and second belt conveyor pairs CL1 and CL2. The substrate W is conveyed along these belt conveyor pairs CL1, CL2, CM1, and CM2.

On a base 2 of the screen printing machine 1, the screen printing machine 1 comprises two substrate supporting tables 10A and 10B for supporting a substrate W and one print executing section 20 which individually performs screen printing on the substrate W supported by the substrate supporting tables 10A and 10B.

The substrate supporting tables 10A and 10B (also referred to as a first substrate supporting table 10A and a second substrate supporting table 10B) are designed to receive and support a substrate W carried in from the substrate carry-in sections En1 and En2 so that screen printing can be performed on the substrate W, and to send the substrate W after a printing process from corresponding substrate carry-out sections Ex1 and Ex2. Among the substrate supporting tables 10A and 10B, the first substrate supporting table 10A receives a substrate W carried in from the first substrate carry-in section En1, supports the substrate W so that screen printing can be performed by the print executing section 20, and subsequently moves to a print position SP (to be described later) when necessary. On the other hand, the second substrate supporting table 10B is configured so as to receive a substrate W carried in from the second substrate carry-in section En2, support the substrate W so that screen printing can be performed by the print executing section 20, and subsequently move to the print position SP (to be described later) when necessary.

Each of the substrate supporting tables 10A and 10B has an approximately elongated rectangular shape in the X-axis direction in a plan view, and is configured so as to be individually moved in the Y-axis direction by a substrate supporting table driving mechanism that is embodied by threaded shafts 4A and 4B, motors 5A and 5B, and the like. In other words, each of the substrate supporting tables 10A and 10B is movably supported on a common fixed rail 3 which is provided on the base 2 and which extends in the Y-axis direction, and is configured so as to be respectively driven by the motors 5A or 5B via threaded shafts 4A or 4B.

Based on motor control by a control unit 60 (see FIG. 10, to be described later), the first substrate supporting table 10A moves to one end side (lower side in FIG. 1) and to a center side of the base 2. On the one end side, an upstream side of a belt conveyor pair 12A of the first substrate supporting table 10A faces (establishes alignment with) a receiving position (substrate carry-in position EnP1 (also referred to as a first substrate carry-in position EnP1)) on the base 2 where a substrate W fed from the first loader L1 is receivable by the first substrate carry-in section En1 and, at the same time, a downstream side of the belt conveyor pair 12A of the first substrate supporting table 10A faces (establishes alignment with) a sending position (substrate carry-out position ExP1 (also referred to as a first substrate carry-out position ExP1)) on the base 2 where the substrate W is sendable from the first substrate carry-out section Ex1 to the belt conveyor pair CM1 of the downstream component mounting machine Mt. In addition, on a center side, the first substrate supporting table 10A can move to the print position SP where screen printing is performed in a printing process.

Furthermore, the second substrate supporting table 10B moves to another end side (upper side in FIG. 1) and to the center side of the base 2. On the other end side, an upstream side of a belt conveyor pair 12B of the second substrate supporting table 10B faces (establishes alignment with) a receiving position (substrate carry-in position EnP2 (also referred to as a second substrate carry-in position EnP2)) on the base 2 where a substrate W fed from the second loader L2 is receivable by the second substrate carry-in section En2. At the same time, a downstream side of the belt conveyor pair 12B of the second substrate supporting table 10B faces (establishes alignment with) a sending position (substrate carry-out position ExP2 (also referred to as a second substrate carry-out position ExP2)) on the base 2 where the substrate W is sendable from the second substrate carry-out section Ex2 to the belt conveyor pair CM2 of the downstream component mounting machine Mt. In addition, on a center side, the second substrate supporting table 10B can move to the print position SP where screen printing is performed in a printing process.

Furthermore, the first substrate supporting table 10A and the second substrate supporting table 10B alternately move into a printing process in an order set in advance. A rotary encoder is attached to the threaded shafts 4A and 4B. The control unit 60 (to be described later) is configured so as to be capable of obtaining positional information and velocity information of the corresponding substrate supporting tables 10A and 10B based on a detected value of the rotary encoders. In the present embodiment, this will be referred to as a table movable pitch Tph (refer to FIG. 2 and FIGS. 12 to 15). The table movable pitch Tph refers to a range in which any substrate supporting table 10A (10B) is movable in the Y-axis direction. Specifically, suppose one end side is assumed to be an A side, and another end side is assumed to be a B side in the Y-axis direction. The table movable pitch Tph is a Y-axis direction distance between a center coordinate (A origin) of the first substrate supporting table 10A staying furthest toward the A side and a center coordinate (B origin) of the second substrate supporting table 10B staying furthest toward the B side. As will be described in detail later, distances in the Y-axis direction of the first and second substrate carry-in positions EnP1 and EnP2 and distances in the Y-axis direction of the first and second substrate carry-out positions ExP1 and ExP2 may be in various modes. Therefore, the A origin is set at a position where the belt conveyor pair 12A of the first substrate supporting table 10A is able to align with either one of the first substrate carry-in position EnP1 and the first substrate carry-out position ExP1 that is furthest toward the A side. The B origin is also set at a position where the belt conveyor pair 12B of the second substrate supporting table 10B is able to align with either one of the second substrate carry-in position EnP2 and the second substrate carry-out position ExP2 that is furthest toward the B side.

The respective substrate supporting tables 10A and 10B are provided with a belt conveyor pair 12A and 12B which extend in the X-axis direction, a clamp unit 14 which holds a substrate W on the belt conveyor pair 12A and 12B so as to be printable, a clamp unit drive mechanism for moving the clamp unit 14 in the X-axis direction along the belt conveyor pair 12A and 12B, and the like.

The belt conveyor pair 12A and 12B is made up of a belt conveyor. On the substrate supporting table 10A, an upstream end of the belt conveyor in the X-axis direction constitutes the substrate carry-in section En1, and a downstream end of the belt conveyor in the X-axis direction constitutes the substrate carry-out section Ex1. On the substrate supporting table 10B, an upstream end of the belt conveyor in the X-axis direction constitutes the substrate carry-in section En2, and a downstream end of the belt conveyor in the X-axis direction constitutes the substrate carry-out section Ex2. The belt conveyor is configured to receive a substrate W fed from the first loader L1 and the second loader L2 at the substrate carry-in sections En1 and En2 and convey the substrate W from the substrate carry-in sections En1 and En2 to a predetermined position set on the substrate supporting tables 10A and 10B (the foregoing will be referred to as a carry-in of a substrate) and, at the same time, to convey the substrate W after the printing process to the substrate carry-out sections Ex1 and Ex2 and further convey the substrate W from the substrate carry-out sections Ex1 and Ex2 to the first and second belt conveyor pairs CL1 and CL2 of the component mounting machine Mt (the foregoing will be referred to as a carry-out of a substrate).

Referring now to FIG. 2, each base member 140 of the substrate supporting tables 10A and 10B is supported on the fixed rail 3 so as to be movable in the Y-axis direction, and an X table 141 is provided on each base member 140 so as to be movable in the X-axis direction with respect to the base member 140. Arm members 161 which respectively support the belt conveyor 12A (12B) are provided at both ends of the X table 141 with respect to the Y-axis direction.

The clamp unit 14 is provided on the X table 141 midway between both arm members 161 and is provided with a backup mechanism which lifts up and supports a substrate W from the belt conveyor pair 12A and 12B and a clamp mechanism which is provided on the arm members 161 and which fixes the substrate W lifted up by the backup mechanism.

The backup mechanism is provided with a plurality of backup pins 151 in a predetermined arrangement, and also includes a backup table 150 that is supported on the X table 141 via a ball screw mechanism or the like so as to be ascendable/descendable and a motor 152 for driving the ball screw mechanism or the like. The backup mechanism is configured so that the ball screw mechanism or the like is activated to displace the backup table 150 to a predetermined release position and an actuated position that is elevated from the release position, by the motor 152. The release position is a position where a tip position of the backup pin 151 is lower than a lower surface of a substrate W supported by the belt conveyor pair 12A and 12B (a position indicated in the substrate supporting table 10B on a right side of FIG. 2). The actuated position is a position where the tip position of the backup pin 151 is higher than the lower surface of the substrate W (a position indicated in the substrate supporting table 10A on a left side of FIG. 2). Therefore, as shown on the left side of FIG. 2, the backup mechanism lifts the substrate W up from the belt conveyor pair 12A and 12B when the backup table 150 is arranged at the actuated position.

The clamp mechanism is arranged on the arm members 161 at a position above the belt conveyor pair 12A and 12B and includes a pair of clamp members 160 extending parallel to each other in the X-axis direction and an actuator for driving the clamp members such as a bidirectional air cylinder 162. One of the two clamp members 160 is assembled onto the arm member 161 so as to be displaceable in the Y-axis direction and is displaced to a release position and a clamping position in the Y-axis direction by driving of the air cylinder 162. That is, the clamp mechanism is configured such that, when one clamp member 160 is displaced from the release position to the clamping position, the one clamp member 160 sandwiches and clamps the substrate W lifted up by the backup mechanism together with the other clamp member 160 in the Y-axis direction, and when the one clamp member 160 is displaced from the clamping position to the release position, the clamped substrate W is released.

Moreover, in the printing process, the screen mask 206 (to be described layer) is overlaid on the substrate W being lifted up from the belt conveyor pair 12A and 12B by the clamp unit 14 and clamped by the clamp member 160 as described above. Therefore, the clamp unit 14 lifts up a substrate from the belt conveyor pair 12A and 12B and holds the substrate in a state where screen printing by the print executing section 20 can be performed.

Each arm member 161 is formed so as to embrace the belt conveyor pair 12A or 12B from an outer side (an outer side in the Y-axis direction). One arm member 161 is fixed onto one end on the X table 141, and the other arm member 161 is slidably provided on a fixed rail 164 that is fixed onto the X table 141 in the Y-axis direction. Substrates W with various Y-axis direction substrate widths can be available by adjusting a slide amount of the other arm member 161 to adjust a conveyor width of the belt conveyor pairs 12A and 12B. Regardless of Y-direction substrate widths of the substrates W, the clamp mechanism is capable of accurately clamping substrates W of various types by maintaining constant relative positions in the Y-axis direction of the belt conveyor pairs 12A and 12B and the respective clamp members 160.

Figure 3:
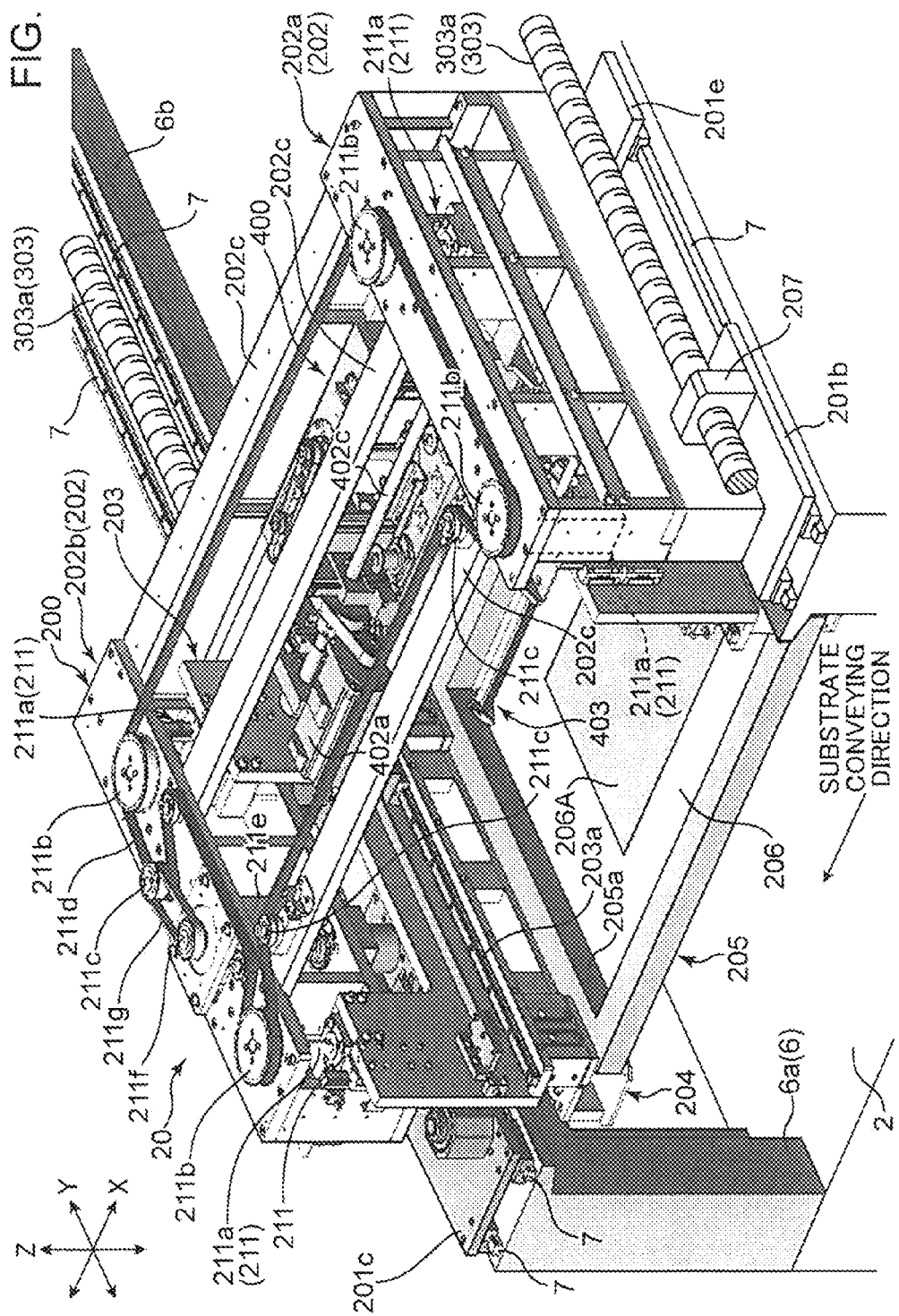
FIG. 3 is a perspective view showing a print executing section of the screen printing machine shown in FIG. 1.
Figure 4:
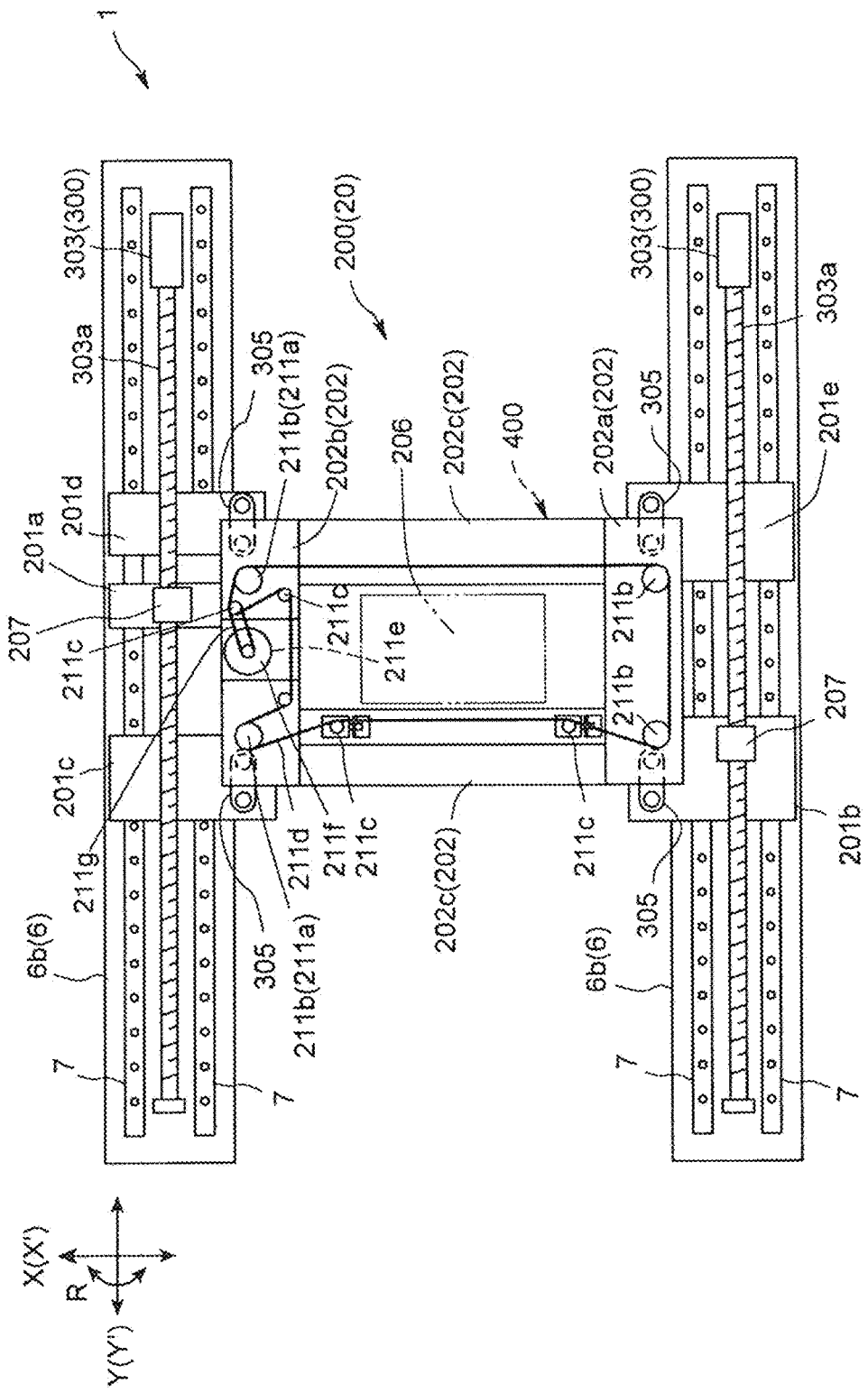
FIG. 4 is a schematic plan view showing the print executing section of the screen printing machine shown in FIG. 1.

Referring now to FIGS. 3 and 4, a machine frame 6 that holds the print executing section 20 is installed on the base 2. The machine frame 6 is a gate-shaped structure and has pillars 6a erected at four corners of the base 2. A beam section 6b is integrally provided on a pair of pillars 6a which oppose each other in the Y-axis direction. A pair of two guide rails 7 extending in the Y-axis direction is attached to an upper surface of each beam section 6b. In the present embodiment, the print executing section 20 is installed on the guide rail 7 and is configured so as to be reciprocable in the Y-axis direction.

A range of movement of the print executing section 20 corresponds to the table movable pitch Tph shown in FIG. 2.

The print executing section 20 is provided with a screen mask holding mechanism 200 and a squeegee unit holding mechanism 400 arranged in an X'-axis direction in the screen mask holding mechanism 200. In this case, the X'-axis direction is an axis of an orthogonal coordinate system in an coordinate system set on a main body 202 of the screen mask holding mechanism 200, and when an amount of rotational movement in an R-axis direction of the main body 202 of the screen mask holding mechanism 200 is 0, the X'-axis direction is consistent with the X-axis direction of the coordinate system set on the base 2. Hereinafter, a horizontal direction that is orthogonal to the X'-axis direction will be referred to as a Y'-axis direction.

The screen mask holding mechanism 200 is provided with sliders 201a, 201b, 201c, 201d, and 201e installed on the guide rail 7 of the machine frame 6, the main body 202 coupled to the sliders 201a to 201e via the print executing section driving mechanism 300, a mask lifting/lowering section 203 coupled to the main body 202 so as to be ascendable/descendable, a clamp section 204 provided at a lower end of the mask lifting/lowering section 203, a mask fixing member 205 held by the clamp section 204, and a screen mask 206 fixed by the mask fixing member 205.

Referring now to FIG. 4, among the sliders 201a to 201e, three (201a, 201c, and 201d) are arranged juxtaposed in the Y-axis direction on one end side (upper side in FIG. 4) in the X'-axis direction, and two (201b and 201e) are arranged juxtaposed in the Y-axis direction on another end side (lower side in FIG. 4) in the X'-axis direction.

The single slider 201a at center on the one end side is provided with a ball nut 207, and a ball screw mechanism 303a is screwed into the ball nut 207. In addition, the single slider 201b on the other end side in the X'-axis direction also is provided with a ball nut 207, and a ball screw mechanism 303a is screwed into the ball nut 207. The two ball screw mechanisms 303a are configured so as to be respectively driven by a Y-axis servo motor 303 (refer to FIG. 10) fixed to and supported by the machine frame 6, and the sliders 201a and 201b are configured so as to reciprocate in the Y-axis direction by being respectively driven by the Y-axis servo motor 303 via the ball screw mechanisms 303a.

The main body 202 is a structure formed in a frame shape that is rectangular in a plan view, and integrally is provided with an upstream-side structure 202a erected on the sliders 201b and 201e on the other end side in the X-axis direction (lower side in FIG. 4) of the machine frame 6, a downstream-side structure 202b erected on the sliders 201a, 201c, and 201d on the one end side in the X-axis direction (upper side in FIG. 4) of the machine frame 6, and a crosspiece 202c which couples both structures 202a and 202b in the X-axis direction.

The mask lifting/lowering section 203 is coupled to an inner portion of the main body 202 via a lifting/lowering mechanism 211. The lifting/lowering mechanism 211 is provided with four ball screw mechanisms 211a arranged at two front and two rear locations of each of the structures 202a and 202b, a pulley 211b provided at the top of each ball screw mechanism 211a, a plurality of idle pulleys 211c arranged on each of the structures 202a and 202b and the forward crosspiece 202c, a power transmission belt 211d arranged in tension between the pulleys 211b and 211c, and a mask Z-axis servo motor 211e attached to the downstream-side structure 202b. Transmission of a torque of the mask Z-axis servo motor 211e around a vertical line from an output pulley 211f of the mask Z-axis servo motor 211e to the idle pulley 211c of the downstream-side structure 202b via a power transmission belt 211g and further to a screw section of each ball screw mechanism 211a from the power transmission belt 211d via the pulley 211b, so that the screw sections of the respective ball screw mechanisms 211a concurrently rotate in a same direction to lift or lower the mask lifting/lowering section 203 coupled to the nut sections that are screwed to the screw sections. Accordingly, the mask lifting/lowering section 203 is configured so as to be capable of lifting the screen mask 206 to an overlaying position where the screen mask 206 is overlaid and a release position to which the screen mask 206 is lifted from the overlaying position with respect to a substrate W clamped by the substrate supporting table 10A (10B) positioned directly beneath the mask lifting/lowering section 203.

The clamp section 204 is provided in a lower end portion of the mask lifting/lowering section 203 and is designed to detachably clamp four corners of the mask fixing member 205. The clamp section 204 is provided with a movable member which is driven in the Z-axis direction by an air cylinder and a supporting member which sandwiches the mask fixing member 205 with the movable member, and is designed to firmly hold the mask fixing member 205 positioned by a positioning member (not shown) due to an operation by an operator.

The mask fixing member 205 is embodied by a rectangular frame in which an opening 205a for screen printing is formed at a center thereof, and the screen mask 206 assembled onto the mask fixing member 205 in advance so as to block the opening 205a from below is detachably fixed to the mask fixing member 205.

The screen mask 206 is provided with a print area 206A having holes formed in correspondence with a circuit pattern to be printed on a substrate W.

Referring now to FIG. 4, the print executing section driving mechanism 300 is designed to drive the print executing section 20 in the Y-axis direction and also to function as a position adjusting mechanism for adjusting an misalignment of the print executing section 20 around a vertical line in an X'-Y' coordinate system of the screen mask 206.

The print executing section driving mechanism 300 includes four lever members 305 which can be coupled by hinges at both ends thereof. The single slider 201a at center on the one end side in the X'-axis direction is coupled to the main body 202 via a coupling shaft which is arranged in the Z-axis direction and which constitutes a hinge, and the single slider 201b on the other end side in the X'-axis direction as well as the other three sliders 201c, 201d, and 201e are respectively coupled to the main body 202 via corresponding lever members 305. One end of each lever member 305 is coupled to the main body 202 via a coupling shaft which is arranged in the Z-axis direction and which constitutes a hinge, and another end of each lever member 305 is respectively coupled to corresponding sliders 201b, 201c, 201d, and 201e via a coupling shaft which is arranged in the Z-axis direction and which constitutes a hinge. Accordingly, the main body 202 can be swung around the Z-axis with respect to the single slider 201a at center on the one end side.

In addition to the lever members 305, the print executing section driving mechanism 300 also is provided with the respective sliders 201a, 201b, 201c, 201d, and 201e, the respective coupling shafts, the ball screw mechanisms 303a, and the Y-axis servomotor 303, and by providing a difference in a direction of rotation or an amount of rotation of the Y-axis servo motor 303 between the one end side and the other end side in the X'-axis direction, the print executing section driving mechanism 300 is capable of rotating the main body 202 in an R-axis direction around the Z axis. Accordingly, by respectively driving the two mask Y-axis servo motors 303 based on a mounting position of the screen mask 206 and a position of the substrate W as recognized by an imaging unit, fine adjustment can be performed so as to match a position in an R-axis direction of the print area 206A of the screen mask 206 with respect to a substrate W supported by the substrate supporting tables 10A and 10B.

In addition, by simultaneously driving the two mask Y-axis servo motors 303 in a same direction at a same velocity, the print executing section driving mechanism 300 can drive the print executing section 20 in the Y-axis direction between the A origin and the B origin while maintaining the position of the print area 206A of the screen mask 206 in the R-axis direction.

The squeegee unit holding mechanism 400 is designed to spread an application material such as a cream solder or a conductive paste on the screen mask 206 while rolling (kneading) the application material. In the example shown, a pair of fixed rails 203a that extend in the Y'-axis direction is provided on an inner wall of the mask lifting/lowering section 203, and the squeegee unit holding mechanism 400 is placed laterally on the fixed rail 203a and is coupled so as to be reciprocable in the Y-axis direction.

Figure 5:
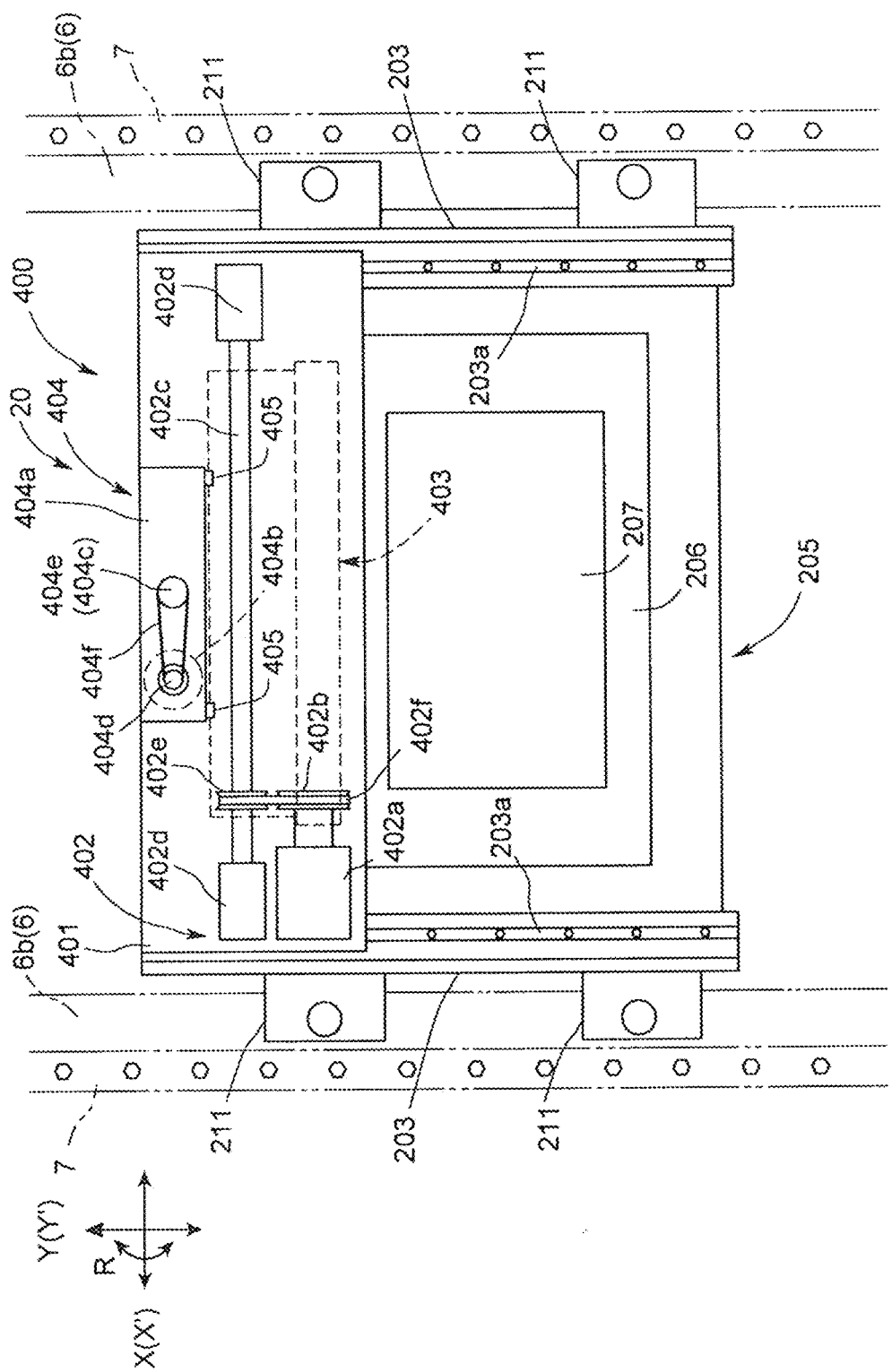
FIG. 5 is an enlarged schematic plan view showing the print executing section of the screen printing machine shown in FIG. 1.

Referring now to FIG. 5, the squeegee unit holding mechanism 400 is provided with a chassis 401 which extends in the X'-axis direction inside the mask lifting/lowering section 203 and which is slidably supported by both fixed rails 203a arranged in the Y'-axis direction with respect to the mask lifting/lowering section 203, a squeegee reciprocal driving mechanism (Y'-axis driving mechanism) 402 arranged in an upper part of the chassis 401, a squeegee unit 403 coupled to the chassis 401 so as to be ascendable/descendable, and a squeegee head lifting/lowering mechanism 404 which drives the squeegee unit 403 so as to ascend/descend.

The Y'-axis driving mechanism 402 is provided with a servo motor 402a with its axis arranged along the X' axis, a power transmission shaft 402c arranged parallel to an output pulley 402b of the servo motor 402a, a power transmitting section 402d which is provided at both ends of the power transmission shaft 402c and which converts a rotational force of the power transmission shaft 402c into a parallel motion force that causes the chassis 401 to move in the Y'-axis direction relative to the fixed rail 203a, a pulley 402e attached to the power transmission shaft 402c, and a power transmission belt 402f wound around the pulley 402e and the output pulley 402b. The Y'-axis driving mechanism 402 is configured such that due to a rotational force of the servo motor 402a, the chassis 401 is reciprocable within a stroke range set in advance relative to the mask lifting/lowering section 203.

Figure 6:
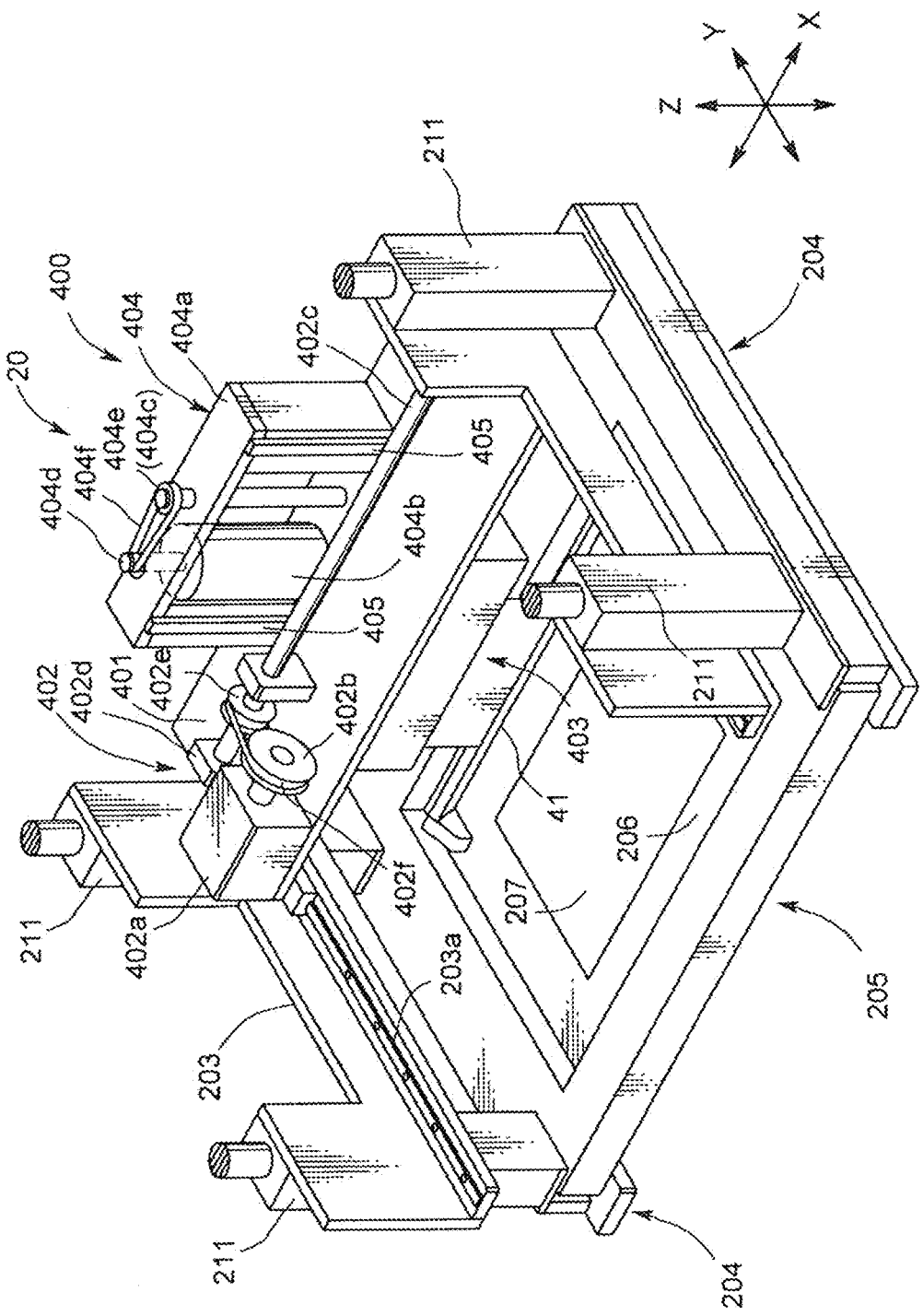
FIG. 6 is a perspective view showing the print executing section of the screen printing machine shown in FIG. 1.

Meanwhile, as shown in FIG. 6, the squeegee head lifting/lowering mechanism 404 is provided with a gate frame-shaped frame body 404a erected on a rear part of an upper end of the chassis 401, a servomotor 404b which is arranged inside the frame body 404a and whose axis is consistent with the Z-axis direction, and a ball screw mechanism 404c annexed to a side portion of the servo motor 404b of the frame body 404a. An output pulley 404d of the servomotor 404b is arranged above the frame body 404a, and an input pulley 404e of the ball screw mechanism 404c opposes a side portion of the output pulley 404d along the X' axis. A power transmission belt 404f is wound around both pulleys 404d and 404e, and due to a screw section of the ball screw mechanism 404c being rotationally driven in both directions, a nut section (not shown) that screws with the screw section is lifted/lowered. The nut section is integrated with the squeegee unit 403, and due to an ascent/descent of the nut section, the squeegee unit 403 ascends/descends between a print position where the squeegee 41 held by the squeegee unit 403 is landed on the screen mask 206 and a retreat position where the squeegee 41 is retreated upward from the print position.

A pair of guide rails 405 that extends vertically is fixed to a front part of the frame body 404a and the squeegee unit 403 is coupled by the guide rails 405 so as to be vertically reciprocable.

Figure 7:
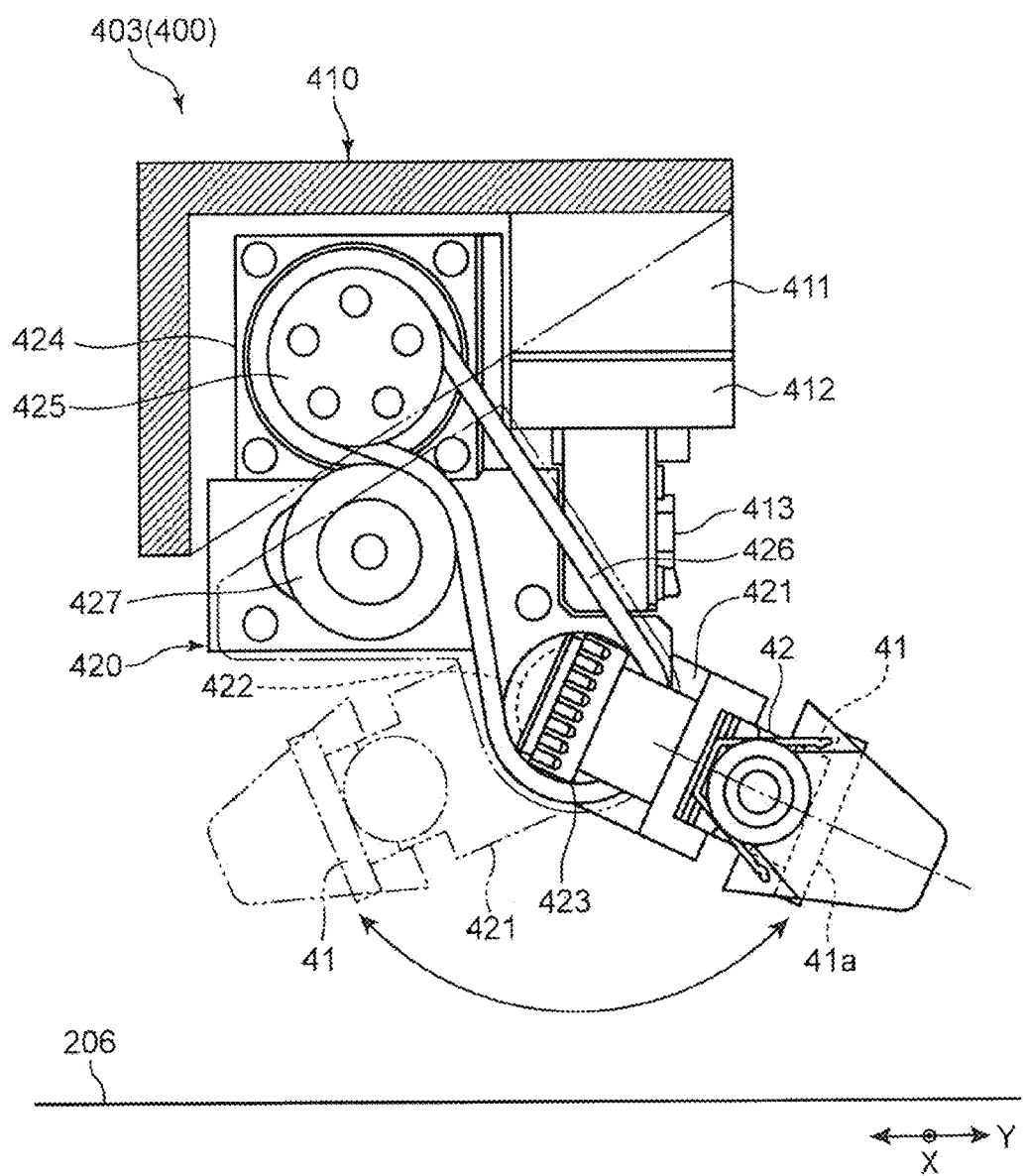
FIG. 7 is a side view showing a specific configuration of a head of the screen printing machine shown in FIG. 1.
Figure 8:
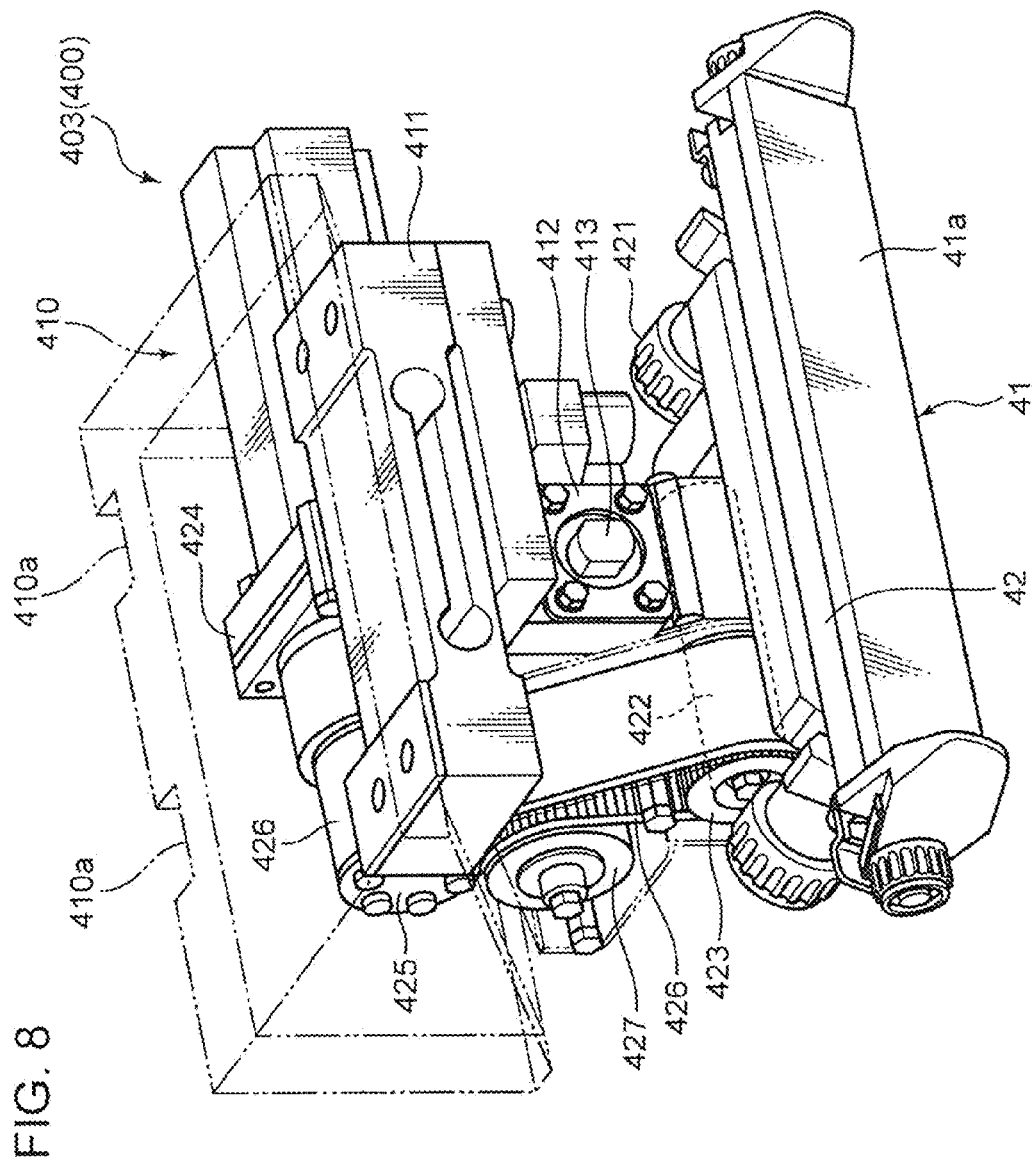
FIG. 8 is a perspective view showing a specific configuration of the head of the screen printing machine shown in FIG. 1.
Figure 9:
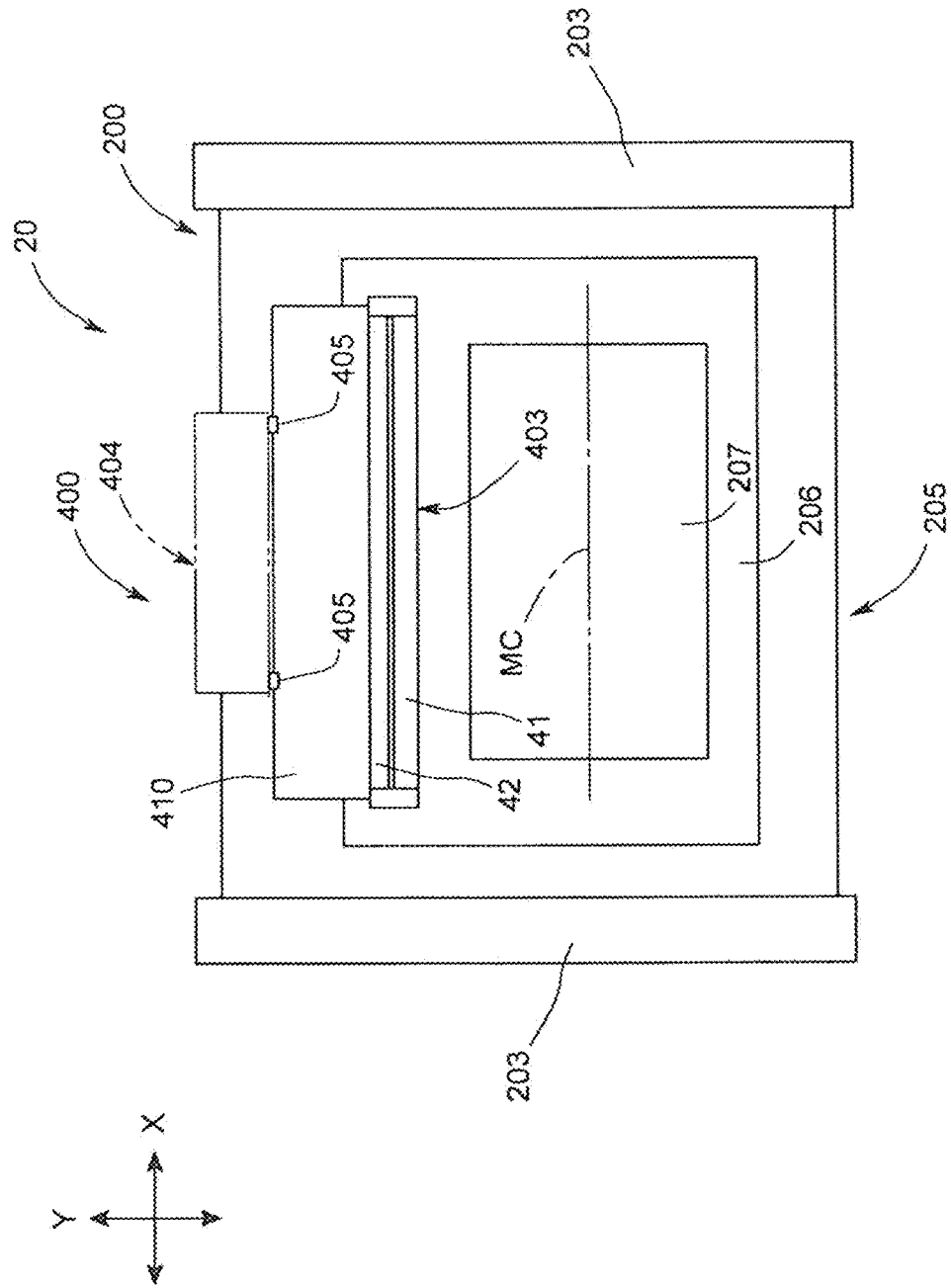
FIG. 9 is a schematic plan view showing a mask holding mechanism of the screen printing machine shown in FIG. 1.

Referring now to FIGS. 7 to 9, the squeegee unit 403 has a main frame 410 and a sub-frame 420 coupled to the main frame 410.

A supporting section 412 which has a T-shape when viewed in the X' direction and which is interposed with a pressure sensor 411 such as a load cell is vertically installed on a lower surface of an upper wall of the main frame 410, and a first support shaft 413 extending in the Y'-axis direction is fixed to a lower wall of the supporting section 412. By being coupled to the first support shaft 413 via a bearing, the sub-frame 420 is swingably supported around the first support shaft 413 with respect to the supporting section 412. In the example shown, a depression 410a coupled to the guide rails 405 of the frame body 404a is formed on a rear surface of the main frame 410.

A unit assembly member 421 which corresponds to a squeegee assembly section is rotatably supported by the sub-frame 420 via a second support shaft 422 (a horizontal shaft for supporting the squeegee) extending in the X'-axis direction, and a squeegee rotating mechanism which drives the unit assembly member 421 is mounted on the sub-frame 420.

The unit assembly member 421 is a rectangular plate-like member which is elongated in the X'-axis direction. The squeegee 41 and a squeegee holder 42 which holds the squeegee 41 are detachably assembled to the unit assembly member 421. In addition, one surface of the squeegee 41 is adopted as a working surface 41a for paste pressing, and the squeegee 41 is rotatably supported by the second support shaft 422 (the horizontal shaft for supporting the squeegee) via the unit assembly member 421 in a state where the second support shaft 422 is positioned to the side of a surface opposite to the working surface 41a.

The second support shaft 422 which supports the unit assembly member 421 penetrates the sub-frame 420 and protrudes to an opposite side. A pulley 423 is mounted on and fixed to the protruding portion by key coupling. In addition, a servo motor 424 as a drive source is fixed to the sub-frame 420, a drive belt 426 is mounted so as to extend between a pulley 425 mounted on an output shaft of the servo motor 424 and the pulley 423, and the drive belt 426 is tensioned due to a tension pulley 427 coming into pressure contact with the drive belt 426 from an outer circumferential side thereof. In other words, the squeegee rotating mechanism is constituted by the servo motor 424, the pulleys 425, 423, and 427, the drive belt 426, and the like, and due to actuation of the servo motor 424, the unit assembly member 421 is driven so as to rotate forward and in reverse around the second support shaft 422. Moreover, an origin position of the unit assembly member 421 with respect to the sub-frame 420 is detected and a reference position to be used to control an angle of rotation of the servo motor 424 is obtained. In addition, due to a forward/reverse rotation of the unit assembly member 421, the squeegee 41 is configured so as to be capable of changing postures by rotating around the second support shaft 422 between a state where the working surface 41a is inclined to one side and a state where the working surface 41a is inclined to an opposite side with respect to a stage where the working surface 41a opposes the screen mask 206 in parallel.

The squeegee holder 42 of the squeegee unit holding mechanism 400 is a rectangular plate-like member which is elongated in the X'-axis direction and which is made of a light alloy such as aluminum alloy. Meanwhile, the squeegee 41 is a rectangular plate-like member which is elongated in the X'-axis direction and which is made of rigid urethane, stainless steel, or the like, and is held by the squeegee holder 42 in a state where the squeegee 41 overlaps the holder 42 as shown in FIG. 8.

A width dimension of the squeegee 41 is set so that a range in which the working surface 41a comes into contact with paste during a forward movement of the squeegee 41 and a range in which the working surface 41a comes into contact with paste during a reverse movement of the squeegee 41 overlap each other.

As shown in FIG. 2, an imaging unit 50 is annexed to the print executing section 20. The imaging unit 50 is designed to perform image recognition of a relative positional relationship between the screen mask 206 and a substrate W, and is provided with: two mask recognition cameras 50A which capture images of a plurality of markers including marks, symbols, and the like inscribed on a lower surface of the screen mask 206 from below; and two substrate recognition cameras 50B which capture images of a plurality of markers including marks, symbols, and the like of the substrate W held by the substrate supporting tables 10A and 10B. Each mask recognition camera 50A is arranged on the main body 202 of the screen mask holding mechanism 200 so as to be movable in the X'-axis direction and the Y'-axis direction, and each substrate recognition camera 50B is arranged fixed to the main body 202 of the screen mask holding mechanism 200. Each mask recognition camera 50A is provided so as to be two-dimensionally movable by being coupled to an X'-Y' robot (not shown), and based on control of the X'-Y' robot by the control unit 60 (to be described later), enters a lower side of the screen mask 206 during preparation of the screen mask 206 or the like to capture images of the respective markers on the lower surface of the screen mask 206. On the other hand, each substrate recognition camera 50B captures images of the respective markers on the substrate W when the substrate supporting table 10A (10B) enters the print position SP. Coordinates of positions of two markers (fiducial marks) of the screen mask 206 and positions of two markers (fiducial marks) on a substrate which have been recognized by both cameras 50A and 50B are converted from the X'-Y' coordinate system to the X-Y coordinate system on the base 2 based on an R-direction angle that is premised on a positional alignment of the screen mask 206 with the substrate W in the R-direction. Subsequently, a position of the screen mask 206 in the R-direction and an X-Y position of the substrate W are adjusted.

Figure 10:
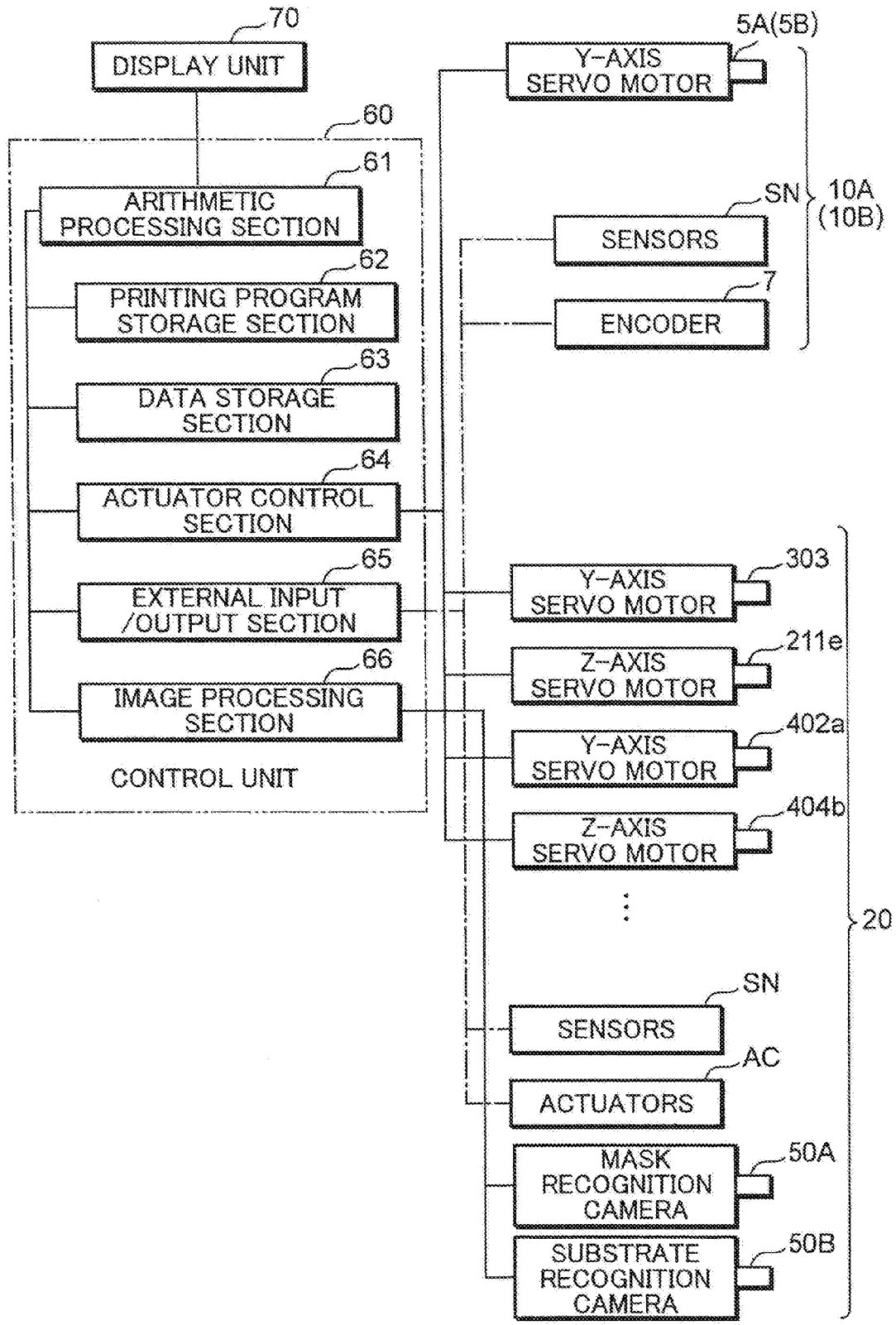
FIG. 10 is a block diagram showing a control configuration of the screen printing machine shown in FIG. 1.

As shown in FIG. 10, the control unit 60 (an example of print position setting means and table movement control means according to the present disclosure) has an arithmetic processing section 61 constituted by a microprocessor or the like, a printing program storage section 62 which stores transaction data and the like for print processing, a data storage section 63 which stores master data and the like necessary for control, an actuator control section 64 which drives actuators such as the motors 5A and 5B, an external input/output section 65 constituted by various interfaces, and an image processing section 66 constituted by a capture board or the like. All of the actuators and cameras including the mask recognition camera 50A are electrically connected so as to be controllable by the control unit 60. Therefore, a series of print processing operations by the substrate supporting tables 10A and 10B and the print executing section 20 or, in other words, a series of operations including the reception of a substrate W fed from the first loader L1 and the second loader L2 by the substrate carry-in sections En1 and En2, screen printing on the substrate W, and the carrying-out of the substrate W from the substrate carry-out sections Ex1 and Ex2 is controlled overall by the control unit 60. In addition, a display unit 70 capable of displaying a processing state with a GUI or the like and an input machine (not shown) constituted by a pointing machine or the like are connected to the control unit 60, and transaction data can be inputted and a program that realizes control processing can be set or changed through operations performed by an operator. Moreover, both the printing program storage section 62 and the data storage section 63 are logical concepts which are realized by combining a ROM, a RAM, an auxiliary storage machine, and the like.

Figure 11:
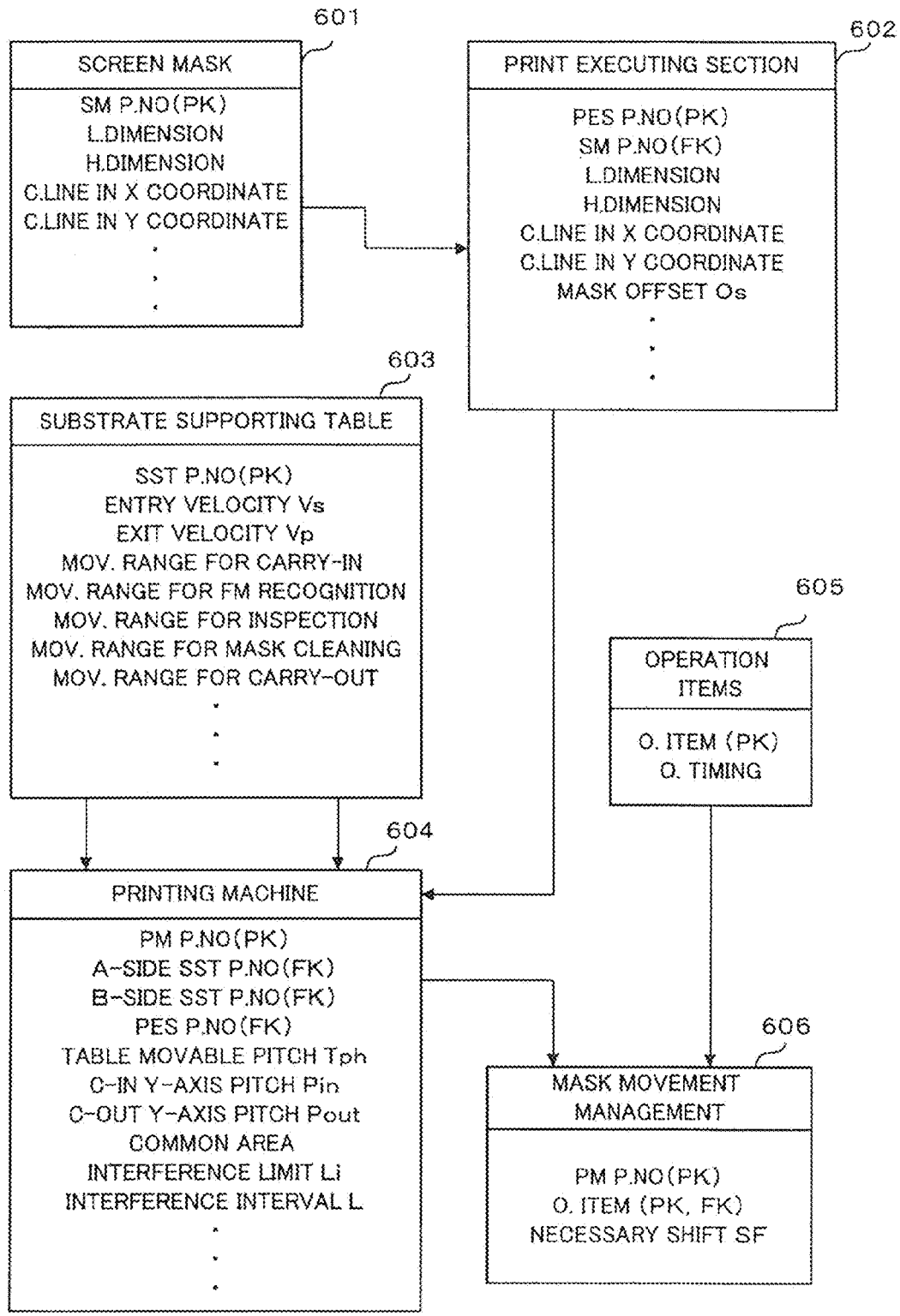
FIG. 11 is an entity-relationship (ER) diagram showing a part of data stored in the screen printing machine shown in FIG. 1.

Referring now to FIG. 11, the data storage section 63 of the control unit 60 is provided with a screen mask data table 601 which stores data relating to the screen mask 206, a print executing section data table 602 which stores data relating to the print executing section 20, a substrate supporting table data table 603 which stores data relating to the substrate supporting tables 10A and 10B, a printing machine data table 604 which stores data relating to the screen printing machine 1, an operation items data table 605, and a mask movement management data table 606. All of these data tables 601 to 606 are sets of data which store instances (actual values assigned to attributes) as a two-dimensional matrix (rows and column) in a database system.

Items of the data tables 601 to 606 respectively represent attributes and are assigned to a top row in a two-dimensional matrix. In the data tables 601 to 606, for example, an attribute (PK attribute) set to a primary key (PK) is assigned to a leftmost element of a top row of a two-dimensional matrix, and instances of the PK attribute are stored as data in second and subsequent rows of a column of the PK attribute. In addition, instances of respective attributes that are uniquely identified by the PK attribute are retained as data in each row of second and subsequent columns in the two-dimensional matrix. Attributes of the data tables 602, 603, 604, and 606 include attributes (FK attributes) that is set as a foreign key (FK). An FK attribute references a PK attribute of another data table, and once an instance of an FK attribute is known, a relevant row in another data table having a relationship with the FK attribute can be identified from a relationship expressed as "instance of FK attribute=instance of PK attribute" and a PK attribute and the FK attribute can be linked. Furthermore, arrows in the drawing represent relationships between the data tables 601 and 606 and indicate that a foreign key in a data table on an end point-side of an arrow references a primary key in a data table on a start point-side of the arrow. The respective data tables 601 to 606 are logical entities. Upon implementation, each of the data tables may be constructed by a single data file (for example, a CSV file) or may be constituted by a plurality of data files in consideration of normalization.

The screen mask data table 601 uses a mask part number as a primary key and has a longitudinal dimension, a horizontal dimension, a center X coordinate, and a center Y coordinate as attributes. By referencing the screen mask data table 601, the control unit 60 can reference a type or a dimensional relationship of the screen mask 206 mounted to the screen printing machine 1 as control parameters. The center Y coordinate of the screen mask data table 601 refers to a Y coordinate that identifies a center line MC (refer to FIGS. 12 to 15) in the X-axis direction of the screen mask 206.

The print executing section data table 602 uses a print executing section part number as a primary key and has a mask part number, a longitudinal dimension, a horizontal dimension, a center X coordinate, a center Y coordinate, a mask offset Os, and the like as attributes. A mask part number is a foreign key for identifying the screen mask 206 that is mounted to the print executing section and the screen mask data table 601 is associated with the print executing section data table 602 by the key. In addition, a mask offset Os indicates an offset in the Y-axis direction which is created between the associated screen mask 206 and a center line YC of the print executing section 20 (refer to FIGS. 12 to 15). By registering the offset Os in advance, the control unit 60 is able to realize efficient alternate printing as will be described later.

The substrate supporting table data table 603 uses a table part number as a primary key and stores attributes of units constituting the substrate supporting table 10A or 10B.

The printing machine data table 604 uses a printing machine part number as a primary key and is provided with necessary specifications for controlling the screen printing machine 1 as attributes. The printing machine data table 604 includes an A-side substrate supporting table part number which associates units adopted by the substrate supporting table 10A on an A side (one end-side in the Y-axis direction shown in a lower part of FIG. 1; the same shall apply hereinafter) with the substrate supporting table data table 603 and a B-side substrate supporting table part number which associates units adopted by the substrate supporting table 10B on a B side (the other end-side in the Y-axis direction shown in an upper part of FIG. 1; the same shall apply hereinafter) with the substrate supporting table data table 603. Due to the A-side and B-side substrate supporting table part numbers, information such as a movement range and movement velocity of the substrate supporting tables 10A and 10B adopted by the screen printing machine 1 can be referenced. In addition, the printing machine data table 604 has a print executing section part number that is associated with the print executing section 20 adopted by the screen printing machine 1 as a foreign key, and through this relationship, specifications of the print executing section 20 adopted by the screen printing machine 1 can be referenced. In the example shown, the printing machine data table 604 is configured so as to store the table movable pitch Tph shown in FIG. 2, a carry-in side Y-axis pitch Pin that is an opposing interval between the first substrate carry-in position EnP1 and the second substrate carry-in position EnP2 in the Y-axis direction, a carry-out side Y-axis pitch Pout that is an opposing interval between the first substrate carry-out position ExP1 and the second substrate carry-out position ExP2 in the Y-axis direction, a common area set in the screen printing machine 1, an interference limit Li that is an absolute value of a minimum distance to which the two substrate supporting tables 10A and 10B can approach each other without causing interference, an interference interval L, and the like. The common area refers to an area in which both the substrate supporting tables 10A and 10B are able to advance/retreat on the base in the Y-axis direction. In addition, the interference interval L refers to an interval at which the substrate supporting tables 10A and 10B may interfere with each other.

Moreover, for the purpose of accommodating a width of a substrate (substrate width) in the Y-axis direction, in the belt conveyor pair CL1 and the belt conveyor pair 12A on the substrate supporting table 10A, one side in the Y-axis direction is a fixed conveyor and another side in the Y-axis direction is a movable conveyor. In this case, when respective fixed conveyors of the belt conveyor pair CL1 and the belt conveyor pair 12A are both on a same side in the Y-axis direction, the substrate supporting table 10A is able to receive a substrate W at a same position in the Y-axis direction even if substrate widths vary. In other words, the first substrate carry-in position EnP1 does not vary. When respective fixed conveyors of the belt conveyor pair CL1 and the belt conveyor pair 12A are on opposite sides in the Y-axis direction, the first substrate carry-in position EnP1 varies in correspondence with the substrate width (when the fixed conveyor of the belt conveyor pair CL1 is on the A side in FIG. 1 and the fixed conveyor of the belt conveyor pair 12A is on the B side in FIG. 1, the greater the substrate width, the greater the misalignment of the first substrate carry-in position EnP1 toward the B side). In a similar manner, the second substrate carry-in position EnP2, the first substrate carry-out position ExP1, and the second substrate carry-out position ExP2 may respectively remain the same or may vary in accordance with a variation in substrate width depending on modes of arrangement of the respective fixed conveyors between the belt conveyor pair CL2 and the belt conveyor pair 12B of the substrate supporting table 10B, between the belt conveyor pair CM1 and the belt conveyor pair 12A of the substrate supporting table 10A, and between the belt conveyor pair CM2 and the belt conveyor pair 12B of the substrate supporting table 10B.

Next, the operation items data table 605 is for storing operations by the substrate supporting table 10A and 10B that need to be checked by the control unit 60 in order to realize alternate printing, and uses an operation item as a primary key and stores operation timings. For example, instances of operation items may include a "substrate carry-in operation," a "fiducial mark recognition operation," a "post-printing inspection operation," a "mask cleaning operation," and a "substrate carry-out operation," and instances of operation timings may include "before printing" and "after printing."

The mask movement management data table 606 is an associative entity that uses a printing machine part number and an operation item as primary keys and, for each screen printing machine 1, sets an operation item which requires mask movement management and a movement distance (necessary shift) SF of the screen mask 206 in the Y-axis direction for improving throughput (increasing a throughput value which indicates the number of substrates W on which printing can be executed and which can be carried out from the screen printing machine 1 to the downstream component mounting machine Mt within a predetermined period of time).

When moving a print position in the Y-axis direction during activation for a predetermined purpose, a necessary shift SF refers to a distance by which the print position is shifted in the Y-axis direction from a center coordinate Yd (for example, a center position of a table movable pitch) of a print position SP determined in default configuration (refer to FIGS. 22 to 24). The necessary shift SF is set as an absolute value of a length in the Y-axis direction.

In the present embodiment, for example, after the substrate supporting table 10A (10B) that has finished printing at the print position starts moving in a direction receding from the other substrate supporting table from the print position SP toward the A origin, in order to position the other substrate supporting table at the print position as quickly as possible, the print executing section 20 is configured so as to be moved toward the B origin under a predetermined condition.

In such a case, by setting a value of the necessary shift SF for each printing machine part number and each operation item in the mask movement management data table 606 in advance, the control unit 60 can reference a movement distance of each printing machine in consideration of various operations items to be executed after printing as the necessary shift SF.

Next, the mask movement management will be described with reference to FIGS. 12 to 15.

In a production line mounted with the screen printing machine 1, positions of the respective belt conveyor pairs CL1, CL2, CM1, and CM2 may be in various modes based on specifications of an upstream machine or a downstream mounting machine, and the like. In addition, in accordance with the positions of the respective belt conveyor pairs CL1, CL2, CM1, and CM2, positions of the first substrate carry-in position EnP1, the second substrate carry-in position EnP2, the first substrate carry-out position ExP1, and the second substrate carry-out position ExP2 may also be in various modes as shown in FIGS. 12 to 15. However, in any case, a period of time from a carry-in operation of a substrate W by one substrate supporting table 10A (10B) to completion of a printing process and a period of time from a movement of the other substrate supporting table 10B (10A) from the print position SP to the substrate carry-out position ExP2 and completion of a carry-out operation of the substrate W, which are performed in parallel, are desirably equal to each other. In addition, since the duration of a printing process increases, preferably, after the other substrate supporting table 10B (10A) finishes printing, the print executing section 20 or, in other words, the print position SP is moved closer to the substrate carry-in position EnP1 (EnP2) of the one substrate supporting table 10A (10B) in order to equalize the periods of time as much as possible.

Figure 12:
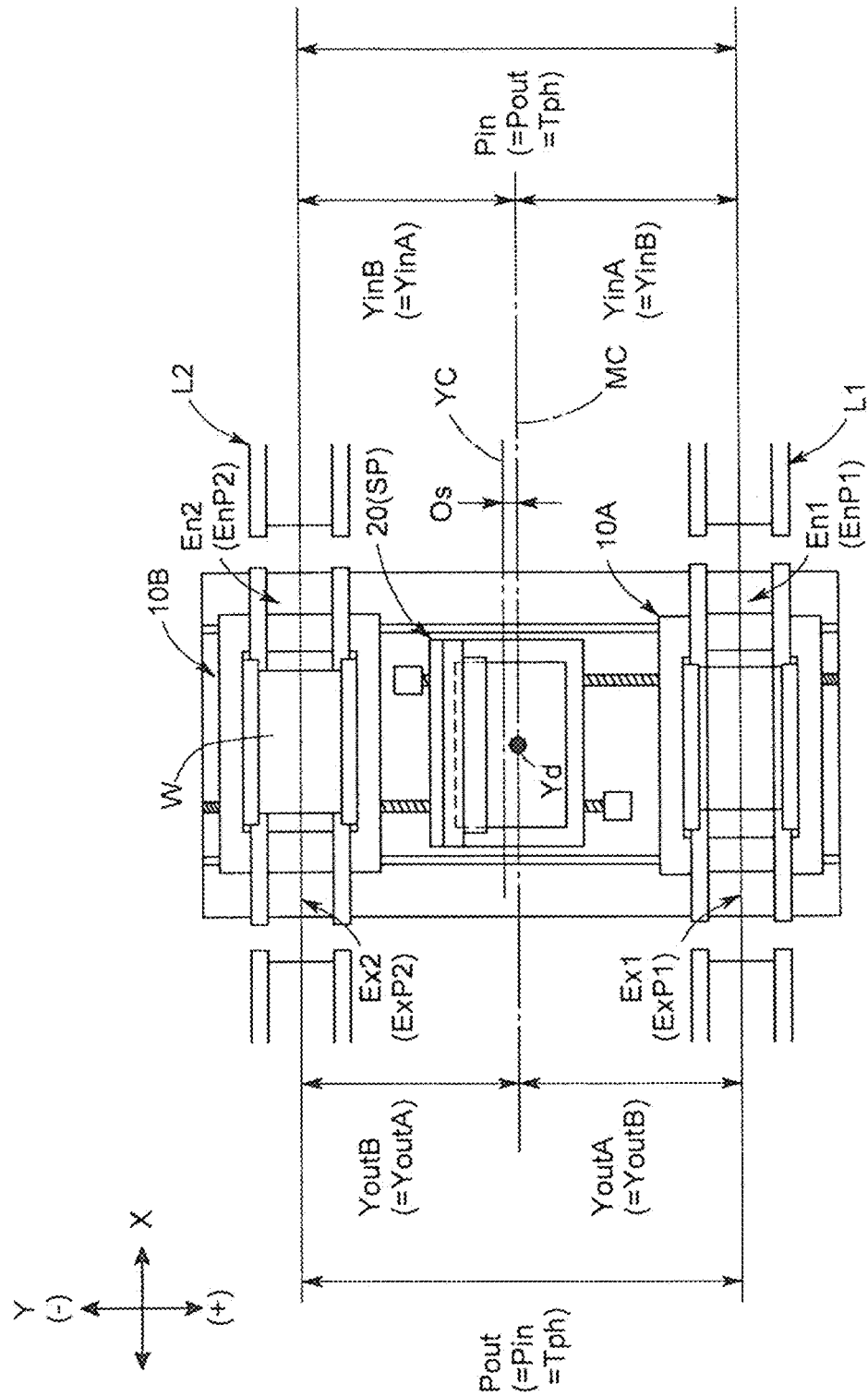
FIG. 12 is a schematic plan view showing a dimensional relationship of the screen printing machine shown in FIG. 1.
Figure 13:
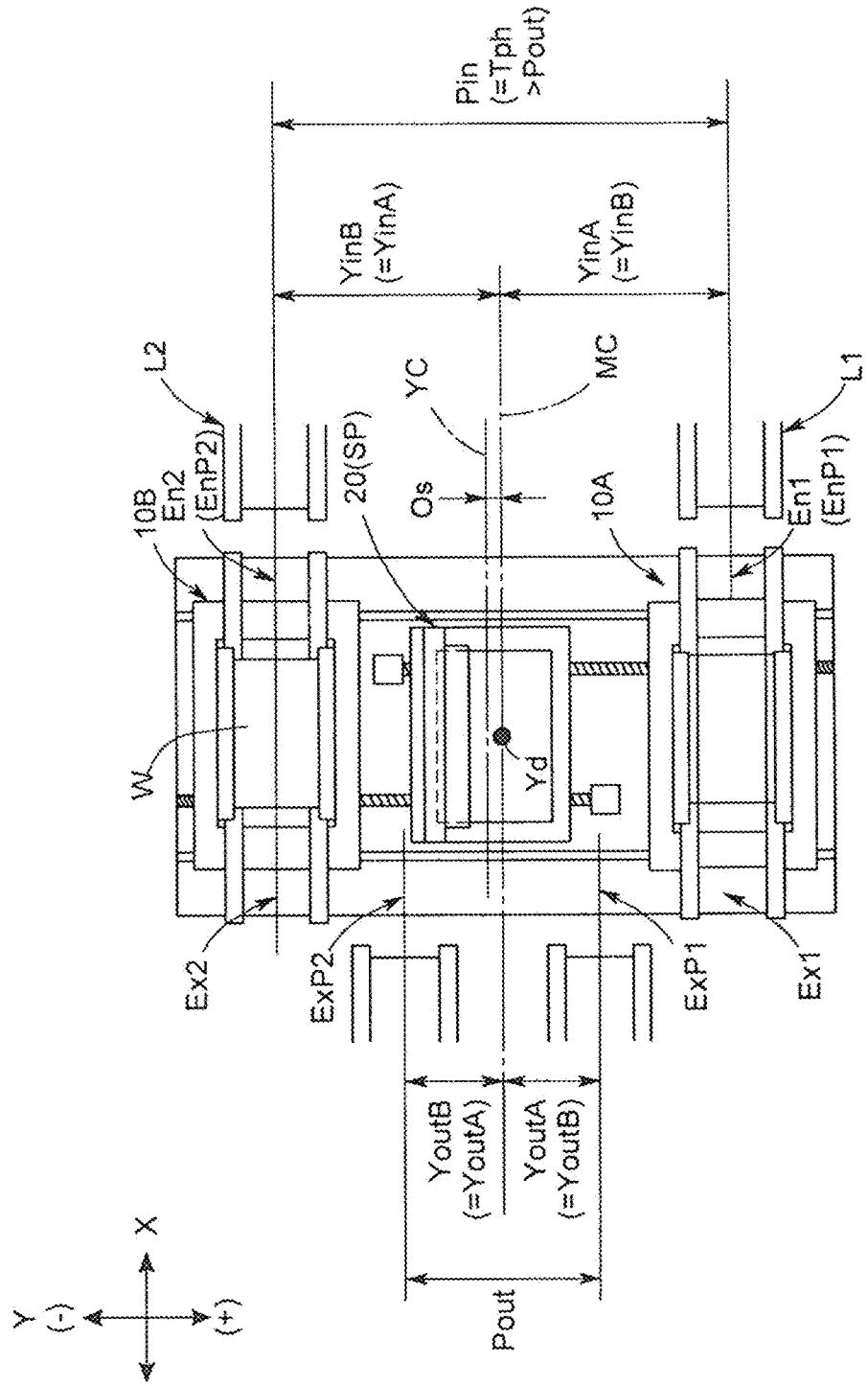
FIG. 13 is a schematic plan view showing another exemplary layout/dimensional relationship of a screen printing machine to which an embodiment of the present disclosure is applicable.
Figure 14:
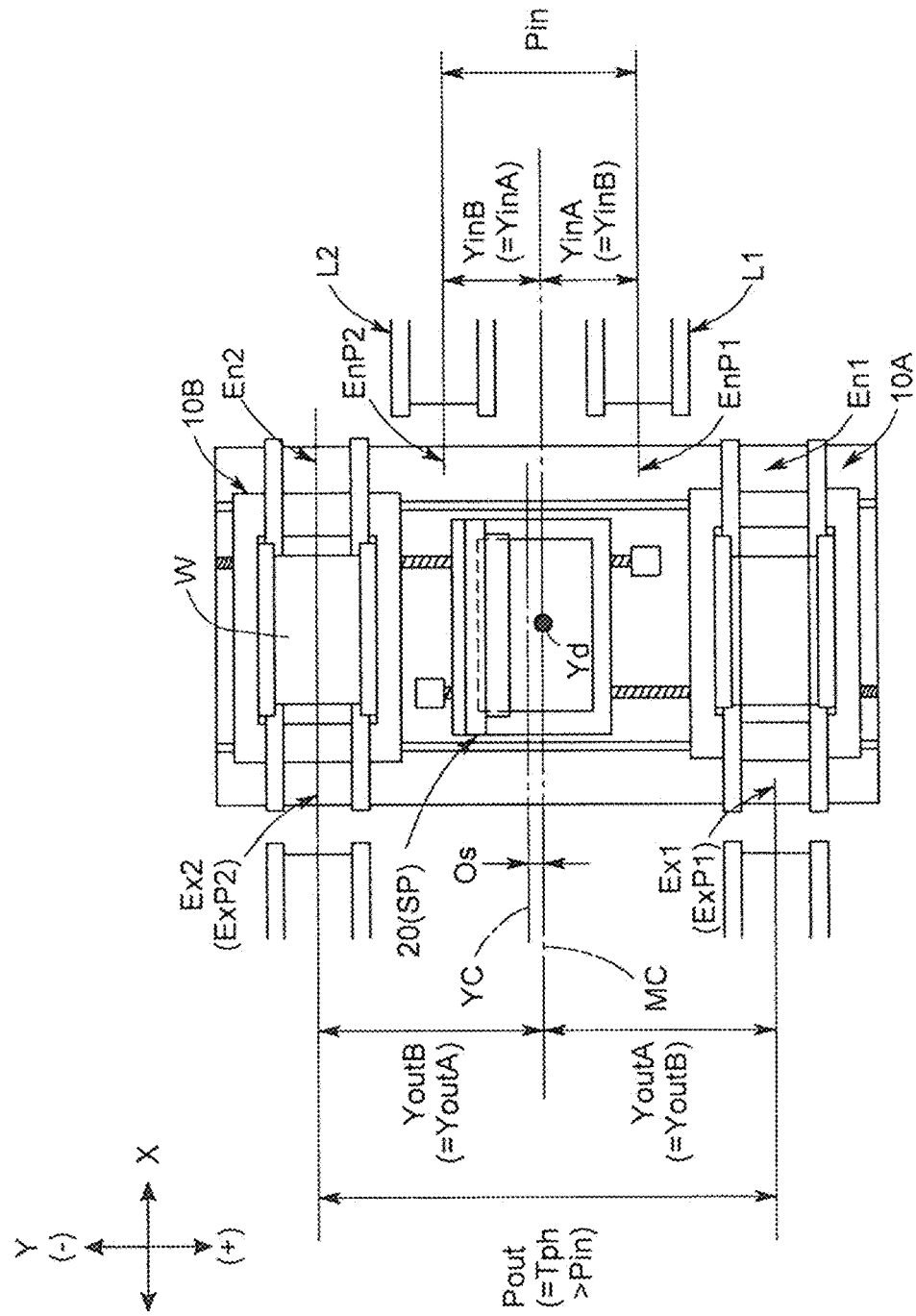
FIG. 14 is a schematic plan view showing yet another exemplary layout/dimensional relationship of a screen printing machine to which an embodiment of the present disclosure is applicable.

For example, as shown in FIGS. 1 and 12, there are cases where the substrate carry-in positions EnP1 and EnP2 and the substrate carry-out positions ExP1 and ExP2 are symmetrically arranged with respect to a center line of the print executing section 20 in the X-axis direction. Even in such a case, preferably, after the other substrate supporting table 10B (10A) finishes printing, the print position SP is immediately moved closer to the substrate carry-in position EnP1 (EnP2) of the one substrate supporting table 10A (10B) in order to equalize the periods of time as much as possible. Meanwhile, there are modes where the print executing section 20 cannot be moved immediately after a printing process. For example, even in a similar symmetrical arrangement, there may be cases where a distance between the substrate carry-in positions EnP1 and EnP2 in the Y-axis direction (carry-in side Y-axis pitch Pin) is longer than a distance between the substrate carry-out positions ExnP1 and ExP2 in the Y-axis direction (carry-out side Y-axis pitch Pout) as shown in FIG. 13, or the carry-in side Y-axis pitch Pin is shorter than the carry-out side Y-axis pitch Pout as shown in FIG. 14. In such cases, since one substrate supporting table 10A (10B) moves into a carry-out operation in a state of occupying a part of the common area, the other substrate supporting table 10B (10A) may need to stand by for entering the common area until the one substrate supporting table 10A (10B) exits the common area in order to avoid interfering with the one substrate supporting table 10A (10B).

In addition, as shown in FIG. 14, there may be cases where the carry-in side Y-axis pitch Pin is shorter than the carry-out side Y-axis pitch Pout. In such a case, when one substrate supporting table 10A (10B) moves into a carry-in process after finishing a carry-out process, the one substrate supporting table 10A (10B) may need to stand by for entering the common area until the other substrate supporting table 10B (10A) that is in a state of occupying a part of the common area exits the common area in order to avoid interfering with the other substrate supporting table 10B (10A).

Figure 15:
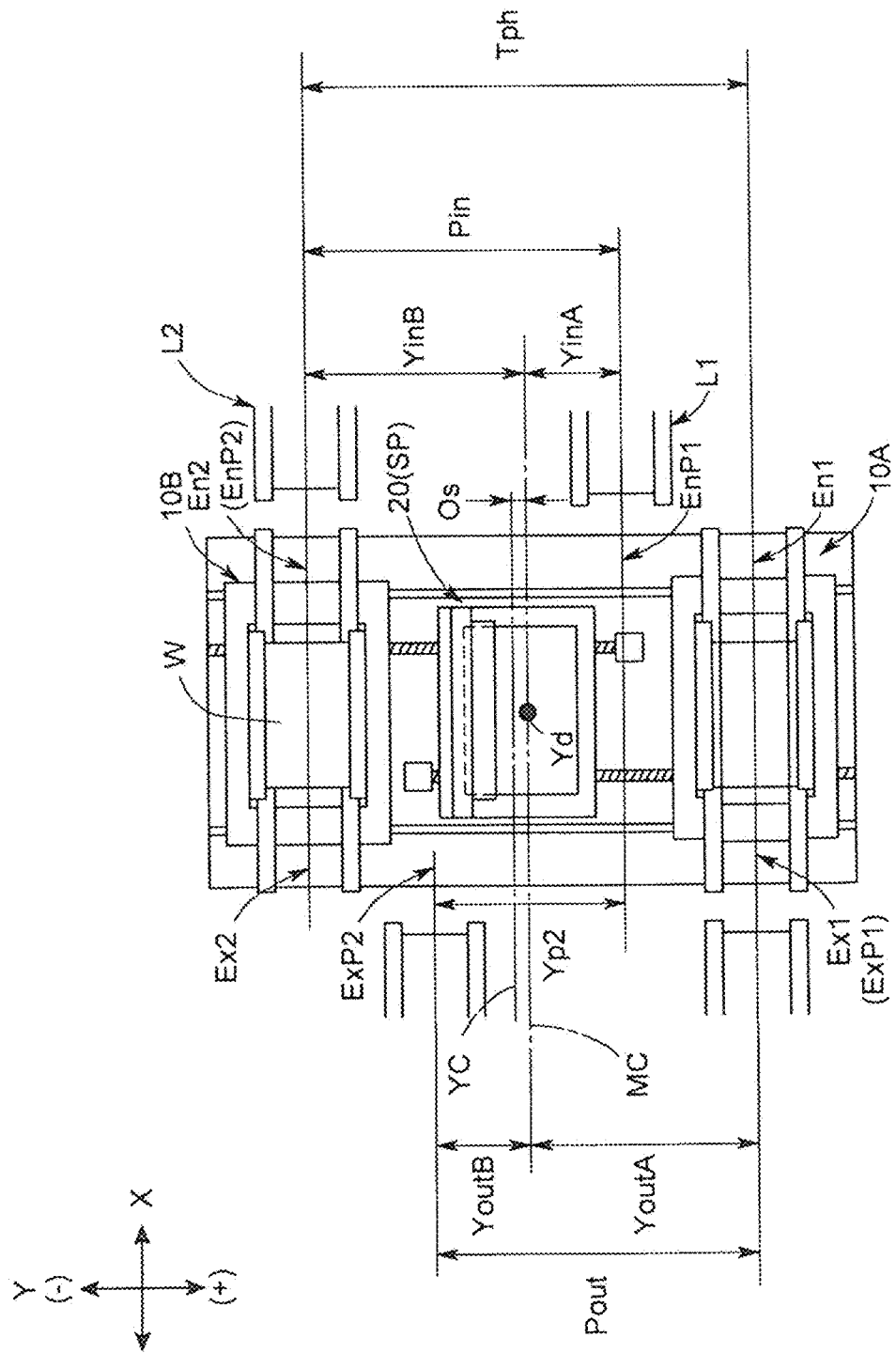
FIG. 15 is a schematic plan view showing still another exemplary layout/dimensional relationship of a screen printing machine to which an embodiment of the present disclosure is applicable.

Furthermore, as shown in FIG. 15, there may be cases where any one of (in the example shown, both) a combination of the carry-in positions EnP1 and EnP2 and a combination of the carry-out positions ExP1 and ExP2 is asymmetrically arranged with respect to the X-axis center line of the screen printing machine 1. In such a case, the A-side substrate supporting table 10A must stop for a carry-in operation of a substrate in a state of occupying a part of the common area. In addition, the B-side substrate supporting table 10B must stop for a carry-out operation in a state of occupying a part of the common area. Therefore, there may be cases where the other substrate supporting table 10B (10A) must stand by for entering the common area until the one substrate supporting table 10A (10B) exits from the common area.

In consideration thereof, in the present embodiment, as shown in FIG. 11, the operation items data table 605 and the interference management data table (mask movement management table) 606 are provided in order to resolve the need of a stand-by operation by setting a necessary shift SF for each operation item. Specifically, for example, data such as that shown in Table 1 below can be stored and adopted as control parameters.

TABLE 1

| OPERATION ITEM | FIG. 12 | FIG. 13 | FIG. 14 | FIG. 15A | FIG. 15B | UNIT [mm] OPERATION TIMING |
|---|---|---|---|---|---|---|
| SUBSTRATE CARRY-IN | 0 | 0 | 300 | 500 | 0 | BEFORE PRINTING |
| SUBSTRATE FIDUCIAL MARK RECOGNITION | 0 | 0 | 300 | 500 | 0 | BEFORE PRINTING |
| POST-PRINTING INSPECTION | 0 | 0 | 0 | 0 | 0 | AFTER PRINTING |
| SUBSTRATE CARRY-OUT | 0 | 300 | 0 | 0 | 800 | AFTER PRINTING |

Table 1 shows the necessary shift SF for each operation item that requires interference avoidance in machines respectively corresponding to FIGS. 12 to 15. Moreover, as for the mask cleaning operation, since the operation is executed within the print position SP, a control for moving or, in other words, shifting the print position may be performed so that the screen mask 206 approaches a stand-by position of a mask cleaning unit (not shown). However, in the present embodiment, the mask cleaning operation is exempted from a mask control object. In addition, in Table 1, with respect to FIG. 15 in which the substrate carry-in positions EnP1 and EnP2 are asymmetrically arranged, since interference modes differ between a case where a substrate W is carried in on the A side and a case where a substrate W is carried in on the B side, the A side and the B side are separately set. Such settings may be realized by adding branch numbers to part numbers corresponding to the layout in FIG. 15.

Next, a printing process of the screen printing machine 1 based on control by the control unit 60 will be described.

Figure 16:
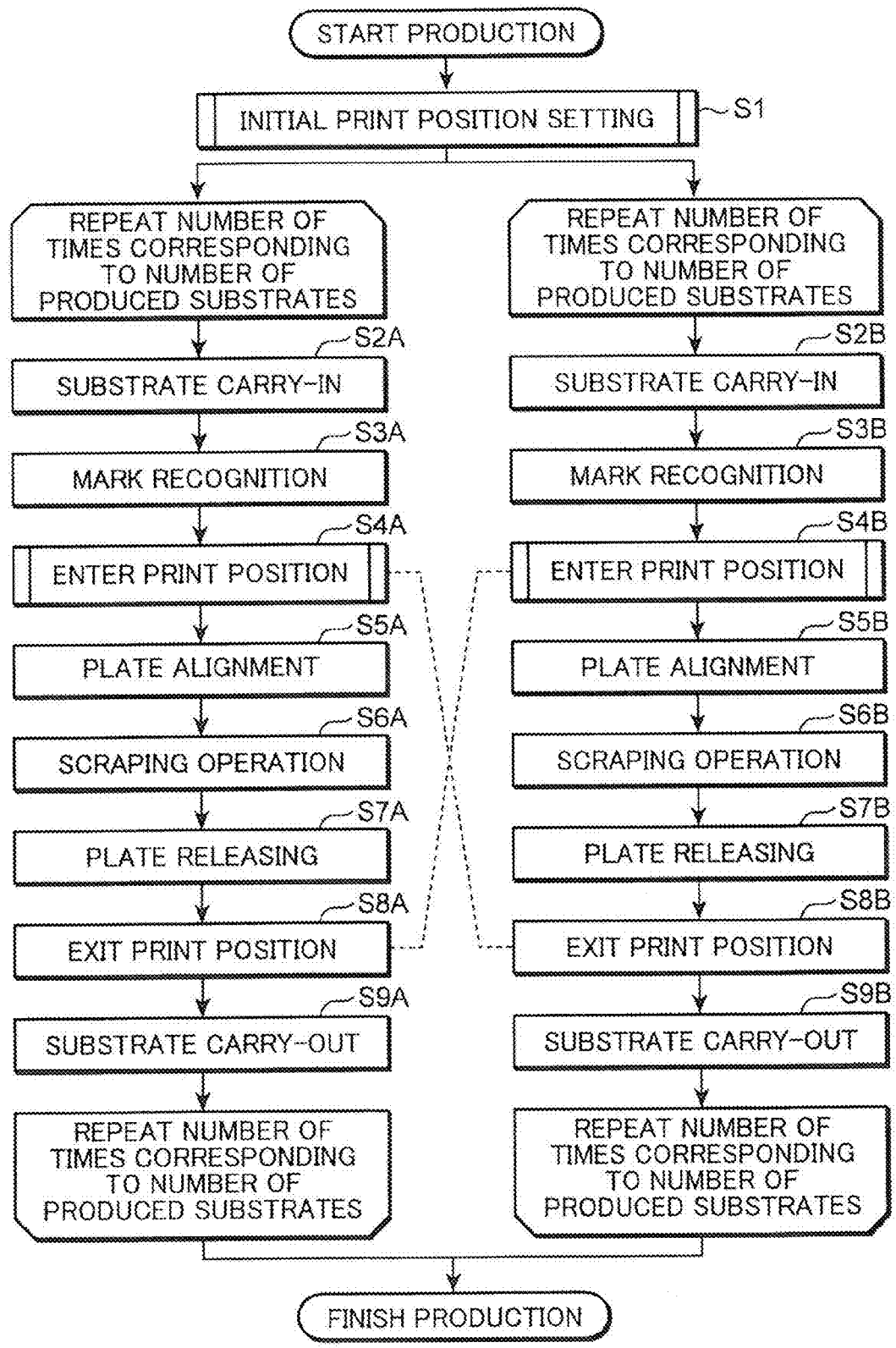
FIG. 16 is a flow chart according to a first exemplary embodiment.

Referring now to FIG. 16, the control unit 60 first executes an initial print position setting subroutine (step S1) and sets a suitable print position SP of the substrate supporting tables 10A and 10B for starting alternate printing on a substrate W. Next, the control unit 60 operates the first substrate supporting table 10A and the second substrate supporting table 10B in parallel. Regarding the first substrate supporting table 10A, the following operations are repetitively executed a number of times corresponding to the number of substrates to be produced: carry-in of substrate (step S2A); mark recognition for recognizing a fiducial mark (step S3A); an entry subroutine of the substrate supporting table 10A to the print position SP (step S4A); plate alignment (adjustment of an X-direction position of a substrate W by adjusting an X-direction position of the X table 141, adjustment of a Y-axis direction position of the substrate W by the motors 5A and 5B of the substrate supporting tables 10A and 10B, and an adjustment of an R-axis direction position of the screen mask 206 by adjusting an R-axis direction position of the main body of the screen mask holding mechanism with the rotation drive mechanism of the screen mask holding mechanism) (step S5A); a scraping operation for scraping off cream solder (step S6A); plate releasing (step S7A); an exit operation of the substrate supporting table 10A from the print position SP (step S8A); and a carry-out operation for carrying out the printed substrate W after exit (step S9A). Regarding the second substrate supporting table 10B, carry-in of substrate (step S2B) is started at a predetermined timing that is delayed from the start of carry-in of substrate (step S2A) by the first substrate supporting table 10A in order to ensure that a print position entry subroutine (step S4B) can be performed in parallel while the first substrate supporting table 10A is performing an exit operation (step S8A), and the following operations are sequentially performed and repetitively executed a number of times corresponding to the number of substrates to be produced: mark recognition (step S3B); an entry subroutine (step S4B); plate alignment (step S5B); a scraping operation (step S6B); plate releasing (step S7B); an exit operation (step S8B); and a carry-out operation (step S9B). In addition, during the exit operation (step S8A) of the second substrate supporting table 10B, the print position entry subroutine (step S4A) is performed in parallel at the first substrate supporting table 10A. Among the respective steps, steps from the entry subroutine (steps S4A and S4B) to the exit operation (steps S8A and S8B) constitute a narrowly-defined printing process. Furthermore, although not shown in FIG. 16, a cleaning operation for removing excess cream solder adhered to a lower surface of the screen mask 206 is executed when necessary before or after the narrowly-defined printing process.

Next, the initial print position setting subroutine S1 (FIG. 17) in FIG. 16 will be described with reference to FIGS. 17 and 12 to 15.

First, the control unit 60 obtains a relevant table movable pitch Tph from the printing machine data table 604 (step S11) and computes an appropriate location on the X axis passing through a center of the table movable pitch Tph as a center coordinate Yd of the print position SP (step S12).

Next, the control unit 60 moves into a mask movement process. The mask movement process is a process for resolving the need of a stand-by operation such as described below.

For example, when the screen printing machine 1 corresponds to the mode shown in FIG. 13, since a carry-in side is wide, even if the center coordinate Yd of the print position SP is set as the common area, one substrate supporting table 10A(10B) is capable of executing parallel operations of substrate carry-in and mark recognition without interfering with the other substrate supporting table 10B(10A) that is executing a printing process in the common area. However, since the one substrate supporting table 10B(10A) must still perform substrate carry-out while occupying a part of the common area even after finishing the printing process in the common area, there may be cases where the other substrate supporting table 10B(10A) that has finished the operations of substrate carry-in and mark recognition must perform a stand-by operation when entering the print position SP in order to avoid interference with the one substrate supporting table 10A(10B) that has transitioned to a carry-out process.

In addition, when the screen printing machine 1 corresponds to the mode shown in FIG. 14 or the mode shown in FIG. 15A in Table 1 (i.e., the A side of FIG. 15), the common area must be entered to perform a substrate carry-in process. Therefore, when the other substrate supporting table 10B (10A) exists in the common area, even if substrate carry-out is finished, the one substrate supporting table 10A (10B) must still perform stand-by operations for substrate carry-in and mark recognition in order to avoid interference with the other substrate supporting table 10B (10A).

In consideration thereof, in the present embodiment, the operation item data table 605 and the interference management data table 606 are used to execute mask movement control in order to resolve the need of a stand-by operation such as those described above.

Specifically, the control unit 60 references the operation item data table 605 and the interference management data table 606 and searches for a maximum value SFmax of the necessary shift SF from operation items that are executed prior to printing by the substrate supporting table 10B (10A) (step S13).

Next, in order to preserve the maximum value SFmax from the result detected in step S103, the control unit 60 moves the main body 202 by rotating both Y-axis servo motors 303 of the print executing section driving mechanism 300 in a same direction and shifts the center coordinate Yd of the print position SP in the Y-axis direction (step S14).

As a result, in the case of the example shown in Table 1, an initially set Yd becomes center of the print position SP when the screen printing machine 1 corresponds to the mode shown in FIG. 13. On the other hand, when the screen printing machine 1 corresponds to the mode shown in FIG. 14 or the mode shown in FIG. 15A in Table 1, the center coordinate Yd of the print position SP is shifted by a dimension necessary for preserving the maximum value SFmax with respect to the substrate supporting table 10A (10B) that is to move into a printing process. Accordingly, as will be described later, extremely efficient alternate printing can be realized.

Next, when the subroutine is going to entry the print position (FIG. 18) in FIG. 16 will be described with reference to FIGS. 18 to 20.

First, upon finish of the mark recognition operation (step S3A (S3B)) of one substrate supporting table 10A (10B), the control unit 60 judges whether or not the other substrate supporting table 10B (10A) is performing a print operation (step S401). If printing is in progress, the control unit 60 searches for a maximum value SFmax of the necessary shift SF from a row of operation items that is executed by the other substrate supporting table after printing (step S402). This is a process for avoiding any interruptions to post-printing processes of the substrate supporting table 10B (10A) that has finished printing which may occur depending on a stand-by position of the substrate supporting table 10A (10B) that is standing by for printing.

The control unit 60 sets a proximity distance based on a search result of step S402 (step S403). In step S403, when the maximum value SFmax of the necessary shift SF is 0, the entry-side substrate supporting table 10A can approach the substrate supporting table 10B performing printing up to the interference limit Li. On the other hand, when the maximum value SFmax of the necessary shift SF is greater than 0, an approachable distance takes a value separated from the substrate supporting table 10B (10A) performing printing by the maximum value SFmax.

Next, the control unit 60 approaches the substrate supporting table 10B (10A) at the print position up to a position separated by the set proximity distance (step S405). In this state, a stand-by is performed until the printing process finishes (step S406). Upon finish of the printing process or when the printing process had already been finished in step S401, the control unit 60 moves into a process for judging whether or not to change the current print position. Specifically, the control unit 60 references the operation item data table 605 and the mask movement management data table 606 and searches for a maximum value SFmax of the necessary shift SF from a row of operation items that are executed prior to printing by the other substrate supporting table (step S407). Next, based on a search result, the control unit 60 corrects the print position SP so as to preserve the maximum value SFmax (step S408). As a result, when it is necessary for the substrate supporting table 10B (10A) exiting the print position SP to operate in the common area, the print position is changed in a direction separating from the substrate supporting table 10B (10A) exiting the print position SP in accordance with the maximum value SFmax of the necessary shift SF. Accordingly, parallel operations of the substrate supporting table 10A (10B) that moves into a printing process and the substrate supporting table 10B (10A) that has finished a printing process can be executed while avoiding interference between the substrate supporting tables and alternate printing can be continued without any waiting time.

Figure 19:
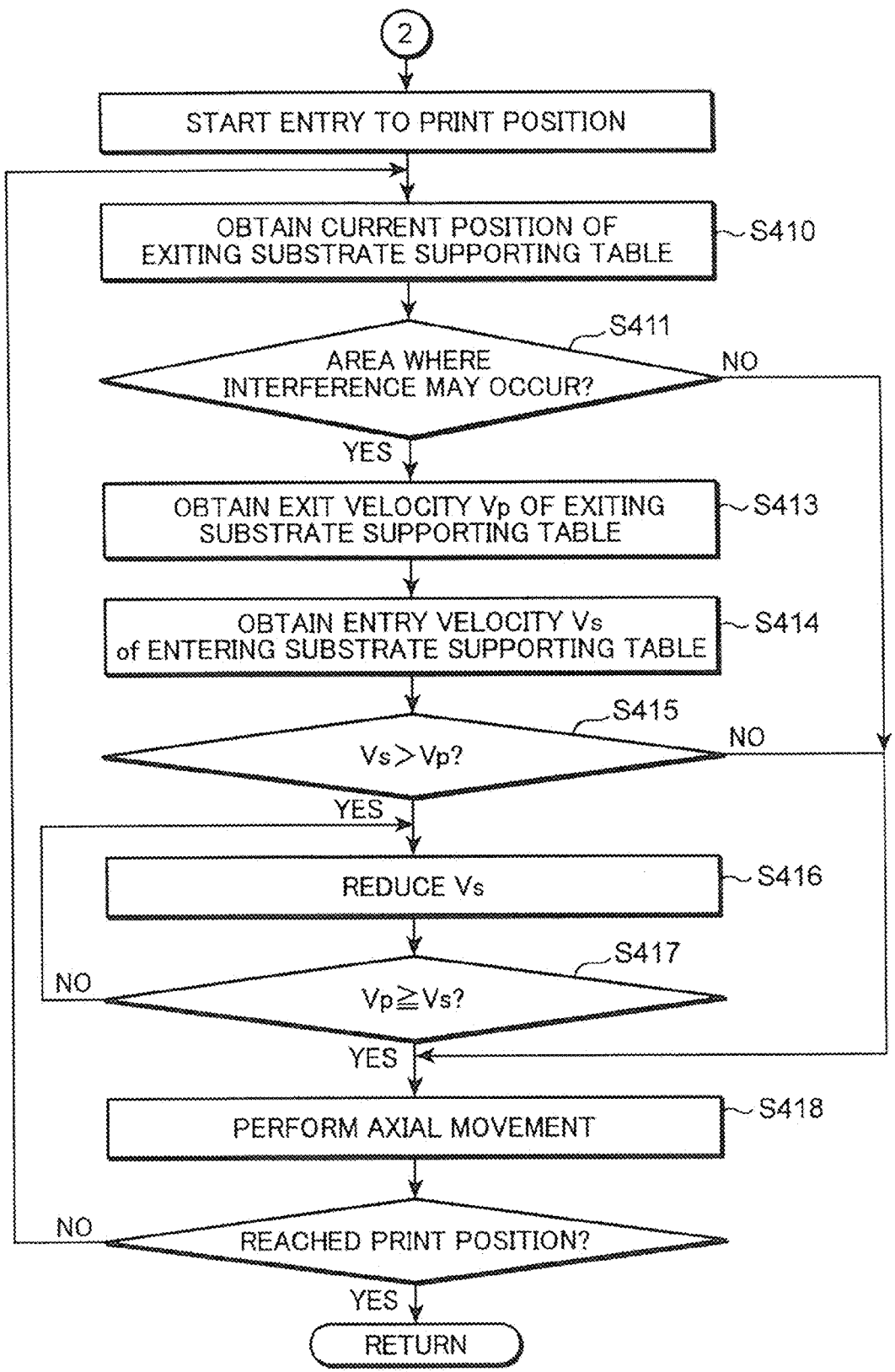
FIG. 19 is a flow chart showing a continuation of the print position entry subroutine shown in FIG. 18.

Referring now to FIG. 19, the entering substrate supporting table 10A (10B) repeats the operations of step S410 to S418 until reaching the print position. Specifically, the control unit 60 first obtains a current position of the exiting substrate supporting table 10A (10B) (step S410), and judges whether or not the substrate supporting table 10A (10B) is in an area where interference may occur (step S411). The "area where interference may occur" is a region that is dynamically set based on a movement velocity difference and an opposing interval between both the substrate supporting tables 10A and 10B among a region that occupies the print position SP. A calculation formula or a map for determining an "area where interference may occur" is stored in advance in the data storage section 63 of the control unit 60.

If the exiting substrate supporting table 10A (10B) is in an area where interference may occur, the control unit 60 further obtains an exit velocity Vp of the exiting substrate supporting table 10A (10B) and an entry velocity Vs of the entering substrate supporting table 10B (10A) (steps S413 and S414), and compares the velocities (step S415). If the entry velocity Vs is higher than the exit velocity Vp, the control unit 60 judges that interference avoidance is necessary (step S416), and if the entry velocity Vs is equal to or lower than the exit velocity Vp, the control unit 60 also judges that interference avoidance is unnecessary (step S417). In addition, when it is judged in S411 that the exiting substrate supporting table 10A (10B) is not within an area where interference may occur, the control unit 60 judges that interference avoidance is unnecessary (step S417). Subsequently, the entering substrate supporting table 10A (10B) continues axial movement at the entry velocity Vs (step S418) and reaches the print position. That has finished the processes above, the control unit 60 returns to the main flow shown in FIG. 16.

Referring now to FIG. 20, for example, when the control described above is executed on the screen printing machine 1 in the mode shown in FIG. 12, since the substrate supporting table 10B standing by for a next printing operation has approached the substrate supporting table 10A performing printing in a state where the substrate supporting tables are separated by the interference limit Li as shown in FIG. 20A, the substrate supporting table 10B is able to move into the print position SP in an extremely short period of time and execute a print process of a next substrate type after the finish of the print process of the substrate supporting table 10A as shown in FIG. 21. In other words, a conveyor width of the conveyor pair 12B of the substrate supporting table 10B shown in FIG. 21 is changed after finish of initial carry-out and, in association therewith, the substrate carry-in position EnP2 is varied and a print position is changed. The conveyor width of the conveyor pair 12A of the substrate supporting table 10A is changed after a first carry out in the diagram.

Moreover, a substrate type refers to a substrate specification type managed by each substrate part number.

Figure 17:
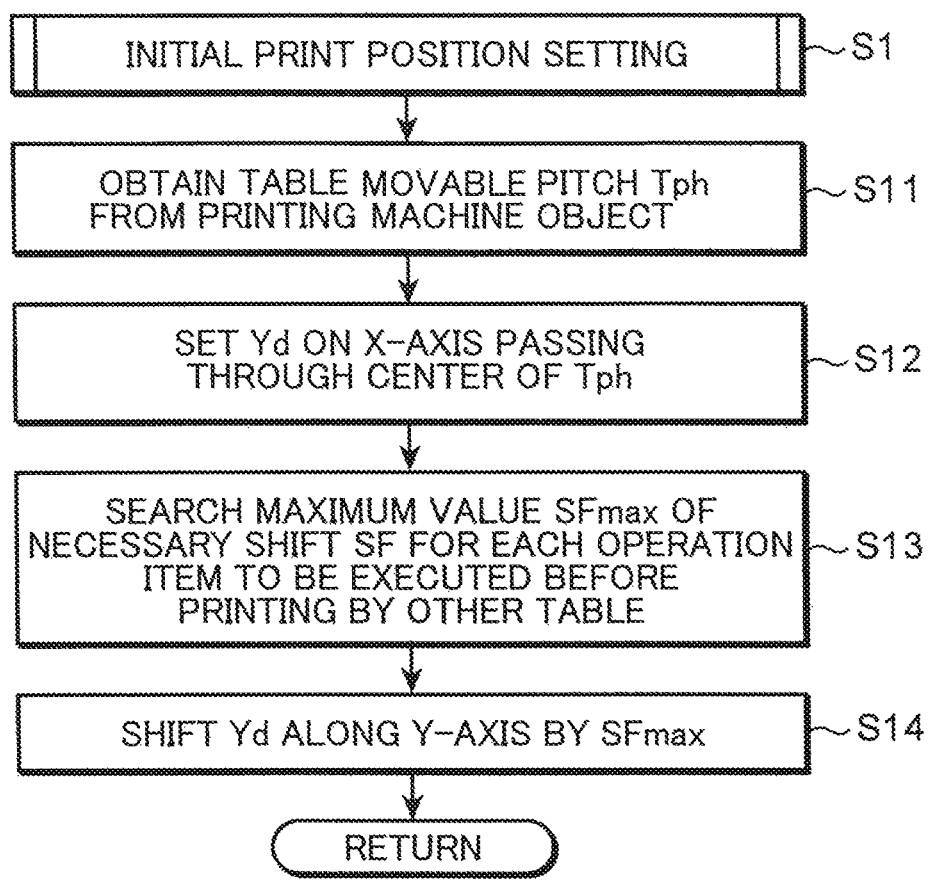
FIG. 17 is a flow chart showing an initial print position setting subroutine in the flow chart according to the first embodiment shown in FIG. 16.

Furthermore, referring now to FIG. 22, for example, when the screen printing machine 1 is in the mode shown in FIG. 13, due to the flow shown in FIG. 17, the initial print position SP is set at center of the screen printing machine 1. By executing steps S401 to S405 of FIG. 18 in this state, the substrate supporting table 10B standing by for a next printing process approaches the substrate supporting table 10A performing printing up to a state where the substrate supporting tables are separated by the interference limit Li. Therefore, in a similar manner to the cases shown in FIGS. 20 and 21, a transition from the state shown in FIG. 22A to a next printing process takes place smoothly.

Figure 18:
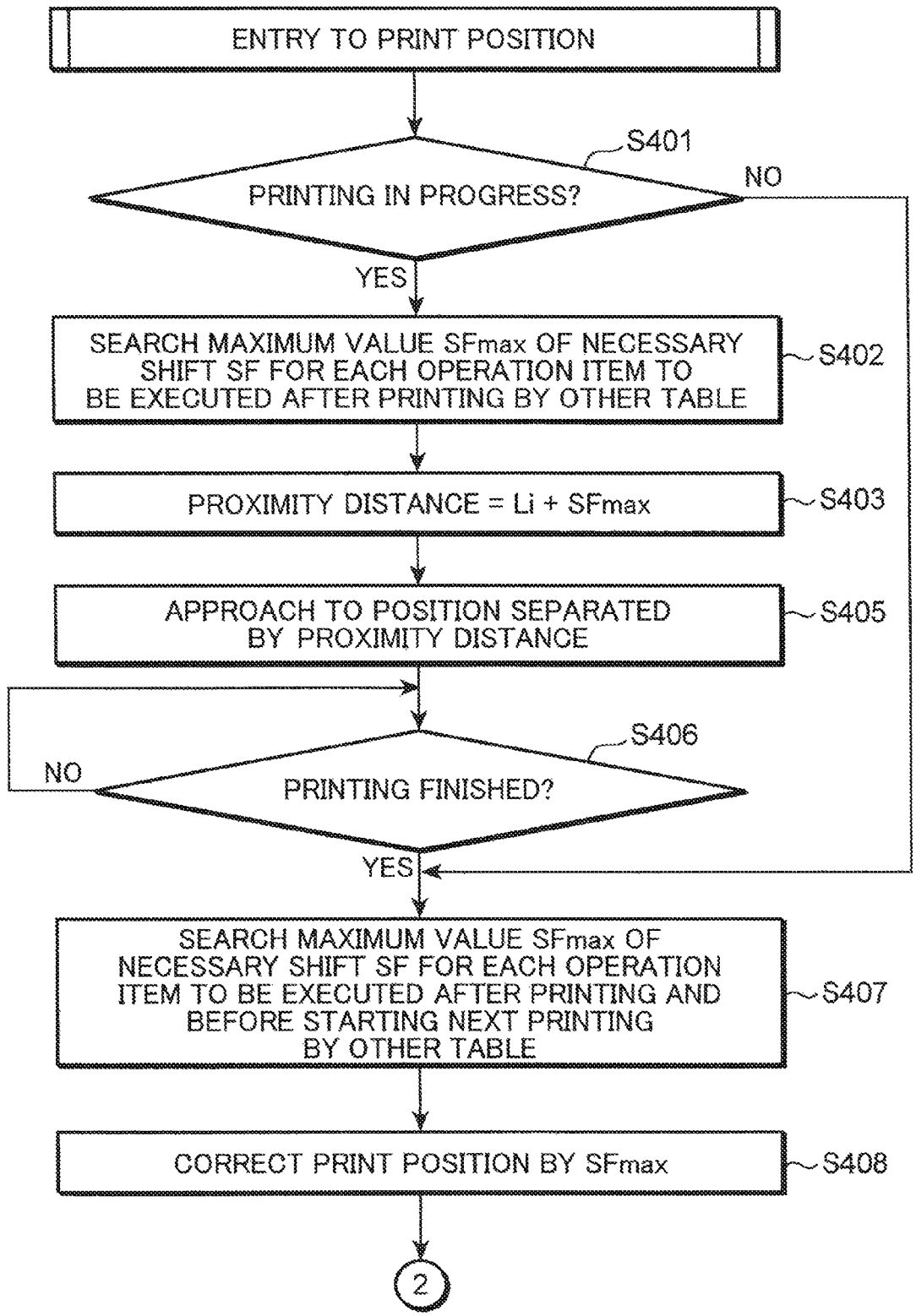
FIG. 18 is a flow chart showing a print position entry subroutine in the flow chart shown in FIG. 16.
Figure 22A:
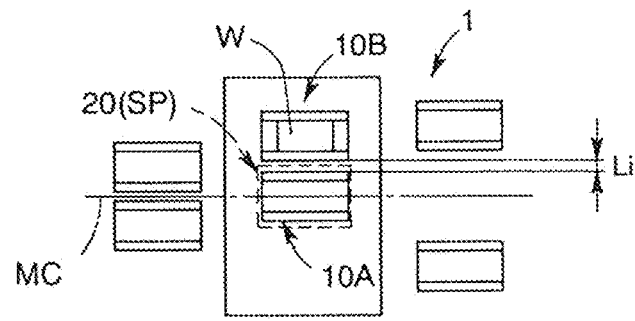
FIGS. 22A to 22D are schematic plan views showing an operation in a case where the first embodiment is executed with the screen printing machine in a mode shown in FIG. 13.
Figure 22B:
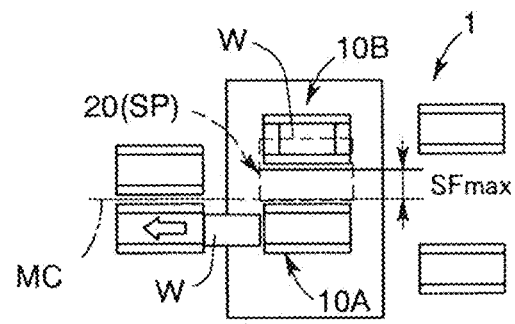

Next, since steps S407 and S408 shown in FIG. 18 are executed during the transition from the state shown in FIG. 22A to a next printing process, the print position SP is changed from a position shown in FIG. 22A to a position shifted toward the B side by the maximum value SFmax of the necessary shift SF as shown in FIG. 22B. As a result, even if a carry-out process or the like of the A-side substrate supporting table 10A that has finished printing and a printing process of the B-side substrate supporting table 10B are executed in parallel, the substrate supporting tables 10A and 10B do not interfere with each other.

Figure 22C:
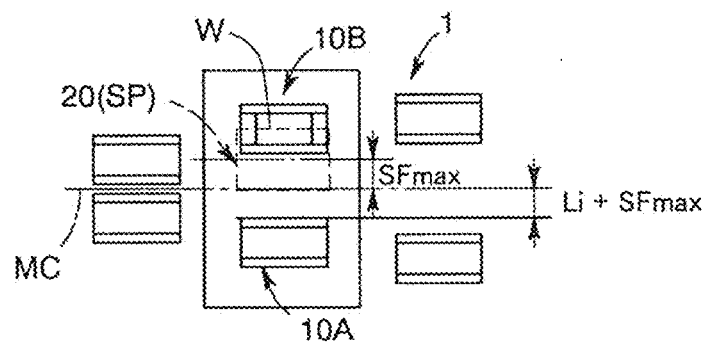

Moreover, referring now to FIG. 22C, the A-side substrate supporting table 10A that has finished carrying out a substrate W returns to a position where the belt conveyor pair 12A faces the substrate carry-in position EnP1 and executes a carry-in operation of a next substrate W. Subsequently, since a move into an entry operation is made once again, the control unit 60 once again executes the flow chart shown in FIG. 18.

Figure 22D:
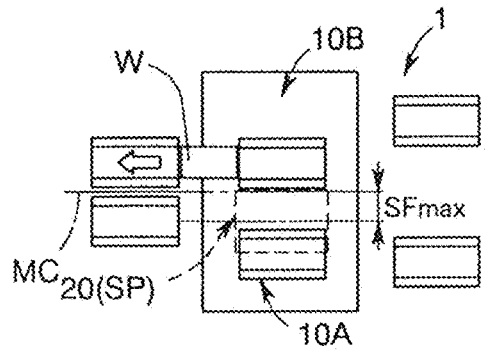

Due to step S402 being executed by the control, the necessary shift SF during substrate carry-out is detected as the maximum value SFmax. As a result, since a proximity distance is set by the computation in step S403 to a distance where the detected maximum value is preserved, as shown in FIG. 22C, the substrate supporting table 10A having transitioned to an entry operation stands by at a position separated by a predetermined interval (Li+SFmax) from the substrate supporting table 10B performing printing. Accordingly, since a carry-out operation can be executed in the common area even after the B-side substrate supporting table 10B has finished a printing process, a substrate W after printing can be carried out without having to provide any stand-by time. Meanwhile, as shown in FIG. 22D, since the print position SP once again shifts to the A side by processes of step S407 and thereafter in FIG. 18, not only can the A-side substrate supporting table 10A also smoothly move into a printing process but a period of time needed to move to the print position SP can be reduced.

Figure 23A:
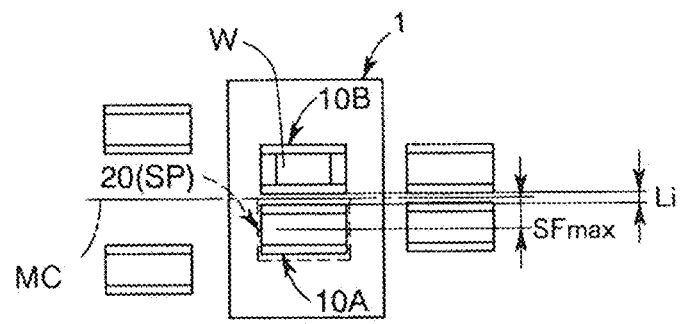
FIGS. 23A to 23D are schematic plan views showing an operation in a case where the first embodiment is executed with the screen printing machine in a mode shown in FIG. 14.
Figure 23B:
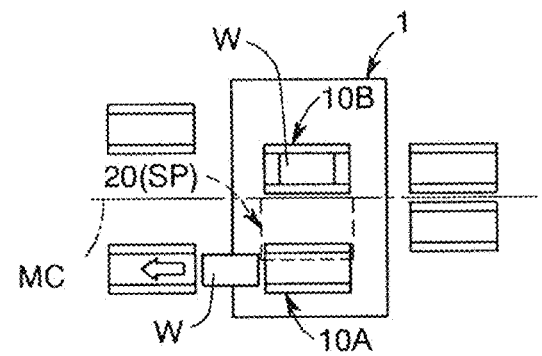

In addition, in a case of a mode where the carry-in side Y-axis pitch Pin is shorter than the carry-out side Y-axis pitch Pout as shown in FIG. 14, by executing steps S101 to S104 in FIG. 17, the initial print position SP shifts toward the substrate supporting table 10A starting printing by SFmax from the center coordinate Yd of the table movable pitch Tph as shown in FIG. 23A. As a result, the B-side substrate supporting table 10B can enter the common area and execute carry-in of a substrate W in parallel to a printing operation of the A-side substrate supporting table 10A and, as shown in FIG. 23B, the A-side substrate supporting table 10A that has finished printing can also immediately carry out a substrate W without having to perform a stand-by operation.

Figure 23C:
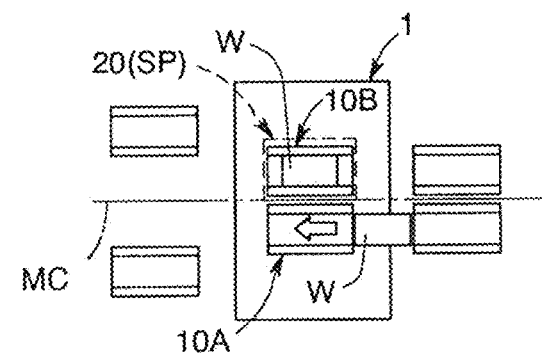
Figure 23D:
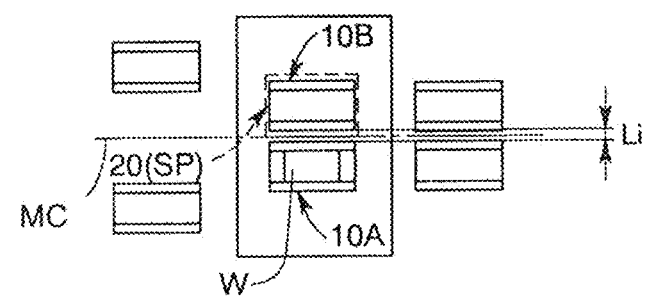

Furthermore, after a printing process is finished, by executing steps S407 and S408 in FIG. 18, the print position SP shifts to the B side as shown in FIG. 23C. As a result, as shown in FIG. 23D, not only can the A-side substrate supporting table 10A immediately enter a common area and move into a carry-in operation of a substrate W, but can a time period required for an entry operation of the B-side substrate supporting table 10B is reduced as much as practicable.

Figure 24A:
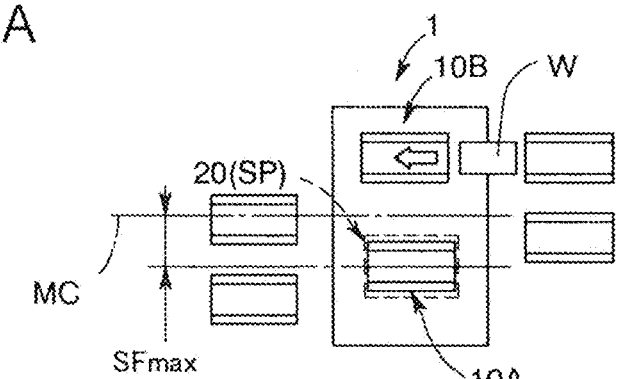
FIGS. 24A to 24D are schematic plan views showing an operation in a case where the first embodiment is executed with the screen printing machine in a mode shown in FIG. 15.
Figure 24B:
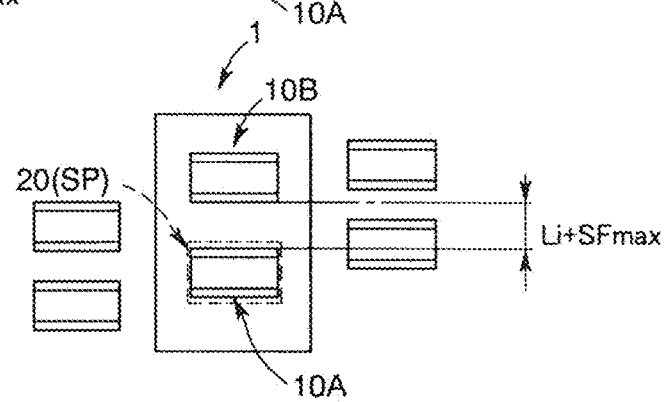

In addition, in a case of a mode where the carry-in side and the carry-out side are asymmetrical as shown in FIG. 15, by executing steps S101 to S104 in FIG. 17, the initial print position SP shifts toward the substrate supporting table 10A starting printing by SFmax from the center coordinate Yd of the print position SP as shown in FIG. 24A. As a result, the B-side substrate supporting table 10B can enter the common area and execute carry-in of a substrate W in parallel to a printing operation of the A-side substrate supporting table 10A.

Figure 24C:
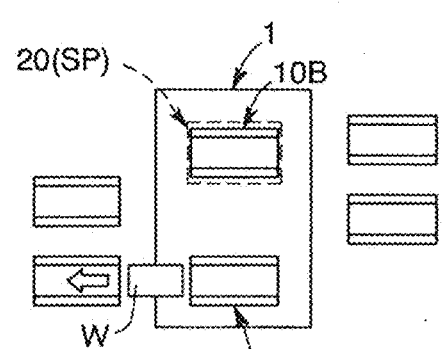
Figure 24D:
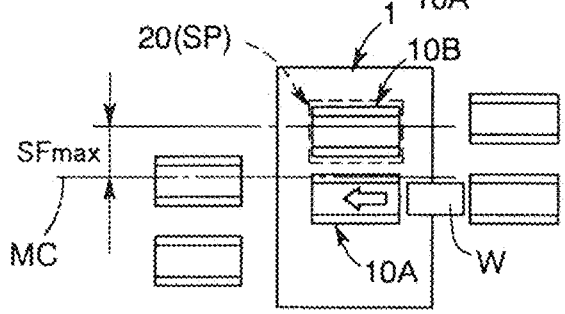

Next, in this mode, by executing steps S402 to S405 in FIG. 18, the B-side substrate supporting table 10B stands by at a position which opposes the A-side substrate supporting table 10A by an interval that is a sum of the interference limit Li and the necessary shift SF. As a result, not only can the substrate supporting table 10A that has finished printing immediately carry out a substrate W after finishing printing as shown in FIG. 24C, but substrate supporting table 10A can also immediately enter the common area and move into a carry-in operation of a next substrate W as shown in FIG. 24D.

In the series of operations described above, when the print executing section 20 is moved in the Y-axis direction, the control unit 60 controls the Y-axis servo motor 303 and reciprocates the print executing section 20 in the Y-axis direction toward the A side and the B side. In doing so, the control unit 60 references a mask offset Os from the print executing section data table 602, offsets a stop position of the print executing section 20 by the mask offset Os from the center coordinate Yd of the print position SP, and controls a movement distance so that an X-axis center line MC of the screen mask 206 adopted by the print executing section 20 becomes consistent with the center coordinate Yd (refer to FIGS. 12 to 15). As a result, when alternately moving the substrate supporting tables 10A and 10B to a predetermined print position SP, a load is divided equally. In particular, as shown in FIGS. 1 and 12, when the print position SP is set to center of the table movable pitch Tph and there is hardly any need for moving the print position SP, load distribution becomes particularly equal. Obviously, by conforming a center coordinate of the screen mask 206 which takes the mask offset Os into consideration to the center coordinate Yd of the print position SP, computation becomes easier and elaborate control can be realized even in an overlaying process of a substrate W and the screen mask 206.

In addition, the substrate carry-in positions EnP1 and EnP2 and the substrate carry-out positions ExP1 and ExP2 described above may be changed as appropriate due to, for example, changes in specifications of the conveyor pairs 12A and 12B. However, in such a case, any instance among the table movable pitch Tph, the carry-in side Y-axis pitch Pin, the carry-out side Y-axis pitch Pout, and the like of the printing machine data table 604 is also changed. Therefore, since the control unit 60 is capable of appropriately changing the center coordinate Yd of the print position SP which is a derived attribute of the above in correspondence with changes in specifications, a suitable print position SP can be derived in a case where embodiments according to the present disclosure are implemented using facilities whose specifications are frequently changed.

As described above, according to the present embodiment, a screen printing machine 1 comprises: a pair of substrate supporting tables 10A and 10B each of which is provided for holding a substrate W that is a print object, the substrate supporting tables 10A and 10B are juxtaposed in a Y-axis direction that is perpendicular to a conveying direction of the substrate W; a print executing section 20 which performs a printing process alternately on the substrate W held by the pair of substrate supporting tables 10A and 10B; a print executing section driving mechanism 300 that drives the print executing section 20 in the Y-axis direction; and a control unit 60 for setting a print position SP within a range where one substrate supporting table 10A (10B) and the other substrate supporting table 10B (10A) oppose each other in the Y-axis direction by controlling a drive of the print executing section driving mechanism 300. Therefore, according to the present embodiment, since one print executing section 20 is shared by a pair of substrate supporting tables 10A and 10B so that the screen printing can be alternately performed, redundancy of the print executing section 20 can be avoided. Therefore, in cases where substrates W of the same type are consecutively manufactured by both the substrate supporting tables 10A and 10B, a single screen mask 206 can be shared and a cost for the screen mask 206 can be cut in half. In addition, since a single screen mask 206 can be shared, solder necessary for preparation is kept to a necessary and sufficient amount. Therefore, cost reduction can also be achieved in post-production treatment (disposal, storage, and the like) of solder. Furthermore, since a print position SP of a print executing section 20 can be changed in the Y-axis direction and the substrate supporting tables 10A and 10B share the same print executing section 20, redundancy of the print executing section 20 can be eliminated, a space for arranging the print executing section 20 can be kept compact, and the screen printing machine 1 itself as well as accompanying conveyors can be downsized. Moreover, when setting a print position SP, the print executing section 20 can be moved in the Y-axis direction and the print position can be changed to an arbitrary location between the one substrate supporting table 10A (10B) and the other substrate supporting table 10B (10A). Therefore, a suitable print position SP can be dynamically set according to an operational status of each of the substrate supporting tables 10A and 10B and modes of a layout of substrate carry-in sections En1 and En2 and substrate carry-out sections Ex1 and Ex2 configured on the respective substrate supporting tables 10A and 10B.

In addition, in the present embodiment, a substrate supporting table driving mechanism (motors 5A and 5B, and the like) that individually drives the pair of substrate supporting tables 10A and 10B in the Y-axis direction, and a control unit 60 for controlling the substrate supporting table driving mechanism are further provided. Therefore, in the present embodiment, the print position SP can be set by moving the print executing section 20, and the print position SP can also be changed by moving the substrate supporting tables 10A and 10B in the Y-axis direction. Consequently, efficiency of printing processes can be further improved. Furthermore, the substrate supporting tables 10A and 10B can be moved in the Y-axis direction. Consequently, a carry-in position where a substrate W is carried into the substrate supporting tables 10A and 10B and a carry-out position where a substrate W is carried out from the substrate supporting tables 10A and 10B can be modified according to modes of a production line and versatility of the screen printing machine 1 itself can also be enhanced.

In addition, in the present embodiment, a common area is set, where both the substrate supporting tables 10A and 10B are movable in the Y-axis direction. Therefore, in the present embodiment, by setting the common area, the screen printing machine 1 can be compactified in the Y-axis direction. Furthermore, the print position SP can be set in the common area. Consequently, movement ranges (movement times) of the respective substrate supporting tables 10A and 10B and the print executing section 20 can be reduced to improve efficiency of alternate printing.

In addition, in the present embodiment, the control unit 60 sets the print position SP based on the table movable pitch Tph that is defined as a range in which any one of the pair of substrate supporting tables 10A and 10B is movable in the Y-axis direction. Therefore, in the present embodiment, the print position SP is set in the table movable pitch Tph within which any one of the pair of substrate supporting tables 10A and 10B is movable. Consequently, in a case where the common area is set, it is possible to set the print position SP in the common area in order to reduce the movement ranges (movement times) of the respective substrate supporting tables 10A and 10B and the print executing section 20, and to improve efficiency of alternate printing. Meanwhile, it is possible to set the print position SP to an arbitrary position within the table movable pitch Tph including areas outside the common area in order to prevent the substrate supporting tables 10A and 10B from interfering with each other. Accordingly, since the efficiency of alternate printing can be improved with a compact configuration, a suitable position can be set as the print position SP according to an operational status or set conditions of the respective substrate supporting tables 10A and 10B to further improve efficiency.

Furthermore, in the present embodiment, it is further provided with an operation items data table 605 as operation item storage means for storing operation items that should be managed for avoiding interference of the respective substrate supporting tables 10A and 10B during operations from carry-in of a substrate W as a print object to carry-out after printing, and an interference management data table 606 as necessary shift storage means for storing a necessary shift SF for avoiding interference with the other substrate supporting table 10A or 10B for each operation item, and the control unit 60 sets the print position SP at a position where the necessary shift SF is preserved from a center position of the table movable pitch Tph along the Y direction. Therefore, in the present embodiment, the necessary shift SF is set for each of various operations that are required from carry-in of a substrate W to the screen printing machine 1 to carry-out of the printed substrate W and a suitable print position SP is set based on the necessary shift SF. Consequently, when alternately performing screen printing on the substrate W supported by the pair of substrate supporting tables 10A and 10B with the same print executing section 20, interference is less likely to occur during a parallel operation of the substrate supporting tables 10A and 10B and efficiency of the parallel operation is improved.

In addition, in the present embodiment, the control unit 60 controls the substrate supporting table driving mechanism (the motors 5A and 5B and the like) so that, after carrying out a printed substrate W and before making a move into a next printing process, the substrate supporting table 10A or 10B that has exited the print position SP approaches the other substrate supporting table 10A or 10B at the print position SP up to a predetermined position where the necessary shift SF has been preserved. Therefore, in the present embodiment, in a case where alternately repeating the printing process, a substrate supporting table 10A or 10B that is standing by among the pair of substrate supporting tables 10A and 10B starts its entry to the print position SP once a substrate supporting table 10A or 10B at the print position SP completes a printing process and starts its exit from the print position SP. Consequently, a switching operation between the substrate supporting tables 10A and 10B may be accelerated as much as practicable and processing efficiency may be improved. Moreover, the necessary shift SF is preserved when the substrate supporting table 10A or 10B standing by approaches the substrate supporting table 10A or 10B performing printing. Consequently, even when an operation of carrying out a printed substrate W by the substrate supporting plate that has finished a printing process and an operation of moving into a printing process by the substrate supporting table 10A or 10B that had been standing by are executed in parallel, the substrate supporting tables 10A and 10B do not interfere with each other. Therefore, alternate printing can be executed with greater efficiency.

Furthermore, in the present embodiment, the control unit 60 controls the substrate supporting table driving mechanism (the motors 5A and 5B and the like) so that, upon start of exit from the print position SP of the substrate supporting table 10A or 10B at the print position SP among the pair of substrate supporting tables 10A and 10B, the other substrate supporting table 10A or 10B starts entry to the print position SP. Therefore, in the present embodiment, in a case where alternately repeating the printing process, the substrate supporting table 10A or 10B that is standing by among the pair of substrate supporting tables 10A and 10B starts its entry to the print position SP once a substrate supporting table 10A or 10B at the print position SP completes a printing process and starts its exit from the print position SP. Consequently, a switching operation between the substrate supporting tables 10A and 10B may be accelerated as much as practicable and processing efficiency may be improved.

In addition, in the present embodiment, the control unit 60 controls the substrate supporting table driving mechanism (motors 5A and 5B or the like) so that, after carrying out a printed substrate W and before moving into a next printing process, the substrate supporting table 10A (10B) that has exited the print position SP approaches the other substrate supporting table 10B (10A) located at the print position SP, up to an interference limit Li set in advance. Therefore, in the present embodiment, the substrate supporting table 10A or 10B that has exited the print position SP approaches the other substrate supporting table 10A or 10B after the exit. Consequently, a period of time until completion of entry when the substrate supporting table 10A or 10B once again enters the print position SP in a next printing process can be reduced as much as practicable. As a result, a total processing time can be further reduced and processing efficiency can be improved.

In addition, in the present embodiment, the control unit 60 sets the print position SP at a position where a movement distance of one substrate supporting table 10A or 10B and a movement distance of the other substrate supporting table 10A or 10B are equally divided with respect to a center line MC of the screen mask 206 provided at the print executing section 20. Therefore, in the present embodiment, a load of movement is equally divided when alternately moving the substrate supporting tables 10A and 10B to a predetermined print position SP. Consequently, entry and exit to/from the print position SP can be repeated at a same timing under a same operational status. As a result, a time lag is less likely to occur between a printing process of one substrate supporting table 10A or 10B and a printing process of the other substrate supporting table 10A or 10B and alternate printing can be repeated more efficiently.

Next, a second exemplary embodiment will be described.

Figure 25:
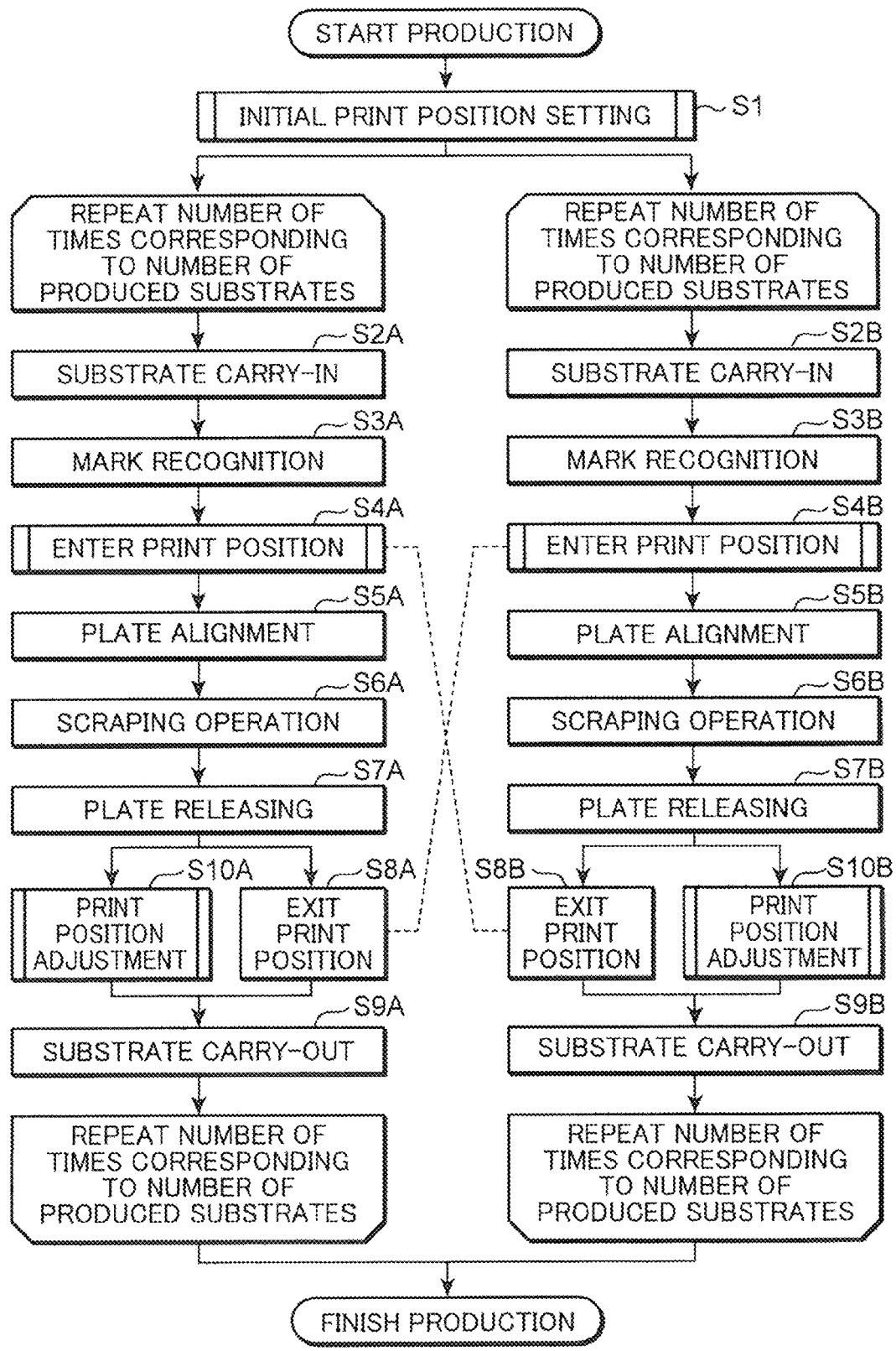
FIG. 25 is a flow chart showing an initial print position setting subroutine according to a second exemplary embodiment.

Referring now to FIG. 25, in the second embodiment, a print position adjustment subroutine S10A (S10B) is provided after the process of plate releasing 7A (7B).

Figure 26:
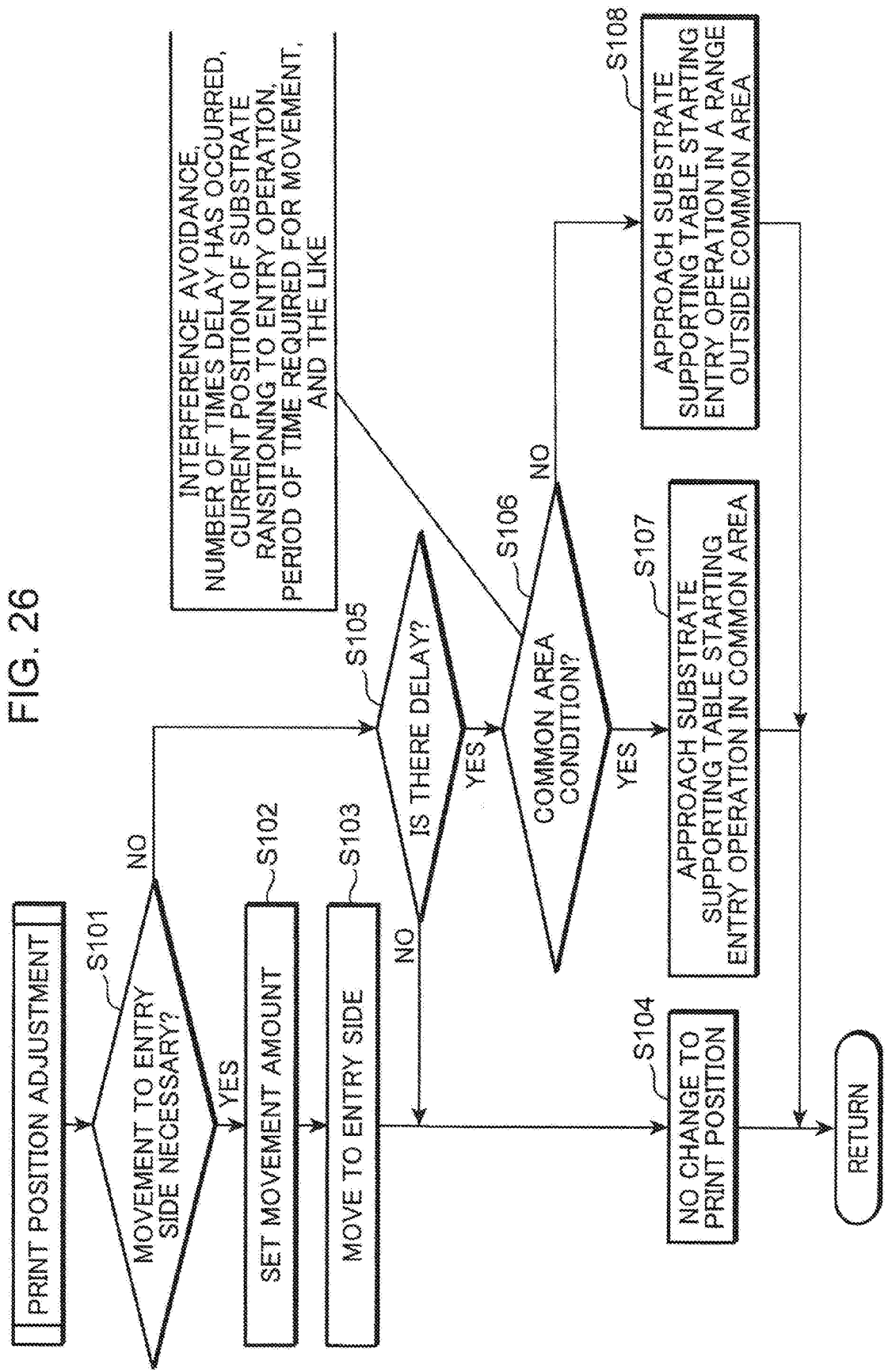
FIG. 26 is a flow chart showing a position adjustment subroutine in the flow chart shown in FIG. 25.

Referring now to FIG. 26, depending on a mode of a production line in which the screen printing machine 1 is installed, when a supply delay of a substrate W occurs in an upstream machine of the screen printing machine 1 during alternate printing or when mounting times fluctuate in a downstream machine of the screen printing machine 1 during alternate printing, a carry-in delay or a carry-out delay of the substrate W to/from the substrate supporting table 10A or 10B may occur and cause a carry-in delay or the like at the other substrate supporting table 10B (10A) subsequent to a next printing process of one substrate supporting table 10A (10B) and may create waiting time. In such a case, the print executing section 20 preferably approaches and meets the substrate supporting table 10B (10A) at which the delay had occurred insofar as no interference is created in subsequent processes. In consideration thereof, in the second embodiment, a print position adjustment subroutine S10A (S10B) is provided after the process of plate releasing 7A (7B) so that a print position can be adjusted at an exit start timing.

The control unit 60 judges, in parallel with an exit operation, whether or not a movement must be made to the substrate supporting table 10B (10A) of a next process (step S101). Specifically, this judgment is a process performed when interference avoidance necessitates movement as shown in FIGS. 22C, 23C, and 24C in order to prioritize the movement. When it is judged that movement is necessary, the control unit 60 sets a movement distance (step S102) and moves to an entry side (step S103). Specifically, a movement distance is set based on the maximum value SFmax of the necessary shift SF registered in the interference management data table 606 shown in FIG. 11.

When the movement is finished, a return is made to the main flow without changing a print position (step S104).

On the other hand, when movement is unnecessary as in the mode shown in FIG. 1, the control unit 60 judges whether a delay has occurred based on (an output of an encoder which detects) an operation of the motor 5B of the substrate supporting table 10B (10A) that moves into a next process (step S105).

When it is judged that a delay has not occurred by the judgment in step S105, a transition is made to step S104 and a return is subsequently made to the main flow. On the other hand, when it is judged in step S104 that a delay has occurred, the control unit 60 further sets a movement distance based on a common area condition (step S106). The common area condition refers to a condition for determining a movement distance based on whether or not interference avoidance is necessary, the number of times a delay has occurred, a current position of the substrate supporting table moving into an entry operation, a period time required for movement, and the like.

If it is judged that the common area condition is satisfied, the control unit 60 approaches a substrate supporting table that moves into an entry operation in the common area (step S107). Meanwhile, if it is judged that the common area condition is not satisfied, the control unit 60 approaches a substrate supporting table 10B that moves into an entry operation in a range that reaches outside the common area (step S108). As a result, for example, when entry of the B-side substrate supporting table 10B is delayed in an n+1th process, the print executing section 20 approaches the B-side substrate supporting table 10B based on the movement distance set in advance in the common area (if the common area condition is satisfied). Consequently, the amount of time required for entry of the B-side substrate supporting table 10B is reduced and process efficiency can be improved. In addition, when entry of the B-side substrate supporting table 10B is once again delayed in an n+3th process, the print executing section 20 can approach the B-side substrate supporting table 10B up to outside of the common area. Consequently, the amount of time required for entry of the B-side substrate supporting table 10B is reduced and process efficiency can be improved.

As shown, in the second embodiment, the control unit 60 judges whether or not the substrate supporting table 10A or 10B that moves into a next printing process enters the print position SP, and when it is judged that entry of the substrate supporting table 10A or 10B that moves into a next printing process is delayed, the control unit 60 controls driving of the print executing section driving mechanism so as to change the print position SP in a direction approaching the substrate supporting table 10A or 10B. Therefore, in the present embodiment, when a delay such as that described above occurs, the print executing section 20 approaches the substrate supporting table 10A and 10B and the print executing section 20 meets the delayed substrate supporting table 10A and 10B. As a result, the delay can be reduced by the movement of the print executing section 20 and loss of time can be reduced.

Next, a third exemplary embodiment will be described.

In a screen printing machine 1 such as that shown in FIG. 1, for example, in a case where a meeting operation is performed in response to a delay, when an entry-side substrate supporting table 10B (10A) is approached by unnecessarily falling out of the common area, there is a risk that an entry operation of the other substrate supporting table 10A (10B) which executes a printing process in a next process may end up taking time.

Figure 27:
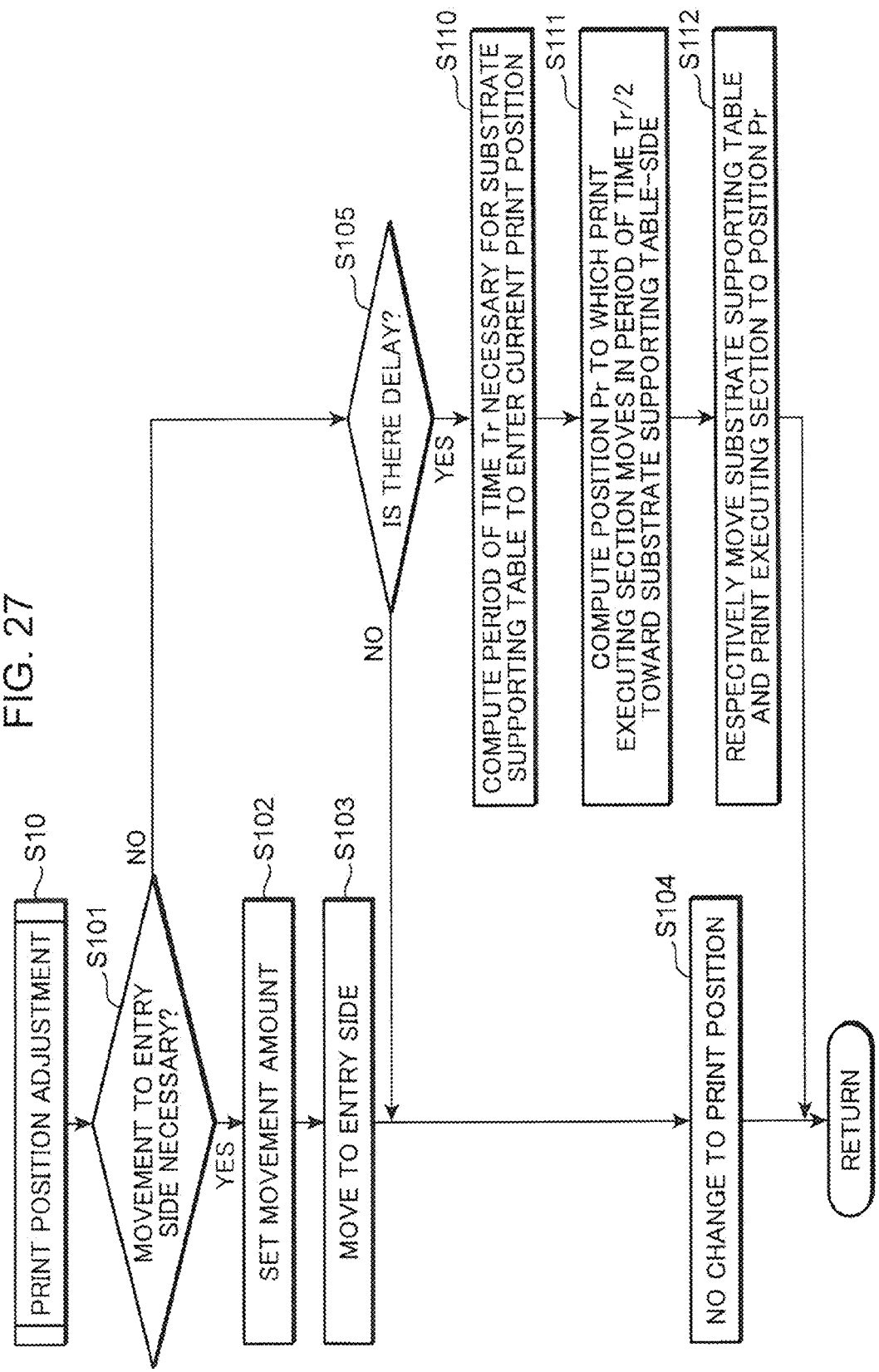
FIG. 27 is a flow chart showing an initial print position setting subroutine according to a third exemplary embodiment.

In consideration thereof, in the third embodiment, as shown in FIG. 27, after executing a delay judgment (step S105), a period of time Tr required by the substrate supporting table 10B moving into an entry operation to enter a current print position is computed (step S110), a position Pr to which the print executing section 20 moves toward the substrate supporting table 10B in Tr/2 is computed (step S111), and the substrate supporting table 10B and the print executing section 20 are respectively moved to the position Pr.

By executing a process such as that shown in FIG. 27, even if a delay has occurred, since the substrate supporting table 10B and the print executing section 20 "meet halfway" and move to a print position, the delay can be resolved and a time loss at a next printing process can be reduced.

Figure 28:
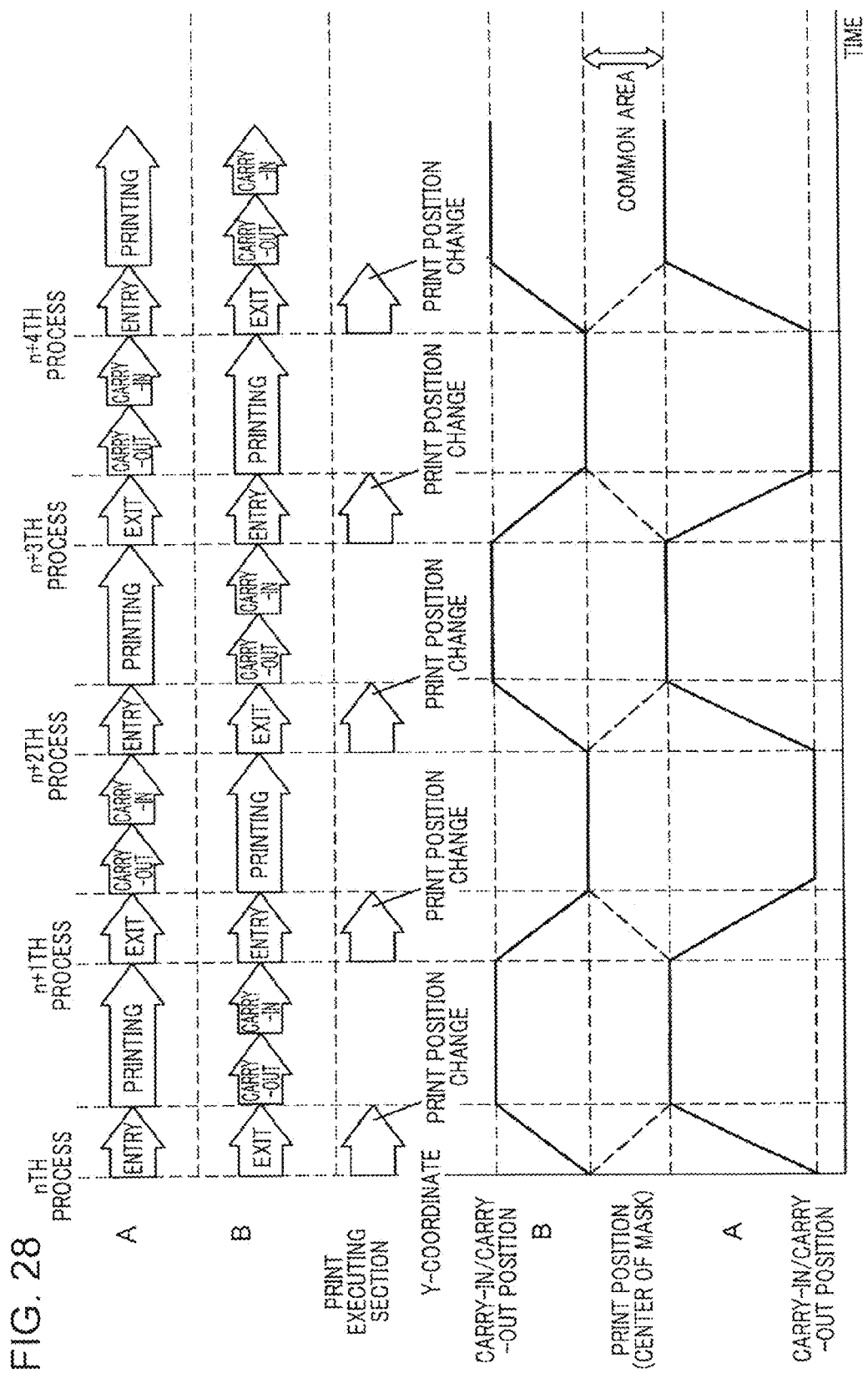
FIG. 28 is a timing chart showing a result of executing the flow chart in FIG. 27 after partially modifying the flow chart.

Moreover, steps S110 to S112 in FIG. 27 can also be executed when no delay has occurred. In other words, the delay judgment (step S105) in FIG. 27 may be omitted. In such a case, as shown in FIG. 28, a print position is changed every time a printing process is switched to another and efficient alternate printing can be realized.

As shown, in the third embodiment, with respect to the substrate supporting table 10A or 10B entering the print position SP, the control unit 60 approaches the substrate supporting table 10A or 10B entering the print position SP in synchronization with the entry operation and changes the print position SP. Therefore, in the present embodiment, since the substrate supporting table 10A or 10B and the print executing section 20 meet each other halfway and a printing process is executed at a predetermined print position SP, the print position SP can be set within a common area of the substrate supporting tables 10A and 10B and operations of both the substrate supporting tables 10A and 10B can be streamlined. As a result, alternate printing can be realized even more efficiently.

The screen printing machine 1 described above exemplifies a preferable embodiment of the present disclosure and a specific configuration thereof may be modified as appropriate without departing from the scope of the present disclosure.

For example, a mode for monitoring an interference check may be adopted in combination with or separately from the embodiment described above. In such a case, a mode exemplified below can be adopted as an interference check method.

Figure 29:
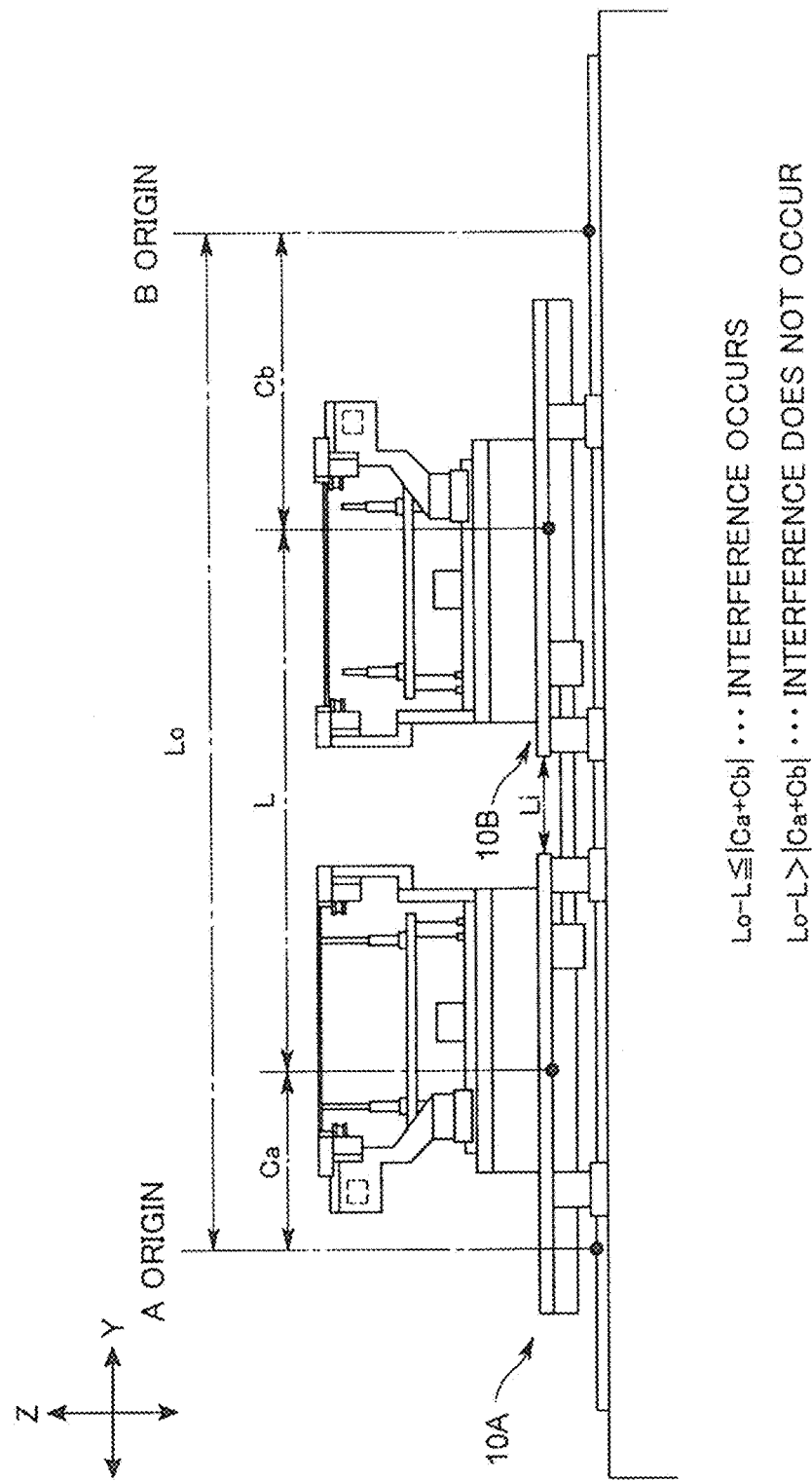
FIG. 29 is a schematic side view showing an exemplary mode for an interference check.

Referring now to FIG. 29, a first mode is a method of checking for interference based on an interval Lo between origins (referred to as an A origin and a B origin) of the respective substrate supporting tables 10A and 10B when the interval Lo is known. Specifically, central positions of the respective substrate supporting tables 10A and 10B when the substrate supporting tables 10A and 10B are most separated from each other in the Y-axis direction are respectively set as the A origin and the B origin. Since an interval Lo between the A origin and the B origin in the Y-axis direction is known and an interval L at which the substrate supporting tables 10A and 10B may interfere with each other is also known, these pieces of data are registered in advance in the data storage section 63 and an absolute value |Ca+Cb| of a sum of current movement intervals Ca and Cb and a difference between the interval Lo and the interval L are compared with each other. If the absolute value |Ca+Cb| is equal to or greater than the difference between the interval Lo and the interval L, a judgment is made that an interference occurs. If the absolute value |Ca+Cb| is smaller than the difference between the interval Lo and the interval L, a judgment is made that an interference does not occur. In a similar manner to the "area where interference may occur" in the flow chart shown in FIG. 19, the interval L may be a value that is dynamically set according to models or movement velocities of the respective substrate supporting tables 10A and 10B.

On the other hand, there may be cases where the interval Lo between the A origin and the B origin in the Y-axis direction or the interval L is unknown. The method such as described below is adopted.

Figure 30:
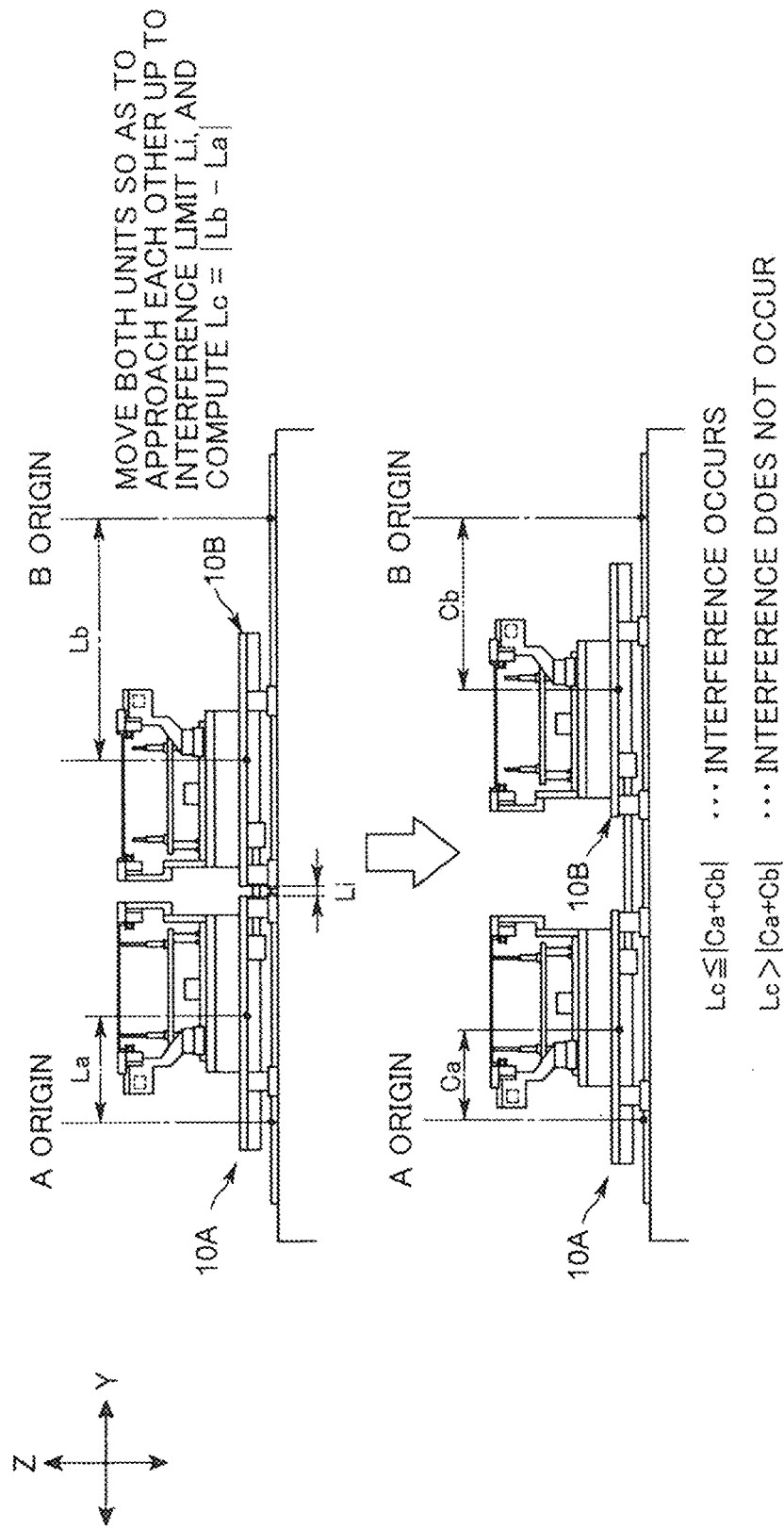
FIG. 30 is a schematic side view showing another exemplary mode for an interference check.

Referring now to FIG. 30, when the interval Lo between the A origin and the B origin in the Y-axis direction is unknown, coordinates of the A origin and the B origin are first obtained as shown in FIG. 30 and the substrate supporting tables 10A and 10B are moved so as to approach each other up to the interference limit. Next, a movement amount La of the first substrate supporting table 10A in the Y-axis direction and a movement amount Lb of the second substrate supporting table 10B in the Y-axis direction when the substrate supporting tables 10A and 10B approach each other at the interference limit are obtained. Furthermore, an absolute value |Lb−La| of a difference between the movement amounts La and Lb is computed and set as Lc. In addition, the computation result Lc is registered in advance in the data storage section 63, a current movement interval Ca of the first substrate supporting table 10A in the Y-axis direction and a current movement interval Cb of the second substrate supporting table 10B in the Y-axis direction are obtained, and an absolute value |Ca+Cb| of a sum of the movement intervals Ca and Cb is compared with the computation result Lc registered in advance. If the absolute value |Ca+Cb| is equal to or greater than the computation result Lc, a judgment is made that an interference occurs. If the absolute value |Ca+Cb| is smaller than the computation result Lc, a judgment is made that an interference does not occur.

By adopting the methods shown in FIGS. 29 and 30, whether or not an interference occurs can be checked at a desired timing.

Figure 31:
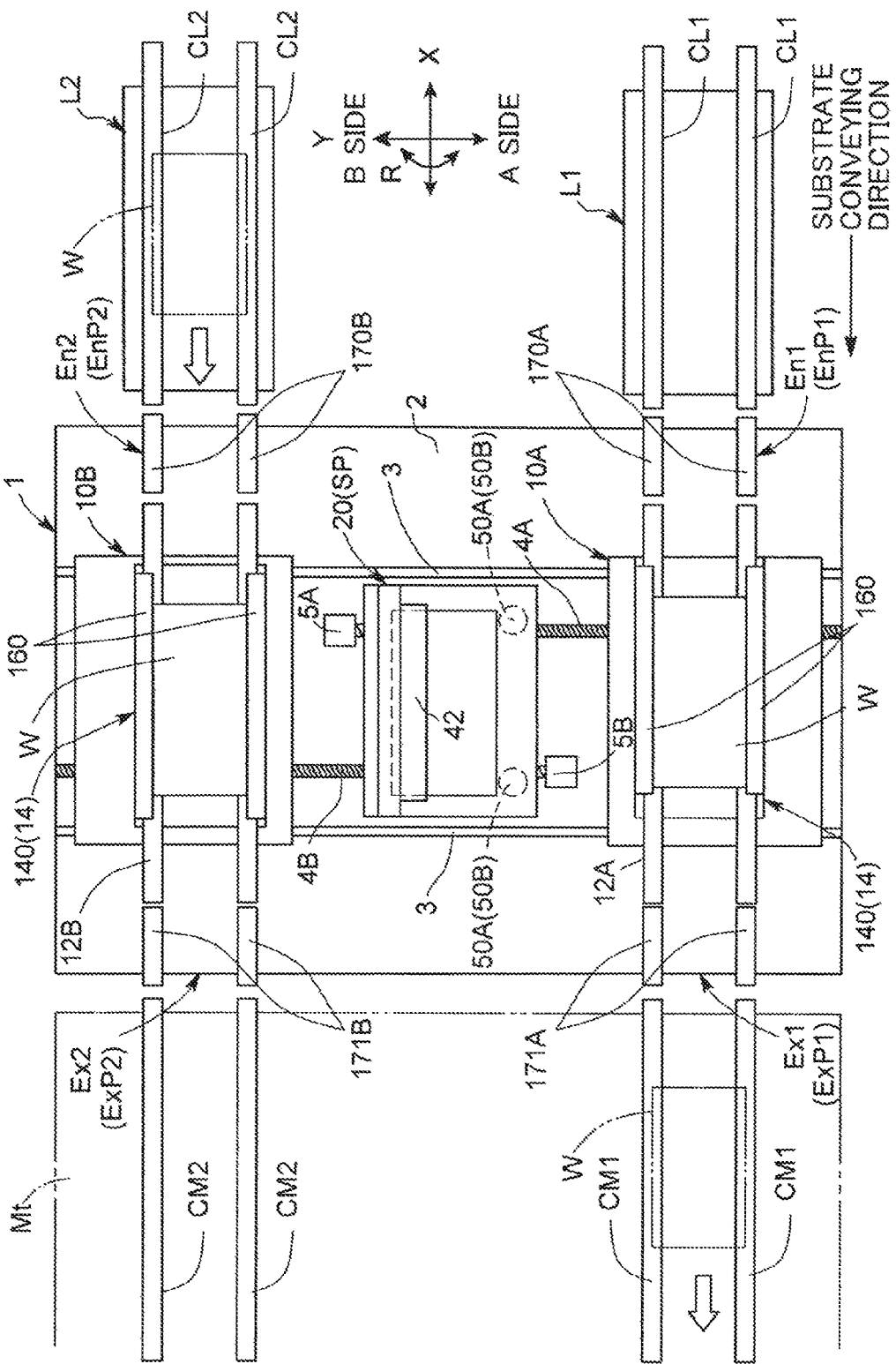
FIG. 31 is a schematic plan view showing another exemplary embodiment.

In addition, as a mode for carrying in or carrying out a substrate W to/from the screen printing machine 1, as shown in FIG. 31, a configuration may be adopted in which a handover belt conveyor pair 170A and 170B is provided on the first substrate carry-in section En1 and the second substrate carry-in section En2. In this case, since positioning of the respective belt conveyor pairs CL1 and CL2 of the first loader L1 and the second loader L2 and a corresponding belt conveyor pair 12A and 12B of the first and second substrate supporting tables 10A and 20A can be mechanically determined, there is an advantage that control becomes easier.

In a similar manner, a configuration may be adopted in which a handover belt conveyor pair 171A and 171B is provided on the first substrate carry-out section Ex1 and the second substrate carry-out section Ex2.

Moreover, although not specifically shown, a handover conveyor may be provided on any one of a substrate carry-in section and a substrate carry-out section.

In addition, when applying an embodiment consistent with the present disclosure to the screen printing machine 1 according to the mode shown in FIG. 15, a table movable pitch of the print executing section 20 may be the carry-in side Y-axis pitch Pin between the carry-in sections En1 and En2 or the carry-out side Y-axis pitch Pout between the carry-out sections Ex1 and Ex2. Alternatively, a Y-axis direction pitch Yp2 between the inner carry-in section En1 and the inner carry-out section Ex2 may be adopted.

It is needless to say that a specific supporting structure of a substrate W provided by the substrate supporting tables 10A and 10B and the like, a specific holding structure of the screen mask 206 provided by the print executing section 20 and the like, a specific structure of the squeegee unit 400, and the like are not necessarily limited to those of the screen printing machine 1 according to the embodiment described above and may be modified as appropriate.

As described above, the present disclosure provides a screen printing machine comprising: a pair of substrate supporting tables, each of which is provided for holding a substrate that is a print object, the substrate supporting tables being juxtaposed along a specific direction that is perpendicular to a conveying direction of the substrate; a print executing section which performs a printing process alternately on the substrate held by the pair of substrate supporting tables; a print executing section driving mechanism that drives the print executing section along the specific direction; and print position setting means for setting a print position that is a position of the print executing section within a range where one substrate supporting table and the other substrate supporting table oppose each other in the specific direction, by controlling a drive of the print executing section driving mechanism. According to this mode, since one print executing section is shared by a pair of substrate supporting tables so that the screen printing can be alternately performed, redundancy of the print executing section can be avoided. Therefore, in cases where substrates of the same type are consecutively manufactured by both the substrate supporting tables, a single screen mask can be shared and a cost for screen masks can be cut in half. In addition, since a single screen mask can be shared, solder necessary for preparation is kept to a necessary and sufficient amount. Therefore, cost reduction can also be achieved in post-production treatment (disposal, storage, and the like) of solder. Furthermore, since a print position of a print executing section can be changed in a specific direction and the substrate supporting tables share the same print executing section, redundancy of the print executing section can be eliminated, a space for arranging the print executing section can be kept compact, and the machine itself as well as accompanying conveyors can be downsized. Moreover, regarding a print position, since the print executing section can be moved in a specific direction and the print position can be changed to an arbitrary location between the one substrate supporting table and the other substrate supporting table, a suitable print position can be dynamically set according to an operational status of each substrate supporting table and modes of a substrate carry-in section and a substrate carry-out section configured on each substrate supporting table.

In a preferable mode, a substrate supporting table driving mechanism that individually drives the pair of substrate supporting tables in the specific direction and table movement control means for controlling the substrate supporting table driving mechanism are further provided. In this mode, the print position can be set by moving the print executing section and the print position can also be changed by moving the substrate supporting tables in the specific direction. Consequently, efficiency of printing processes can be further improved. Furthermore, the substrate supporting tables can be moved in the specific direction. Consequently, a carry-in position where a substrate is carried into the substrate supporting tables and a carry-out position where a substrate is carried out from the substrate supporting tables can be modified according to modes of a production line and versatility of the screen printing machine itself can also be enhanced.

In a preferable mode, a common area is set, where both the substrate supporting tables are movable in the specific direction. In this mode, by setting a common area, the screen printing machine can be compactified in the specific direction. Furthermore, the print position can be set in the common area. Consequently, movement ranges (movement times) of the respective substrate supporting tables and the print executing section can be reduced to improve efficiency of alternate printing.

In a preferable mode, the print position setting means sets the print position based on a table movable pitch that is defined as a range in which any one of the pair of substrate supporting tables is movable in the specific direction. In this mode, a print position is set in the table movable pitch by which any one of the pair of substrate supporting tables is movable. Consequently, in a case where the common area is set, it is possible to set the print position in the common area in order to reduce the movement ranges (movement times) of the respective substrate supporting tables and the print executing section and improve efficiency of alternate printing. Meanwhile, it is possible to set the print position to an arbitrary position within the table movable pitch including areas outside the common area in order to prevent the substrate supporting tables from interfering with each other. Accordingly, since the efficiency of alternate printing can be improved with a compact configuration, a suitable position can be set as the print position according to an operational status or set conditions of the substrate supporting tables to further improve efficiency.

A screen printing machine in a preferable mode further comprises a base on which a first substrate carry-in position where a substrate prior to printing is carried into one of the pair of substrate supporting tables and a second substrate carry-in position where a substrate prior to printing is carried into the other of the pair of substrate supporting tables are set with an interval spaced in the specific direction, wherein the substrate supporting table driving mechanism drives each of the substrate supporting tables, mutually, movably between a corresponding substrate carry-in position and the print position, in a case where the print position set by the print position setting means is out of alignment with the first substrate carry-in position and the second substrate carry-in position with respect to the specific direction.

A screen printing machine in a preferable mode further comprises a base on which a first substrate carry-out position where a substrate after printing is carried out from one of the pair of substrate supporting tables and a second substrate carry-out position where a substrate after printing is carried out from the other of the pair of substrate supporting tables are set with an interval spaced in the specific direction, wherein the substrate supporting table driving mechanism drives each of the substrate supporting tables, mutually, movably between a corresponding substrate carry-out position and the print position, in a case where the print position set by the print position setting means is out of alignment with the first substrate carry-out position and the second substrate carry-out position with respect to the specific direction.

In a mode comprising a base such as that described above, preferably, the print position setting means changes the print position to be set in a set-up change in which at least one of the respective first and second substrate carry-in positions and the respective first and second substrate carry-out positions are changed. In this mode, in a set-up change in which at least one of the respective first and second substrate carry-in positions and the respective first and second substrate carry-out positions are changed, the print position set by the print position setting means is changed. Consequently, screen printing can be performed at a suitable print position according to the change.

In a mode comprising a base such as that described above, preferably, the print position setting means alternately moves the print executing section so that the print position is changed to the side of any one of the substrate carry-in positions when the substrate supporting tables is going to move from any one of the substrate carry-in positions to the print position. In this mode, the print executing section approaches and meets a substrate supporting table entering the print position in the printing process. Consequently, a period of time required for entry by the substrate supporting table itself can be reduced. In addition, since a traffic line of the entering substrate supporting table is shortened, alternate printing can be realized even more efficiently and a contribution can be made to improving throughput.

In a mode comprising a base such as that described above, preferably, the table movement control means controls the substrate supporting table driving mechanism so that, after carrying out a printed substrate and before making a move into a next printing process, a substrate supporting table that has exited the print position approaches the other substrate supporting table at the print position up to a predetermined position. In this mode, since the substrate supporting table that has exited the print position approaches the other substrate supporting table after the exit, a period of time until completion of entry when the substrate supporting table once again enters the print position in a next printing process can be reduced as much as practicable. As a result, a total processing time can be further reduced and processing efficiency can be improved.

In a screen printing machine according to a preferable mode, the print position setting means changes the print position to be set in a set-up change in which a print object substrate type is changed. In this mode, every time a substrate type is changed, screen printing can be performed on a substrate associated with the substrate type at a suitable print position.

As described above, according to the present disclosure, the
  single print executing section only requires one screen
  mask.
Consequently, since there is no need to create unnecessary screen masks and, at the same time, loss of solder used in production can be reduced, cost reduction can be achieved. In addition, since a print position is movable, downsizing of the machine can be expected. Furthermore, when setting a print position, the print executing section can be moved in a specific direction and the print position can be changed to an arbitrary location between the one substrate supporting table and the other substrate supporting table. Therefore, a suitable print position can be dynamically set according to an operational status of each substrate supporting table and the like. As a result, according to the present disclosure, a prominent advantageous effect is produced in which an inexpensive small-sized screen printing machine which has low redundancy and high production efficiency and which is applicable to a dual conveying-type component mounting machine can be provided.

The invention claimed is:

1. A screen printing machine comprising:
   a pair of substrate supporting tables, each of which is provided for holding a substrate that is a print object, the substrate supporting tables being juxtaposed along a specific direction that is perpendicular to a conveying direction of the substrate;
   a print executing section which performs a printing process alternately on respective substrates held by the pair of substrate supporting tables;
   a print executing section driving mechanism that drives the print executing section along the specific direction;
   a print position setting section configured to set a print position that is a position of the print executing section within a range in which one of the pair of substrate supporting tables and the other of the pair of substrate supporting tables oppose each other in the specific direction, by controlling a drive of the print executing section driving mechanism; and
   a screen mask holding mechanism provided with the print executing section.

2. The screen printing machine according to claim 1, wherein the print position setting section changes the print position to be set in a set-up change in which a print object substrate type is changed.

3. A screen printing machine comprising:
   a pair of substrate supporting tables, each of which is provided for holding a substrate that is a print object, the substrate supporting tables being juxtaposed along a specific direction that is perpendicular to a conveying direction of the substrate;
   a print executing section which performs a printing process alternately on respective substrates held by the pair of substrate supporting tables;
   a print executing section driving mechanism that drives the print executing section along the specific direction;
   a print position setting section configured to set a print position that is a position of the print executing section within a range in which one of the pair of substrate supporting tables and the other of the pair of substrate supporting tables oppose each other in the specific direction, by controlling a drive of the print executing section driving mechanism;
   a substrate supporting table driving mechanism that individually drives each of the pair of substrate supporting tables in the specific direction; and
   a table movement control unit configured to control the substrate supporting table driving mechanism.

4. The screen printing machine according to claim 3, wherein a common area is set and in which both the substrate supporting tables are movable in the specific direction.

5. The screen printing machine according to claim 3, wherein the print position setting section sets the print position based on a table movable pitch that is defined as a range in which any one of the pair of substrate supporting tables is movable in the specific direction.

6. The screen printing machine according to claim 3, further comprising a base on which a first substrate carry-in position where a substrate prior to printing is carried into one of the pair of substrate supporting tables and a second substrate carry-in position where a substrate prior to printing is carried into the other of the pair of substrate supporting tables are set with an interval spaced in the specific direction,
   wherein the substrate supporting table driving mechanism drives each of the substrate supporting tables, mutually, movably between a corresponding substrate carry-in position and the print position, in a case where the print position set by the print position setting section is out of alignment with the first substrate carry-in position and the second substrate carry-in position with respect to the specific direction.

7. The screen printing machine according to claim 6, wherein
   a first substrate carry-out position where a substrate after printing is carried out from one of the pair of substrate supporting tables and a second substrate carry-out position where a substrate after printing is carried out from the other of the pair of substrate supporting tables are set with an interval spaced in the specific direction on the base, and
   the substrate supporting table driving mechanism drives each of the substrate supporting tables, mutually, movably among the corresponding carry-in position, the print position and a corresponding substrate carry-out position, in a case where the print position set by the print position setting section is out of alignment with the first substrate carry-in position, the second substrate carry-in position, the first substrate carry-out position, and the second substrate carry-out position with respect to the specific direction.

8. The screen printing machine according to claim 7,
   wherein the print position setting section changes the print position to be set in a set-up change in which at least one of the respective first and second substrate carry-in positions and the respective first and second substrate carry-out positions are changed.

9. The screen printing machine according to claim 7, wherein
   the print position setting section alternately moves the print executing section so that the print position is changed to a side of the base corresponding to one of the substrate carry-in positions when the substrate supporting tables is set to move from the one of the substrate carry-in positions to the print position.

10. The screen printing machine according to claim 9, wherein
    the table movement control unit controls the substrate supporting table driving mechanism so that one substrate supporting table that has exited the print position approaches, after carrying out a printed substrate and before moving into a next printing process, the other substrate supporting table that has located at the print position by a predetermined position.

11. The screen printing machine according to claim 3, further comprising:
    a base on which a first substrate carry-out position where a substrate after printing is carried out from one of the pair of substrate supporting tables and a second substrate carry-out position where a substrate after printing is carried out from the other of the pair of substrate supporting tables are set with an interval spaced in the specific direction,
    wherein the substrate supporting table driving mechanism drives each of the substrate supporting tables, mutually, movably between a corresponding substrate carry-out position and the print position, in a case where the print position set by the print position setting section is out of alignment with the first substrate carry-out position and the second substrate carry-out position with respect to the specific direction.

12. A screen printing machine comprising:
    a pair of substrate supporting tables, each of which is provided for holding a substrate that is a print object, the substrate supporting tables being juxtaposed along a specific direction that is perpendicular to a conveying direction of the substrate;
    a print executing section which performs a printing process alternately on respective substrates held by the pair of substrate supporting tables;
    a print executing section driving mechanism that drives the print executing section along the specific direction;
    a print position setting section configured to set a print position that is a position of the print executing section within a range in which one of the pair of substrate supporting tables and the other of the pair of substrate supporting tables oppose each other in the specific direction, by controlling a drive of the print executing section driving mechanism; and
    a data table storing a necessary shift for each operation item needed for a mask movement management for each screen printing machine,
    wherein the necessary shift is a distance which is referred to for determining as to how much degree the print position is shifted in the specific direction from a center coordinate of the print position determined in a default configuration, when the print position is required to move along the specific direction during machine operations.

13. The screen printing machine according to claim 12,
    wherein the print position setting section is configured to execute an initial print position setting process, the initial print position setting process is referred to as a process of setting the print position for starting an alternate printing with respect to each of the pair of substrate support tables in accordance with the necessary shift.

14. The screen printing machine according to claim 13, further comprises a printing machine data table storing a table movable pitch set for each of the pair of the substrate support tables, the table movable pitch being defined within a range where the pair of substrate support tables is movable.

15. The screen printing machine according to claim 14,
    wherein the print position setting section is configured to execute processes, the processes are executed in the initial print position setting process, wherein the processes include a step of computing a center coordinate of the print position based on the table movable pitch, and a step of shifting the center coordinate of the print position along the specific direction based on the necessary shift.

16. The screen printing machine according to claim 12, further comprising:
    a substrate supporting table driving mechanism configured to drive individually each of the pair of substrate supporting tables along the specific direction; and
    a table movement control unit configured to control the substrate supporting table driving mechanism,
    wherein the pair of substrate supporting tables includes one substrate support table and a counterpart substrate support table, and wherein the table movement control unit is configured to execute steps of:

judging whether or not the counterpart substrate supporting table is performing a print operation, before the one substrate supporting table supporting a newly delivered substrate starts entering to the print position;

searching a maximum value of the necessary shift for each operation item to be executed by the counterpart substrate supporting table after the counterpart substrate supporting table finishes the print operation, in a case where a judgment is made to determine whether or not the counterpart substrate supporting table is performing the print operation and the counterpart substrate supporting table is judged to be in a course of the print operation;

setting a proximity distance defined as an approachable distance for the pair of the substrate supporting table, based on a detected maximum value of the necessary shift; and controlling the substrate supporting table driving mechanism such that the one substrate supporting table entering to the print position closes to the counterpart substrate supporting table up to a position separated by the proximity distance set to be approachable.

17. The screen printing machine according to claim 16,
wherein the print position setting section is configured to execute steps of:

searching a maximum value of the necessary shift for each operation item, each of the operation items is to be executed from a timing after printing of the counterpart substrate supporting table to a timing of starting a next printing, in a case where the table movement control section controls the substrate supporting table driving mechanism so that the one substrate supporting table is driven to enter the print position and the counterpart substrate supporting table finishes the printing process, and correcting the print position based on a maximum value found in a search result of the preceding step.

18. The screen printing machine according to claim 16,
wherein the table movement control unit is configured to stand by the one substrate supporting table until termination of the printing process performed by the counterpart substrate supporting table, in a case where the table movement control unit has finished the step of setting the proximity distance and the counterpart substrate supporting table is still performing printing operation.

19. The screen printing machine according to claim 16,
wherein the printing position setting section is configured to execute steps of:

searching a maximum value of the necessary shift for each operation item to be executed by the counterpart substrate supporting table from a timing after the counterpart substrate supporting table finishes the print operation to a timing before another operation is started, in a case where the substrate supporting table driving mechanism is controlled such that the one substrate supporting table is about to enter to the print position when the counterpart substrate supporting table finishes the print operation; and correcting the print position based on a maximum value found in a search result of the preceding step.

20. A screen printing machine comprising:

a pair of substrate supporting tables, each of which is provided for holding a substrate that is a print object, the substrate supporting tables being juxtaposed along a specific direction that is perpendicular to a conveying direction of the substrate;

a print executing section which performs a printing process alternately on respective substrates held by the pair of substrate supporting tables;

a print executing section driving mechanism that drives the print executing section along the specific direction;

a print position setting section configured to set a print position that is a position of the print executing section within a range in which one of the pair of substrate supporting tables and the other of the pair of substrate supporting tables oppose each other in the specific direction, by controlling a drive of the print executing section driving mechanism; and a print executing section data table storing a mask offset for a screen mask of each screen printing machine, the mask offset being occurred between the screen mask and a center line of the print executing section with respect to the specific direction, wherein the print position setting section is configured to control the print executing section driving mechanism when the print executing section is moved in the specific direction, such that a stop position of a print executing section offsets by the mask offset from a center coordinate of the print position, and to control a movement distance so that a center line of the screen mask adopted by the print executing section is consistent with the center coordinate.

\* \* \* \* \*